United States Patent
Qiao et al.

(10) Patent No.: US 10,359,473 B2
(45) Date of Patent: Jul. 23, 2019

(54) DETECTING FAULTS IN TURBINE GENERATORS

(71) Applicant: NUtech Ventures, Lincoln, NE (US)

(72) Inventors: Wei Qiao, Lincoln, NE (US); Xiang Gong, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 321 days.

(21) Appl. No.: 14/884,558

(22) Filed: Oct. 15, 2015

(65) Prior Publication Data

US 2016/0033580 A1    Feb. 4, 2016

Related U.S. Application Data

(63) Continuation-in-part of application No. 13/904,469, filed on May 29, 2013.

(60) Provisional application No. 61/652,396, filed on May 29, 2012.

(51) Int. Cl.
| | |
|---|---|
| *G01R 31/34* | (2006.01) |
| *F03D 7/02* | (2006.01) |
| *F03D 17/00* | (2016.01) |
| *G01R 31/42* | (2006.01) |
| *H02P 29/02* | (2016.01) |

(52) U.S. Cl.
CPC ......... *G01R 31/343* (2013.01); *F03D 7/0296* (2013.01); *F03D 17/00* (2016.05); *G01R 31/42* (2013.01); *F05B 2270/334* (2013.01); *H02P 29/02* (2013.01); *Y02E 10/723* (2013.01)

(58) Field of Classification Search
CPC ... G01R 31/343; G01R 19/2509; F03D 17/00; F03D 7/0296; H02P 29/02; F05B 2270/334

USPC .......................................................... 702/58
See application file for complete search history.

(56) References Cited

U.S. PATENT DOCUMENTS

| | | | |
|---|---|---|---|
| 5,483,153 | A | 1/1996 | Leeb |
| 7,040,859 | B2 | 5/2006 | Kane |
| 7,268,443 | B2 | 9/2007 | Kikuchi et al. |
| 7,888,810 | B2 | 2/2011 | Moreno |
| 7,952,216 | B2 | 5/2011 | Kikuchi et al. |
| 8,067,845 | B2 | 11/2011 | Thulke et al. |
| 2006/0066111 | A1 | 3/2006 | Suryanarayanan |
| 2007/0265843 | A1 | 11/2007 | Hetherington |
| 2008/0007247 | A1* | 1/2008 | Gervais ............... G01R 21/133 324/76.38 |

(Continued)

OTHER PUBLICATIONS

Chapman, "Electric Machinery Fundamentals," 5th ed., New York: McGraw-Hill, Feb. 2011, 47-48.

(Continued)

*Primary Examiner* — Yoshihisa Ishizuka
(74) *Attorney, Agent, or Firm* — Fish & Richardson P.C.

(57) ABSTRACT

Turbine generator faults can be detected by receiving a current signal from the turbine generator, and synchronously sampling the current signal to obtain a set of current signal samples that are evenly spaced in the phase domain, in which phase differences between adjacent current signal samples in the set of current signal samples are substantially the same. The process includes generating a frequency spectrum of the current signal samples, identifying one or more excitations in the frequency spectrum, and detecting a fault in the turbine generator based on the one or more excitations in the frequency spectrum.

26 Claims, 30 Drawing Sheets

(56) References Cited

U.S. PATENT DOCUMENTS

| | | | |
|---|---|---|---|
| 2011/0098968 A1 | 4/2011 | Srinivasa | |
| 2011/0125419 A1 | 5/2011 | Bechhoefer | |
| 2012/0019723 A1* | 1/2012 | McGrath | H03H 17/08 348/571 |
| 2012/0299305 A1 | 11/2012 | Brogan | |
| 2013/0049733 A1* | 2/2013 | Neti | G01R 31/343 324/71.1 |
| 2013/0096848 A1* | 4/2013 | Hatch | G01M 13/045 702/39 |
| 2014/0003939 A1* | 1/2014 | Adams | F03D 7/0224 416/1 |
| 2014/0152331 A1* | 6/2014 | Wagoner | G01R 27/16 324/705 |

OTHER PUBLICATIONS

Couch, "Digital & Analog Communication Systems," 7th ed. London: Prentice Hall, Jul. 2006, 282-290.

Feldman, "Hilbert Transform Application in Mechanical Vibration," 1st ed., New York: Wiley, Apr. 2011, pp. 14-20.

Oppenheim et al., "Discrete-Time Signal Processing," 3rd ed. Prentice Hall, 2009, 714-722, and 775-789.

Pitas et al., "Nonlinear Digital Filters: Principles and Applications", Kluwer Academic Publishers, 1990, 63-65.

Akin et al., "Low order PWM inverter harmonics contributions to the inverter-fed induction machine fault diagnosis," IEEE Trans. Ind. Electron., 2008, vol. 55, No. 2, pp. 610-619.

Amirat et al., "Condition monitoring of wind turbines based on amplitude demodulation," in Proc. IEEE Energy Convers. Congr. Expo., 2010, pp. 2417-2421.

Blödt et al., "Models for bearing damage detection in induction motors using stator current monitoring," IEEE Trans. Ind. Electron., 2008, vol. 55, No. 4, pp. 1813-1822.

Choqueuse et al., "Diagnosis of three-phase electrical machines using multidimensional demodulation techniques," IEEE Trans. Ind. Electron., 2012, vol. 59, No. 3, pp. 2014-2023.

Djurovic et al., "Condition monitoring of wind turbine induction generators with rotor electrical asymmetry," IET Renewable Power Generation, 2012, vol. 6, No. 4, pp. 207-216.

Ebrahimi et al., "Advanced eccentricity fault recognition in permanent magnet synchronous motors using stator current signature analysis," IEEE Trans. Ind. Electron., 2014, vol. 61, No. 4, pp. 2041-2052.

Ebrahimi et al., "Static, dynamic and mixed eccentricity fault diagnosis in permanent magnet synchronous motors," IEEE Trans. Ind. Electron., 2009, vol. 56, No. 11, pp. 4727-4739.

Fadaeinedjad et al., "The impact of tower shadow, yaw error, and wind shears on power quality in a wind diesel system," IEEE Trans. Energy Convers., 2009, vol. 24, No. 1, pp. 102-111.

Freire et al., "Open-circuit fault diagnosis in PMSG drives for wind turbine applications," IEEE Trans. Ind. Electron., 2013, vol. 60, No. 9, pp. 3957-3967.

Garcia-Perez et al., "The application of high-resolution spectral analysis for identifying multiple combined faults in induction motors," IEEE Trans. Ind. Electron., vol. 58, No. 5, pp. 2002-2010, May 2011.

Gong et al., "Bearing fault detection for direct-drive wind turbines via stator current spectrum analysis," in Proc. Energy Conversion Congress and Exposition, 2011, pp. 313-318.

Gong et al., "Bearing fault diagnosis for direct-drive wind turbines via current-demodulated signals," IEEE Trans. Ind. Electron., 2013, vol. 60, No. 8, pp. 3419-3428.

Gong et al., "Current-based eccentricity detection for direct-drive wind turbines via synchronous sampling," in Proc. Energy Conversion Congress and Exposition, 2013, pp. 2972-2976.

Gong et al., "Current-based mechanical fault detection for direct-drive wind turbines via synchronous sampling and impulse detection," IEEE Trans. Industrial Electronics, in press. (Available online in IEEE Explore).

Gong et al., "Current-based online bearing fault diagnosis for direct-drive wind turbines via spectrum analysis and impulse detection," in Proc. IEEE Symposium on Power Electronics and Machines in Wind Applications, Jul. 2012, pp. 1-6.

Gong et al., "Imbalance fault detection of direct-drive wind turbines using generator current signals," IEEE Trans. Energy Convers., 2012, vol. 27, No. 2, pp. 468-476.

Gong, "Online nonintrusive condition monitoring and fault detection for wind turbines," Ph.D. Dissertation, University of Nebraska—Lincoln, Aug. 2012.

Gustafsson, "Determining the initial states in forward-backward filtering," IEEE Trans. Signal Processing, 1996, vol. 44, No. 4, pp. 988-992.

Hameed et al., "Condition monitoring and fault detection of wind turbines and related algorithms: A review," Renewable and Sustainable Energy Reviews, 2009, vol. 13, No. 1, pp. 1-39.

Hong et al., "Detection of airgap eccentricity for permanent magnet synchronous motors based on the d-axis inductance," IEEE Trans. Power Electron., 2012, vol. 27, No. 5, pp. 2605-2612.

Immovilli et al., "Currents and vibrations in asynchronous motor with externally induced vibration," in Proc. IEEE International Symposium on Diagnostics for Electric Machines, Power Electronics & Drives, 2011, pp. 580-584.

Immovilli et al., "Detection of generalized-roughness bearing fault by spectral-kurtosis energy of vibration or current signals," IEEE Trans. Ind. Electron., vol. 56, No. 11, pp. 4710-4717.

Immovilli et al., "Diagnosis of bearing faults in induction machines by vibration or current signals: A critical comparison," IEEE Trans. Ind. Appl., 2010, vol. 46, No. 4, pp. 1350-1359.

Kar et al., "Monitoring gear vibrations through motor current signature analysis and wavelet transform," Mechanical Systems and Signal Processing, 2006, vol. 20, No. 1, pp. 158-187.

Kia et al., "A modeling approach for gearbox monitoring using stator current signature in induction machines," in Proc. IEEE Industry Applications Society Annual Meeting, Oct. 2008, pp. 1-6.

Kia et al., "Analytical and experimental study of gearbox mechanical effect on the induction machine stator current signature," IEEE Trans. Industry Applications, 2009, vol. 45, No. 4, pp. 1405-1415.

Kia et al., "Gearbox monitoring using induction machine stator current analysis," in Proc. IEEE International Symposium on Diagnostics for Electric Machines, Power Electronics and Drives, 2007, pp. 149-154.

Link, et al., "Gearbox reliability collaborative project report: findings from phase 1 and phase 2 testing," National Renewable Energy Laboratory, Golden, CO, Tech. Rep. NREL/TP-5000-51885, Jun. 2011.

Lu et al., "A review of recent advances in wind turbine condition monitoring and fault diagnosis," in Proc. IEEE Symposium on Power Electronics and Machines in Wind Applications, 2009, pp. 1-7.

Luo et al., "Synthesized synchronous sampling technique for differential bearing damage detection," Journal of Engineering for Gas Turbines and Power, 2010, vol. 132, No. 7.

Musial et al., "Large-scale offshore wind power in the United States: Assessment of opportunities and barriers," Technical Report, National Renewable Energy Laboratory, Sep. 2010, [Online].

Rajagopalan et al., "Dynamic eccentricity and demagnetized rotor magnet detection in trapezoidal flux (brushless DC) motors operating under different load conditions," IEEE Trans. Power Electron., 2007, vol. 22, No. 5, pp. 2061-2069.

Ribrant et al., "Survey of failures in wind power systems with focus on Swedish wind power plants during 1997-2005," IEEE Trans. Energy Conversion, 2007, vol. 22, No. 1, pp. 167-173. #?

Ribrant, "Reliability performance and maintenance—a survey of failures in wind power system," M. S. Thesis, KTH School of Electrical Engineering, Stockholm, Sweden, 2006.

Saleh et al., "Wavelet-based signal processing method for detecting ice accretion on wind turbines," IEEE Trans. Sustainable Energy, 2012, vol. 3, No. 3, pp. 585-597.

Saramov et al., "Nonuniform synchronous sampling analog interface," in Proc. 29th Int. Spring Seminar on Electronics Technology, 2006, pp. 329-333.

(56) References Cited

OTHER PUBLICATIONS

Schulte et al., "A fuzzy impulse noise detection and reduction method," IEEE Trans. Image Processing, 2006, vol. 15, No. 5, pp. 1153-1162.
Sheng, "Wind turbine gearbox condition monitoring round robin study—Vibration analysis," National Renewable Energy Laboratory, Golden, CO, Tech. Rep. NREL/TP-5000-54530, Jul. 2012.
Tavner et al., "Reliability analysis for wind turbines," Wind Energy, 2007, vol. 10, pp. 1-18.
Teotrakool et al., "Adjustable-speed drive bearing-fault detection via wavelet packet decomposition," IEEE Trans. Instrumentation and Measurement, 2009, vol. 58, No. 8, pp. 2747-2754.
Umehara et al., "Statistical impulse detection of in-vehicle power line noise using hidden Markov model," in Proc. IEEE Int. Symposium on Power Line Communications and its Applications, 2010, pp. 341-346.
Verbruggen, "Wind turbine operation & maintenance based on condition monitoring," Final Report, Energy Research Center of the Netherlands, Apr. 2003, [Online]. Available: www.ecn.nl/docs/library/report/2003/c03047.pdf.
Watson et al., "Condition monitoring of the power output of wind turbine generators using wavelets," IEEE Trans. Energy Convers., 2010, vol. 25, No. 3, pp. 715-721.
Yacamini et al., "Monitoring torsional vibrations of electromechanical systems using stator currents," Journal of Vibration and Acoustics, 1998, vol. 120, No. 1, pp. 72-79.
Yang et al., "Cost-effective condition monitoring for wind turbines," IEEE Trans. Ind. Electron., 2010, vol. 57, No. 1, pp. 263-271.
Bonnardot et al., "Use of the acceleration signal of a gearbox in order to perform angular resampling (with limited speed fluctuation)," Mech. Syst. Signal Process., Jul. 2005, 19: 766-785.
Borghesani et al., "A new procedure for using envelope analysis for rolling element bearing diagnostics in variable operating conditions," Mech. Syst. Signal Process., Jul. 2013, 38: 23-35.
Chow and Hai, "Induction machine fault diagnostic analysis with wavelet technique," IEEE Trans. Ind. Electron., Jun. 2004, 51: 558-565.
Combet and Gelman, "An automated methodology for performing time synchronous averaging of a gearbox signal without speed sensor," Mech. Syst. Signal Process., Aug. 2007, 21: 2590-2606.
Emresoy and El-Jaroudi, "Iterative instantaneous frequency estimation and adaptive matched spectrogram," Signal Process., Jan. 1998, 64: 157-165.
Feng and Liang, "Fault diagnosis of wind turbine planetary gearbox under nonstationary conditions via adaptive optimal kernel time-frequency analysis," Renewable Energy, Jun. 2014, 66: 468-477.
Feng et al., "Iterative generalized synchrosqueezing transform for fault diagnosis of wind turbine planetary gearbox un-der nonstationary conditions," Mech. Syst. Signal Process., Feb. 2015, 52-53: 360-375.
Frosini and Bassi, "Stator current and motor efficiency as indicators for different types of bearing faults in induction motors," IEEE Trans. Ind. Electron., Jan. 2010, 57: 244-251.
Fyfe and Munck, "Analysis of computed order tracking," Mech. Syst. Signal Process., Mar. 1997, 11: 187-205.
Jin et al., "Motor bearing fault diagnosis using trace ratio linear discriminant analysis," IEEE Trans. Ind. Electron., May 2014, 61: 2441-2451.
Kwok and Jones, "Improved instantaneous frequency estimation using an adaptive short-time Fourier transform," IEEE Trans. Signal Process., Oct. 2000, 48: 2964-2972.
Lacey, "An overview of bearing vibration analysis," Maintenance Asset Manage., Nov./Dec. 2008, 23: 32-42.
Luo and Liang, "Application of multi-scale chirplet path pursuit and fractional Fourier transform for gear fault detection in speed up and speed-down processes," J. Sound Vib., Oct. 2012, 331: 4971-4986.
Qiao and Lu, "A survey on wind turbine condition monitoring and fault diagnosis—Part I: Components and subsystems," IEEE Trans. Ind. Electron., Oct. 2015, 62: 6536-6545.
Randall and Antoni, "Rolling element bearing diagnostics—A tutorial," Mech. Syst. Signal Process., 2011, 25: 485-520, 2011.
Simani et al., "Fault diagnosis of a wind tur- bine benchmark via identified fuzzy models," IEEE Trans. Ind. Electron., Jun. 2015, 62: 3775-3782.
Villa et al., "Angular resampling for vibration analysis in wind turbines under non-linear speed fluctuation," Mech. Syst. Signal Process., Aug. 2011, 25: 2157-2168.
Wang et al., "Rotating speed isolation and its application to rolling element bearing fault diagnosis under large speed variation conditions," J. Sound Vib., Jul. 2015, 348: 381-396.
Wang et al., "Rolling element bearing fault diagnosis via fault characteristic order (FCO) analysis," Mech. Syst. Signal Process., Mar. 2014, 45: 139-153.
Wang et al., "A new synthetic detection technique for trackside acoustic identification of railroad roller bearing defects," Appl. Acoust., Nov. 2014, 85: 69-81.
Xie et al., "An advanced PLS approach for key performance indicator related prediction and diagnosis in case of outliers," IEEE Trans. Ind. Electron., Apr. 2016, 63: 2587-2594.
Yin et al., "Data-driven process monitoring based on modified orthogonal projections to latent structures," IEEE Trans. Control Syst. Technol, Jul. 2016, 24: 1480-1487.
Yin et al., "Real-time implementation of fault-tolerant control systems with performance optimization," IEEE Trans. Ind. Electron., May 2014, 61: 2402-2411.
Zhao et al., "A review on position/speed sensorless control for permanent magnet synchronous machine-based wind energy conversion systems," IEEE J. Emerg. Sel. Topics Power Electron., Dec. 2013, 1: 203-216.
Zhao et al., "A tacholess order tracking technique for large speed variations," Mech. Syst. Signal Process., Oct. 2013, 40: 76-90.
Zhao et al., "Tacholess envelope order analysis and its application to fault detection of rolling element bearings with varying speeds," Sensors, Aug. 2013, 13: 10856-10875.
Zhou et al., "Bearing fault detection via stator current noise cancellation and statistical control," IEEE Trans. Ind. Electron., Dec. 2008, 55: 4260-4269.

\* cited by examiner

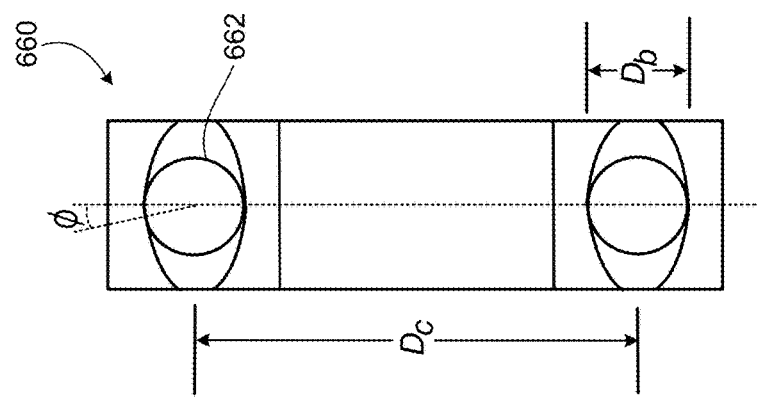
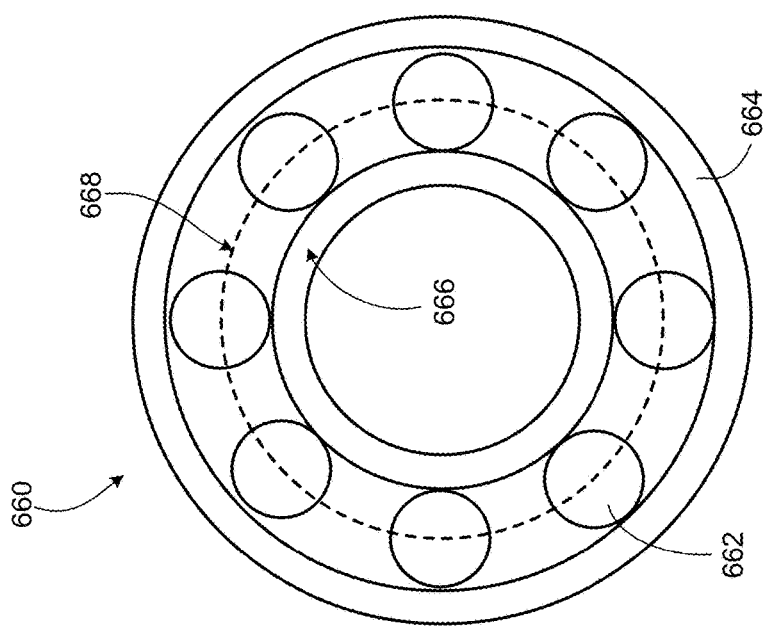
FIG. 11B
FIG. 11A

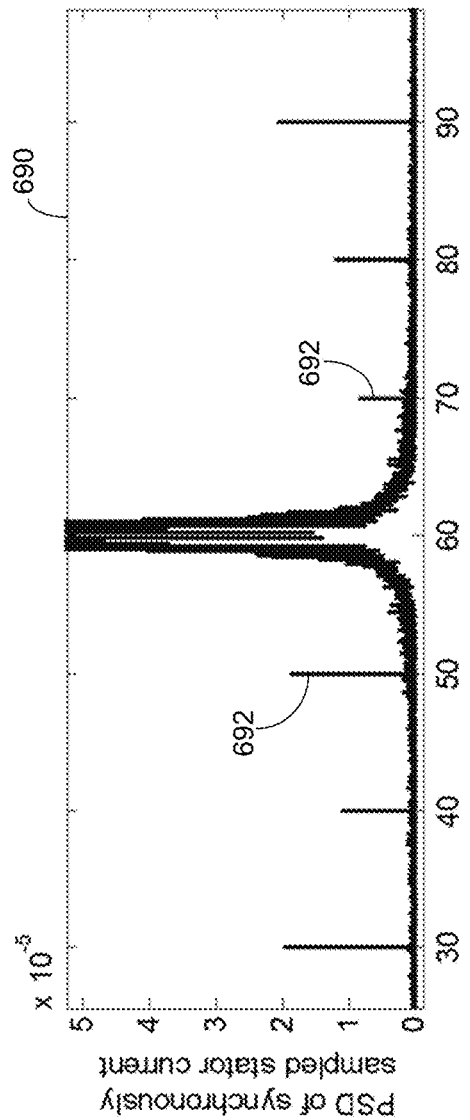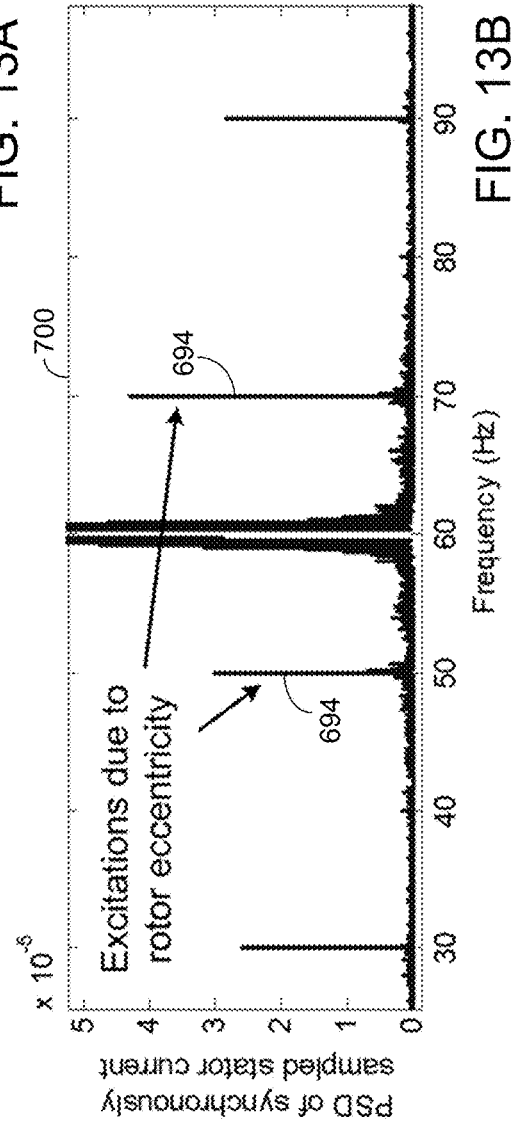

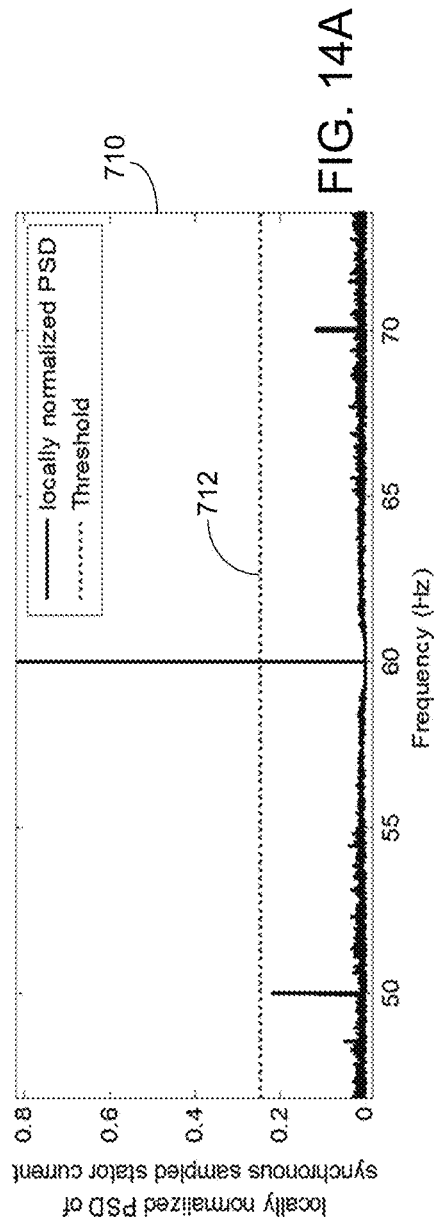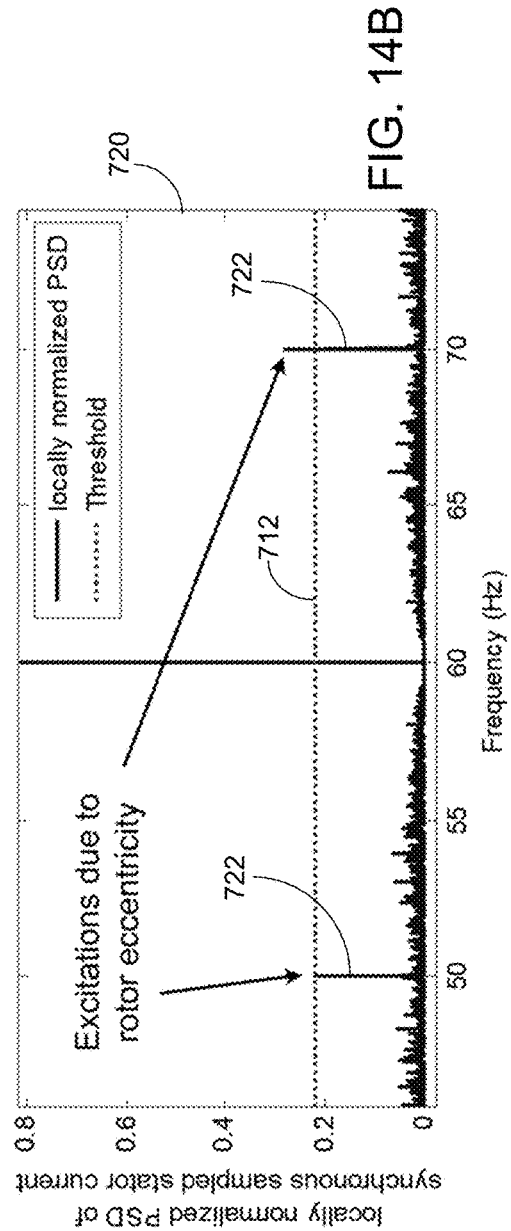

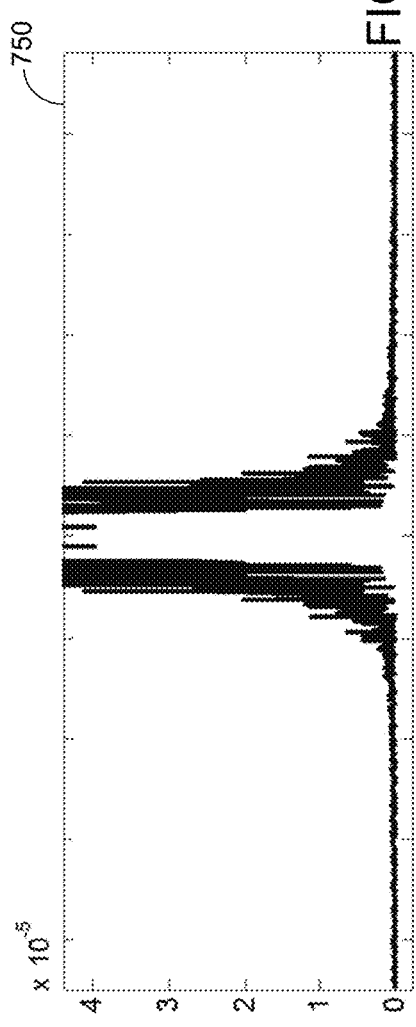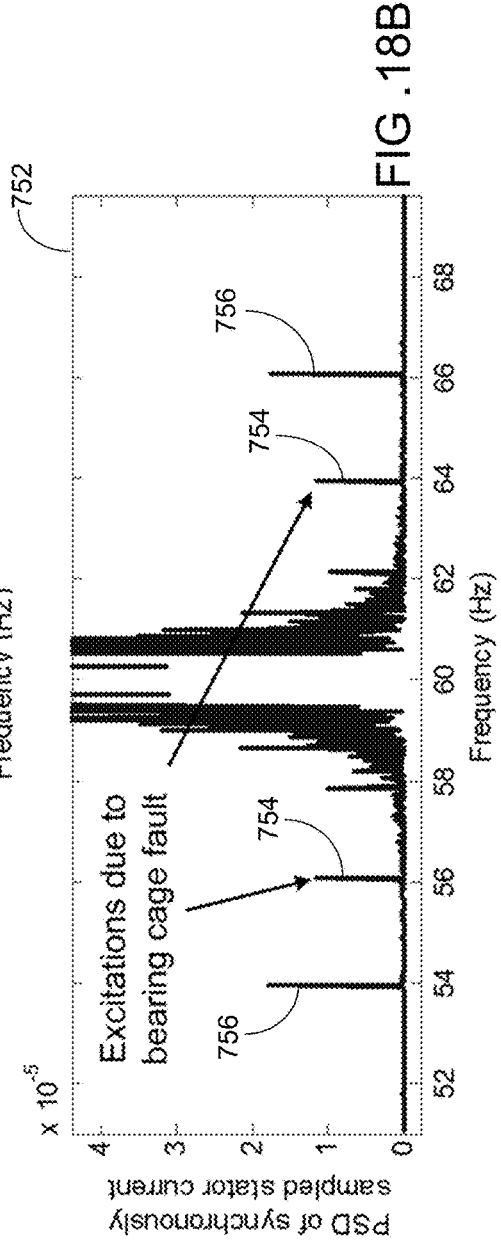

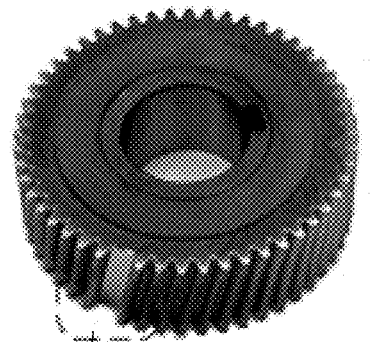
820  FIG. 24A
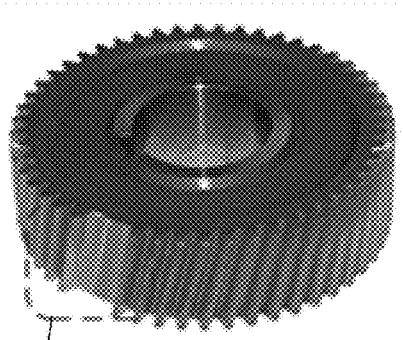
822  FIG. 24B
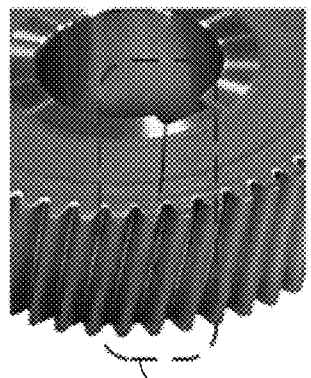
824
FIG. 24C
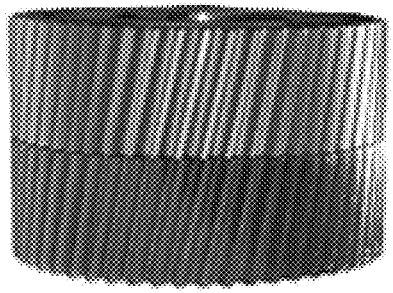
FIG. 24D

DETECTING FAULTS IN TURBINE GENERATORS

CROSS-REFERENCE TO RELATED APPLICATIONS

This application is a continuation-in-part of U.S. application Ser. No. 13/904,469, filed on May 29, 2013, which claims priority under 35 U.S.C. § 119(e)(1) to U.S. provisional patent application 61/652,396, filed on May 29, 2012. The entire contents of the above applications are herein incorporated by reference.

FEDERALLY SPONSORED RESEARCH OR DEVELOPMENT

This invention was made with government support under Grant DE-EE0001366 awarded by the Department of Energy and Grant ECCS-1308045 awarded by the National Science Foundation. The government has certain rights in the invention.

TECHNICAL FIELD

This disclosure relates to detecting faults produced by wind turbine generators.

BACKGROUND

Wind turbines generate a clean and renewable resource that can be used to provide sustainable electricity to the world. The reliability of such wind turbines can be a direct correlation to proper installation and maintenance of the turbines. This reliability can be improved upon by using various condition monitoring methods to ensure device functionality. For example, detecting broken blades before the entire wind turbine malfunctions can ensure that damage to other wind turbine components is minimized.

Detecting faults in wind turbines before damage occurs to other components can increase the lifespan and/or energy output capabilities of the turbine. Conventional fault detection techniques typically include using sensors and data acquisition devices that can monitor the operation of the wind turbines or components in the wind turbines. These sensors can be mounted on the surface or buried in the body of wind turbine components. During typical use, the sensors and turbines can be subject to failure due to poor working conditions, which could cause additional problems with system reliability and additional operating and maintenance costs. Early detection of possible failures can ensure that such failures occur less often.

SUMMARY

Methods and systems are described for detecting wind turbine generator faults by analyzing generator current measurements. Frequency and amplitude demodulation, resampling, frequency spectrum analysis, and impulse detection are used to discover and isolate one or more fault components of the current and to generate a fault identifier. In general, the measured current can be analyzed through the use of signal processing techniques to determine whether or not a fault or failure is present in the wind turbine generator, or alternatively, in the wind turbine itself. In some implementations, there are challenges to using current measurements for fault detection of wind turbine generators. First, the characteristic frequencies of faults depend on the shaft rotating frequency of the wind turbine generator (i.e., the 1P frequency). Since the 1P frequency of a wind turbine generator typically varies with the wind speed during wind turbine generator operation, it may be difficult to extract fault signatures directly from the non-stationary current measurements of the wind turbine generator by using traditional frequency spectrum analysis methods that have been well developed for fault detection of rotating machines. Moreover, the dominant components of current measurements are the fundamental-frequency component and associated harmonics. Therefore, the usable information in current measurements for wind turbine generator fault detection typically has a low signal to noise ratio, which can make fault detection more difficult.

In a general aspect, a method for detecting turbine generator faults is provided. The method includes receiving a current signal from a turbine generator; synchronously sampling the current signal to obtain a first set of current signal samples that are evenly spaced in the phase domain, in which phase differences between adjacent current signal samples in the first set are substantially the same; generating a frequency spectrum of the first set of current signal samples; identifying one or more excitations in the frequency spectrum; and detecting a fault in the turbine generator based on the one or more excitations in the frequency spectrum.

In another general aspect, a controller configured to detect turbine generator faults is provided, in which the controller has a processor that is configured to execute instructions to receive a current signal from a turbine generator; synchronously sample the current signal to obtain a set of current samples that are evenly spaced in phase, in which phase differences between adjacent current samples in the set are substantially the same; generate a frequency spectrum of the current signal samples; identify one or more excitations in the frequency spectrum; and detect a fault in the turbine generator based on the one or more excitations in the frequency spectrum.

In another general aspect, a system for detecting turbine generator faults is provided. The system includes at least one current sensor configured to sense a current signal from a turbine generator; and a processor that is configured to execute instructions to: receive the current signal from the at least one current sensor; synchronously sample the current signal to obtain a set of current samples that are evenly spaced in phase, in which phase differences between adjacent current samples in the set are substantially the same; generate a frequency spectrum of the current signal samples; identify one or more excitations in the frequency spectrum; and detect a fault in the turbine generator based on the one or more excitations in the frequency spectrum.

In one implementation, a wind turbine generator fault detection method is described. The method includes acquiring current data from a wind turbine generator during operation and determining frequency demodulated signals and amplitude demodulated signals by frequency demodulating and amplitude demodulating the current data. The method may also include resampling the frequency and amplitude demodulated signals corresponding to the current data. The resampling can include converting a variable 1P frequency to a constant value, and converting one or more variable characteristic frequencies of at least one identified wind turbine generator fault into one or more constant values. The method may also include monitoring a frequency spectra of the resampled frequency and amplitude demodulated signals corresponding to the current data to identify one or more excitations in the frequency spectra and in response to identifying one or more excitations in the frequency spectra at one or more of the variable fault characteristic frequencies, generating and transmitting an alert that indicates that a wind turbine generator fault is detected.

In certain implementations, the method can include resampling the acquired current data in which the resampling includes converting the variable 1P frequency to a constant value and monitoring a frequency spectra of the resampled current data to detect a wind turbine generator fault. In some implementations, the wind turbine generator fault is a fault having one or more characteristic frequencies.

In some implementations, acquiring current data from the wind turbine generator during operation includes measuring one phase of a stator or rotor current in the wind turbine generator. In some implementations, the method can include using the frequency demodulated signal corresponding to the current data to calculate a shaft rotating frequency of the wind turbine generator.

In certain implementations, the method can include using upsampling and downsampling techniques to resample the frequency and amplitude demodulated signals corresponding to the current data. In some implementations, the upsampling techniques include using a constant upsampling ratio to upsample the frequency and amplitude demodulated signals corresponding to the current data. In certain, the method can further include using a variable downsampling step size to downsample the upsampled frequency and amplitude demodulated signals corresponding to the current data, in which the downsampling step size is based at least in part on an estimated shaft rotating frequency of the wind turbine generator.

In some implementations, the downsampling step size is selected to ensure that the sampling frequency of the resampled signals is greater than twice the wind turbine generator fault characteristic frequency.

In some implementations, identifying an excitation in the frequency spectra at one of the fault characteristic frequencies can include implementing an impulse detection method to discover and isolate a fault component of the at least one identified wind turbine generator fault. In certain implementations, monitoring the frequency spectra of the resampled frequency and amplitude demodulated signals can include iteratively calculating the frequency spectra of the resampled frequency and amplitude demodulated signals corresponding to the current data. In some implementations, the method can also include locally normalizing the frequency spectra of the resampled frequency and amplitude demodulated signals corresponding to the current data. In some implementations, the method may include using a median filter to calculate a threshold to determine the excitations in the locally normalized frequency spectra of the resampled frequency and amplitude demodulated signals corresponding to the current data.

In another implementation, a controller configured to detect wind turbine generator faults is described. The controller includes a processor programmed to receive a set of real-time operating current data from a wind turbine generator during operation, determine frequency demodulated signals and amplitude demodulated signals by frequency demodulating and amplitude demodulating the current data, estimate a shaft rotating frequency of the wind turbine generator based on the frequency demodulated signal corresponding to the current data, resample the frequency and amplitude demodulated signals of the current data based on the estimated shaft rotating frequency of the wind turbine generator, calculate frequency spectra of the resampled frequency and amplitude demodulated signals corresponding to the current data, and extract one or more impulses in the frequency spectra to detect any wind turbine generator faults in a frequency domain.

In certain implementations, the processor is further programmed to select a base frequency $f_b$ to be an averaged value of the estimated shaft rotating frequency. In certain implementations, the processor is further programmed to use a moving window to locally normalize the frequency spectra of the resampled frequency and amplitude demodulated signals corresponding to the current data. In certain implementations, the processor is further programmed to select a threshold to determine an impulse by using a median filter.

In some implementations, the controller can include a current sensor configured to generate current data by measuring one or more stator currents of a permanent magnet synchronous generator and measuring one or more rotor currents of a doubly-fed induction generator, a low-pass filter configured to receive the generated current data from the current sensor, and an analog-to-digital converter configured to receive the filtered current data from the low-pass filter.

Advantageously, the described systems and techniques may provide for one or more benefits, such as a computationally efficient, highly sensitive current-based technique for using current measurements in online fault detection of wind turbine generators which are operating in non-stationary conditions. The fault detection process described here may have an advantage in that there is no need to install additional current sensors or data acquisition devices (e.g., analog to digital converters) because the fault detection process can use a digital current signal that has been used by the control system of the turbine generator.

The details of one or more implementations are set forth in the accompanying drawings and the description below. Other features, objects, and advantages will be apparent from the description and drawings, and from the claims.

BRIEF DESCRIPTION OF DRAWINGS

FIGS. 11A and 11B are diagrams showing an exemplary configuration of a ball bearing.

FIGS. 13A and 13B are graphs showing exemplary power spectral density spectra of the synchronously sampled stator current signals for (a) the healthy case, and (b) the rotor eccentricity case.

FIGS. 14A and 14B are graphs showing exemplary locally normalized power spectral density spectra of the synchronously sampled stator current signals and the threshold generated by the impulse detection process for (a) the healthy case, and (b) the emulated rotor eccentricity case.

FIGS. 18A and 18B are graphs that show exemplary power spectral density spectra of the synchronously sampled stator current signals for (a) the healthy bearing case, and (b) the faulty bearing case.

FIGS. 24A to 24D show exemplary types of gear faults, including (a) one-tooth breakage, (b) two-teeth breakage, (c) gear crack, and (d) gear surface wear.

Like reference symbols in the various drawings indicate like elements.

DETAILED DESCRIPTION

Figure 1A:
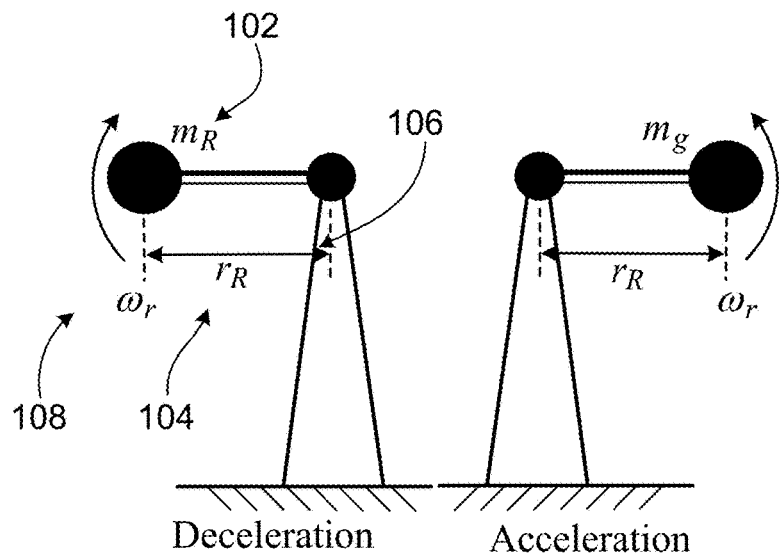
FIGS. 1A-1B are conceptual diagrams showing example effects of faults in wind turbines.

Wind power generation systems may be implemented to provide power to users connected to the power grid. These systems can be prone to faults or failures over time based on a number of environmental factors as well as component failure or wear in wind turbines or other mechanisms associated with the wind power generation system. In general, the systems and techniques described in this document can monitor wind turbine conditions and detect wind turbine faults using efficient and highly sensitive signal processing methods performed when the wind turbines are operating in non-stationary conditions. The monitoring can include, but is not limited to, vibration monitoring, current monitoring, temperature monitoring, chemical analysis, acoustic emission monitoring, sound pressure monitoring, and laser monitoring. Further analysis can be performed on data collected from any or all of the monitoring described above and such analysis can be used to preemptively discover failures occurring in one or more components of the wind power generation system.

Implementing fault detection mechanisms for wind turbines and/or the generators that operate the turbines can include the use of direct measurements, sensor output, and/or analysis of both. The direct measurements can include measurement of signals, inputs, or outputs produced by the turbine components. One example direct measurement can include measuring the current from the generator for a particular wind turbine. Current-based fault detection methods typically measure current used by a control system that operates a wind turbine or current in the generator itself. These current measurements are generally reliable and easily accessible from the ground level without intruding upon the wind turbine generators that are situated on high towers and/or installed in remote areas. The measured current can be analyzed through the use of signal processing techniques to determine whether or not a fault or failure is present in the wind turbine.

Various signal processing techniques can be used to detect faults with characteristic frequencies (e.g., imbalance faults) in wind turbine generators. Example techniques can include classical frequency spectrum analysis, bicoherence analysis, time-frequency analysis, amplitude demodulation, and data mining. In certain implementations, classical frequency spectrum analysis and bicoherence analysis can identify imbalance faults based on known characteristic frequencies. For example, classical spectrum analysis has been applied to detect mass imbalance and aerodynamic asymmetry faults of a wind turbine based on the magnitudes of the 1P frequency components in the frequency spectra of the generator and tower vibration signals acquired from the wind turbine. In certain implementations, the time-frequency analysis and amplitude demodulation methods are able to extract fault signatures from non-stationary signals. For example, continuous wavelet transform, which is a time-frequency method, has been used for blade damage detection of a wind turbine using multiple non-stationary signals acquired from different points of the damaged blade. However, time-frequency analysis and amplitude demodulation methods may not clearly identify imbalance faults from interferences that have similar patterns as the faults in the time or frequency domain. This is because time-frequency analysis and amplitude demodulation methods have a relatively lower resolution in the frequency domain compared to frequency spectrum analysis methods. In certain implementations, data mining can be applied for wind turbine condition prediction using collected maintenance records.

In various implementations of the systems described in this document, sensors can also be used to monitor conditions, trigger other sensors, or simply alert personnel that a fault or failure has been detected. Example sensors can include anything from a temperature sensor to a vibration sensor. Such sensors are selected depending on a number of factors associated with the wind power generation system and the types of faults that can occur. For example, factors for sensor selection can include particular accuracy requirements, range/resolution requirements, environmental conditions that the sensor will incur, and cost, just to name a few. Example sensors can include accelerometers, temperature sensors, pressure/flow sensors, level sensors, proximity sensors, biosensors, image sensors, chemical sensors, and/or mechanical sensors including MEMS (microelectromechanical sensors).

Figure 1B:
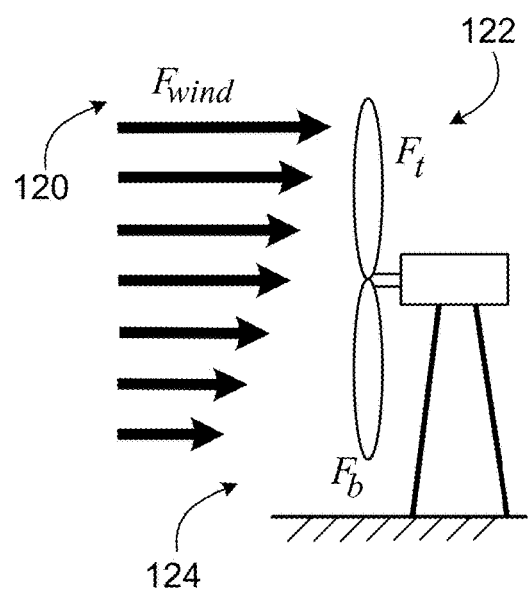

FIGS. 1A-1B are conceptual diagrams showing example effects of faults in wind turbines. In general, imbalance faults constitute a significant portion of all faults in wind turbine generators. A common imbalance fault in wind turbine generators includes a shaft or blade imbalance. A blade imbalance can be caused by errors in manufacturing and construction, icing, deformation due to aging, or wear and fatigue during the operation of the wind turbine generator. In some implementations, blade imbalances occur because certain components tend to shift and wear to varying degrees over time. When an imbalance fault occurs on the shaft of a wind turbine generator, an additional force can be induced in the shaft. In the case of blade imbalance where the mass distribution of one blade is different from the mass distribution of the other blades, a rotor mass imbalance can occur, which may induce vibrations in the shaft rotating speed of the wind turbine generator. When a blade imbalance fault occurs on the shaft of a wind turbine generator, a torque variation will be induced in the shaft, which in turn can induce vibrations in the shaft rotating frequency of the wind turbine generator and generate vibrations of the generator. These vibrations can lead to faults in the wind turbine.

As shown in FIG. 1A, the effect generated by a blade imbalance fault is illustrated with respect to deceleration and acceleration. In this example, $m_R$ 102 represents an equivalent imbalance mass, $r_R$ 104 represents a distance between the equivalent imbalance mass $m_R$ 102 and a center 106 of the shaft, and $\omega_r$ 108 represents an angular shaft rotating speed. In operation, when the equivalent imbalance mass 102 rotates from the top to the bottom of the rotating plane, the power of gravity accelerates the shaft. On the other hand, when the equivalent imbalance mass 102 rotates from the bottom to the top of the rotating plane, the power of gravity decelerates the shaft. Consequently, the shaft rotating speed vibrates at the 1P frequency, where 1P represents one power peak per revolution. This resulting vibration may represent a blade imbalance fault.

Due to a larger stiffness in the vertical direction and a smaller stiffness in the horizontal direction of the wind turbine generator, the wind turbine generator will have more resistance to deformation or vibration in the vertical direction than in the horizontal direction, in response to the centrifugal force generated by the imbalance mass. Therefore in some implementations, the vibration of the wind turbine generator due to the centrifugal force generated by the imbalance mass is mainly in the horizontal direction at the 1P frequency. This type of imbalance mass is typically known as an aerodynamic asymmetry between blades.

Referring to FIG. 1B, the effect of an aerodynamic asymmetry caused by wind shear is depicted. As shown, $F_{wind}$ 120 represents a force of the wind flow affected on the blades of the wind turbine generator; $F_t$ 122 represents a force of the wind flow affected on a blade that is on the top of the rotating plane; $F_b$ 124 represents a force of the wind flow affected on the blade that is on the bottom of the rotating plane. The amplitude of $F_t$ 122 will generally be greater than that of force $F_b$ 124 due to the effect of wind shear, which follows the following power law of $U(z)/U(z_r)$ $=(z/z_r)^\alpha$, where $U(z)$ and $U(z_r)$ represent wind velocities at a height z and a reference height $z_r$, respectively and $\alpha$ represents the power law exponent. The power law exponent defines a relationship between wind speeds at a first height and wind speeds at other heights.

In operation, a blade will generally have the largest acceleration caused by $F_t$ 122 and the smallest acceleration caused by $F_b$ 124. Therefore, a vibration at the 3P frequency is produced in the shaft speed by wind shear in a balanced wind turbine with three blades. In the case of an aerodynamic asymmetry, a blade of the turbine will have a different $F_t$ 122 and $F_b$ 124 from the other two blades. As a result, the acceleration and deceleration of the imbalanced blade produce a vibration at the 1P frequency in the shaft speed. If, instead, the other two blades have different $F_t$ 122 and $F_b$ 124 frequencies from the imbalanced blade, a vibration may also appear at the 2P frequency in the shaft speed signal. In general, characteristic frequencies of shaft and/or blade imbalance and aerodynamic asymmetry both appear at the 1P frequency in the shaft speed signal of a wind turbine. Therefore, the excitations of the shaft speed signal at the 1P frequency can be used as a signature for imbalance fault detection. Signal excitations that occur because of a blade imbalances and/or aerodynamic asymmetries will be discussed in further detail below.

Systems and methods described in this document can analyze current signals, vibrations, and other signals associated with wind turbine generators to determine one or more wind turbine generator faults. As an example, theoretical characteristic frequencies in a ball bearing (not shown) may include four types of single-point defects in vibration measurements. These defects can be represented by the following equations (1)-(4).

$$f_i = 0.5 \cdot N_B \cdot f_r \cdot (1 + D_b \cdot \cos \vartheta / D_c) \quad (1)$$

$$f_o = 0.5 \cdot N_B \cdot f_r \cdot (1 - D_b \cdot \cos \vartheta / D_c) \quad (2)$$

$$f_b = 0.5 \cdot f_r \cdot (D_c / D_b) \cdot (1 - (D_b \cdot \cos \vartheta / D_c)^2) \quad (3)$$

$$f_c = 0.5 \cdot f_r \cdot (1 - D_b \cdot \cos \vartheta / D_c) \quad (4)$$

where $f_i$ represents the characteristic frequency of an inner-race defect in a ball bearing (not shown), $f_o$ represents the characteristic frequency of an outer-race defect in the ball bearing, $f_b$ represents the characteristic frequency of a ball defect in the ball bearing, $f_c$ represents the characteristic frequency of a cage defect in the ball bearing; $f_r$ is the rotating frequency of the bearing, which can represented similarly to the 1P frequency of a wind turbine generator. In addition, $N_B$ represents the number of balls in the ball bearing.

Modulation of Current Signals in Wind Turbine Generator Faults

As an example, suppose that a wind turbine generator fault leads to a vibration, and therefore a shaft torque variation in the generator at a frequency of $f_{fault}$. The wind turbine generator current signals are frequency and amplitude modulated by the shaft torque variation at the corresponding characteristic frequency $f_{fault}$, which is shown in the analysis below.

The shaft torque of a wind turbine generator with a fault can be modeled by T(t).

$$T(t) = T_0(t) + T_v \cdot \cos(2\pi \cdot f_{fault} \cdot t) \quad (5)$$

In equation (5), t represents a time index, T represents torque on the wind turbine shaft, $T_0$ represents the torque due to wind power, and $T_v$ represents the amplitude of the shaft torque variation created by the wind turbine generator fault. The shaft torque variation has a characteristic frequency of $f_{fault}$, which can be assumed to be constant in steady-state operation of the wind turbine generator. The steady-state operation may be represented by a state in which the shaft speed varies slowly due to variable wind power.

A shaft system of the wind turbine generator may be represented by a one-mass model in which the motion equation is given by the following equations (6) and (7).

$$J \cdot [d\omega_r(t)/dt] = T(t) - T_e(t) - D \cdot \omega_r(t) \quad (6)$$

$$\omega_r(t) = 2\pi f_r(t) \quad (7)$$

In equations (6) and (7), J represents the total inertia constant of the wind turbine generator, $\omega_r$ represents the angular shaft rotating speed of the wind turbine generator, and $d\omega_r(t)/dt$ represents the angular acceleration. In addition, $T_e$ represents the electric torque of the wind turbine generator and D represents the damping coefficient, which is approximately zero.

If the wind turbine generator with the fault is operated at steady state, the electric torque $T_e$ can be expressed by equation (8) below:

$$T_e(t) = T_{e,0}(t) + T_{e,v} \cdot \cos(2\pi f_{fault} \cdot t + \varphi_e) \quad (8)$$

where $T_{e,0}$ and $T_{e,v}$ represent the electric torques induced by $T_0$ and $T_v$, respectively, $\varphi_e$ represents the phase shift between the torque variations in the shaft and in the generator created by the wind turbine generator fault. The angular shaft rotating speed can be derived from equations (5), (6), and (8) to obtain equations (9), (10), (11), and (12) below.

$$d\omega_r(t)/dt = [T_0(t) - T_{e,0}(t)]/J + T_f \cos(2\pi f_{fault} \cdot t + \varphi_f)/J \quad (9)$$

$$T_f \cos(2\pi f_{fault} \cdot t + \varphi_f) = T_v \cdot \cos(2\pi f_{fault} \cdot t) - T_{e,v} \cos(2\pi f_{fault} \cdot t + \varphi_e) \quad (10)$$

$$T_f = \{[T_v - T_{e,v} \cdot \cos(\varphi_e)]^2 + [T_{e,v} \cdot \sin(\varphi_e)]^2\}^{1/2} \quad (11)$$

$$\varphi_f = \arctan\{[-T_{e,v} \cdot \sin(\varphi_e)] / [T_v - T_{e,v} \cdot \cos(\varphi_e)]\} \quad (12)$$

The angular shaft rotating speed can then be calculated by integrating the right-hand side of equation (9), which yields equation (13) below.

$$\omega_r(t) = \omega_{r,0} + (1/J) \cdot \int [T_0(t) - T_{e,0}(t)] \cdot dt + (1/J) \cdot \int T_f \cos(2\pi f_{fault} \cdot t + \varphi_f) \cdot dt \quad (13)$$

Equation (13) can be rewritten as shown in equation (14) below:

$$\omega_r(t) = \omega_{r,0} + \omega_{r,w}(t) + \omega_{r,v} \cdot \sin(2\pi f_{fault} \cdot t + \varphi_f) \quad (14)$$

where $\omega_{r,0}$ represents the constant component of the angular shaft rotating speed, $\omega_{r,w}$ represents the angular shaft rotating speed generated by the variable wind power, and $\omega_{r,v}$ represents the amplitude of the excitation in the angular shaft rotating speed due to the wind turbine generator fault. The terms $\omega_{r,w}$ and $\omega_{r,v}$ can be expressed as follows:

$$\omega_{r,w}(t) = (1/J) \cdot \int [T_0(t) - T_{e,0}(t)] \cdot dt \quad (15)$$

$$\omega_{r,v} = 1/(J \cdot 2\pi f_{fault}) \cdot T_f \quad (16)$$

Using equation (7) above, the shaft rotating frequency of a wind turbine generator with a fault can be modeled as shown in equation (17) below:

$$f_r(t) = f_{r,w}(t) + f_{r,v} \cdot \sin(2\pi f_{fault} \cdot t + \varphi_f) \quad (17)$$

where $f_{r,w}(t)$ and $f_{r,v}$ are represented as shown in equations (18) and (19) below.

$$f_{r,w}(t) = [\omega_{r,0} + \omega_{r,w}(t)]/\pi \quad (18)$$

$$f_{r,v} = \omega_{r,v}/2\pi \quad (19)$$

In the event that the wind turbine generator system is equipped with a permanent magnet synchronous generator, the relationship between the shaft rotating frequency and the fundamental frequency $f_1$ of the stator current signal can be represented by equation (20) below.

$$f_1(t) = p \times f_r(t) \quad (20)$$

The term p represents the number of pole pairs of the permanent magnet synchronous generator. Using equations (17) and (20), the fundamental frequency of the stator current signal is represented by equation (21) below.

$$f_1(t) = p \cdot f_{r,w}(t) + p \cdot f_{r,v} \cdot \sin(2\pi f_{fault} \cdot t + \varphi_f) \quad (21)$$

Therefore, the stator current signal $C_s$ of the permanent magnet synchronous generator can be modeled as shown in equation (22) below:

$$C_s(t) = I_s(t) \cdot \sin\{2\pi \int [p \cdot f_{r,w}(t) + p \cdot f_{r,v} \cdot \sin(2\pi f_{fault} \cdot t + \varphi_f)] \cdot dt\} \quad (22)$$

where the harmonics of the stator current $C_s$ are typically not considered due to their low magnitudes compared to the fundamental-frequency component. The term $I_s$ represents the amplitude of the stator current signal and shows that the stator current signal of a direct-drive permanent magnet synchronous generator wind turbine is frequency modulated by the shaft torque variation generated by the wind turbine generator fault.

The amplitude of the voltage $E_s$ induced in a given stator phase can be represented as shown in equation (23) below.

$$E_s(t) = K \cdot \phi \cdot f_1(t) \quad (23)$$

where K is a constant representing the structure of the permanent magnet synchronous generator and $\phi$ is the total flux in the permanent magnet synchronous generator. The amplitude of the phase current $I_s$ is represented in equation (24) below:

$$I_s(t) = E_s(t) / |Z_s(t)| \quad (24)$$

where $Z_s$ is the equivalent complex impedance of the generator stator circuit and the external circuit or load to which the permanent magnet synchronous generator is connected. According to equations (21), (23), and (24), the amplitude of the stator current signal $I_s$ can be presented as shown in equations (25), (26), and (27) below.

$$I_s(t) = I_{s,w}(t) + I_{s,v}(t) \cdot \sin(2\pi f_{fault} \cdot t + \varphi_f) \quad (25)$$

$$I_{s,w}(t) = K \cdot \phi \cdot p \cdot f_{r,w}(t) / |Z_s(t)| \quad (26)$$

$$I_{s,v}(t) = K \cdot \phi \cdot p \cdot f_{r,v} / |Z_s(t)| \quad (27)$$

The above equations show that the stator current signal of the permanent magnet synchronous generator is amplitude modulated by the shaft torque variation created by the wind turbine generator fault.

In the event that the wind turbine generator system is equipped with a doubly-fed induction generator, the relationship between the shaft rotating frequency and the electrical frequency $f_{rotor}$ of the rotor current signal is given by equation (28) below:

$$f_{rotor}(t) = p \times f_r(t) - f_{syn} \quad (28)$$

where p represents the number of pole pairs of the doubly-fed induction generator, $f_{syn}$ represents the frequency of the doubly-fed induction generator stator current, which is normally constant at 50 Hz or 60 Hz, for example. Using equations (17) and (28), the electrical frequency of the rotor current signal can be found as shown in equation (29).

$$f_{rotor}(t) = p \cdot f_{r,w}(t) + p \cdot f_{r,v} \cdot \sin(2\pi f_{fault} \cdot t + \varphi_f) - f_{syn} \quad (29)$$

Therefore, the rotor current signal $C_r$ of the doubly-fed induction generator can be modeled as shown in equation (30) below:

$$C_r(t)=I_r(t)\cdot\sin\{2\pi f[p\cdot f_{r,w}(t)+p\cdot f_{r,v}\cdot\sin(2\pi\cdot f_{fault}\cdot t+\varphi_f)-f_{syn}]\cdot dt\} \quad (30)$$

where $I_r$ represents the amplitude of the rotor current signal. This shows that the rotor current signal of a doubly-fed induction generator wind turbine is frequency modulated by the shaft torque variation generated by the wind turbine generator fault.

The amplitude of the induced rotor voltage $E_r$ in a doubly-fed induction generator may be represented by equations (31) and (32) below:

$$E_r(t)=-s\cdot E_{r0} \quad (31)$$

$$s=-f_{rotor}(t)/f_{syn} \quad (32)$$

where s represents the slip of the doubly-fed induction generator, $E_{r0}$ represents the magnitude of the induced rotor voltage at locked-rotor conditions, which is a constant at a given grid voltage level. The amplitude of the doubly-fed induction generator rotor current $I_r$ is represented by equation (33) below:

$$I_r(t)=E_r(t)/|Z_r(t)| \quad (33)$$

where $Z_r$ represents the equivalent complex impedance of the doubly-fed induction generator rotor circuit and the external circuit to which the doubly-fed induction generator rotor windings are connected. According to equations (28), (31), (32), and (33), the amplitude of the rotor current signal $I_r$ can also be represented as shown in equations (34), (35), and (36) below.

$$I_r(t)=I_{r,w}(t)+I_{r,v}(t)\cdot\sin(2\pi\cdot f_{fault}\cdot t+\varphi_f) \quad (34)$$

$$I_{r,w}(t)=E_{r0}[p\cdot f_{r,w}(t)-f_{syn}]/[|Z_r(t)|\cdot f_{syn}] \quad (35)$$

$$I_{r,v}(t)=E_{r0}\cdot p\cdot f_{r,v}/[|Z_r(t)|\cdot f_{syn}] \quad (36)$$

These equations show that the rotor current signal of the doubly-fed induction generator is amplitude modulated by the shaft torque variation created by the wind turbine generator fault.

Current Frequency and Amplitude Demodulation Methods for Fault Detection

In some implementations, wind turbine generator current signals are frequency and amplitude modulated by the vibration generated by a wind turbine generator fault. According to equations (22), (25), (30) and (34) above, the stator current $C_S$ of a permanent magnet synchronous generator and the rotor current $C_r$ of a doubly-fed induction generator can be shown by equations (37) and (38) below.

$$C_s(t)=I_s(t)\cdot\sin[2\pi f p\cdot f_r(t)\cdot dt] \quad (37)$$

$$C_r(t)=I_r(t)\cdot\sin\{2\pi f[p\cdot f_r(t)-f_s]\cdot dt\} \quad (38)$$

Therefore, not only frequency demodulation methods can be used to discover the excitations in $f_r(t)$ related to the wind turbine generator fault, but also amplitude demodulation methods can be applied to extract the vibrations in $I_s(t)$ or $I_r(t)$ created by the wind turbine generator fault.

In a wind turbine generator, information representing shaft rotating frequency is typically used for maximum power point tracking control. The shaft rotating frequency can be measured by using a position and/or speed sensor, e.g., an encoder or resolver, or alternatively, can be estimated from the wind turbine generator current measurements using an observer. The shaft rotating frequency is the frequency demodulated signal of current and can be used for wind turbine generator fault detection. A simple method (i.e., using an observer) to demodulate the frequency from current signals may include the phase lock loop method. A phase lock loop is a closed loop frequency control system which generates an output signal whose phase is related to the phase of an input reference signal. Since frequency is the time derivative of phase, keeping the input and output phases in lock step implies keeping the input and output frequencies in lock step. Therefore, a phase lock loop can be used to track the frequency of an input signal.

In some implementations, an amplitude demodulation method can be applied to calculate the variable amplitudes $I_s(t)$ or $I_r(t)$ of current measurements in equations (37) and (38), respectively. For instance, the square law, which is a classical method for amplitude demodulation or envelope detection, can be used to extract the variable amplitudes of the current signals.

According to equation (25), the current signal of a wind turbine equipped with a permanent magnet synchronous generator in equation (37) can be rewritten as shown by equations (39) and (40).

$$C_s(t)=[I_{s,w}(t)+I_{s,v}(t)\cdot\sin(2\pi\cdot f_{fault}\cdot t+\varphi_f)]\cdot\sin[\vartheta(t)] \quad (39)$$

$$\vartheta(t)=2\pi\cdot\int p\cdot f_r(t)\cdot dt \quad (40)$$

Continuing with the above example, the square law can be applied to the signal $C_s$ as shown by equation (41) below.

$$C_s(t)^2=\{[I_{s,w}(t)+I_{s,v}(t)\cdot\sin(2\pi f_{fault}\cdot t+\varphi_f)]\cdot\sin[\vartheta(t)]\}^2 \quad (41)$$

Equation (41) can be rewritten by using trigonometric functions. The components can then be sorted from low frequency to high frequency, as shown by equation (42) below:

$$C_s(t)^2=[I_{s,w}^2(t)/2+I_{s,v}^2(t)/4]+I_{s,w}(t)\cdot I_{s,v}(t)\cdot$$
$$\sin(2\pi\cdot f_{fault}\cdot t+\varphi_f)-I_{s,v}^2(t)\cdot\cos[4\pi\cdot f_{fault}(t)\cdot t+$$
$$2\varphi_f]/4+I_{s,v}^2(t)\cdot\cos[2\vartheta(t)-4\pi\cdot f_{fault}\cdot t-2\varphi_f]/8+$$
$$I_{s,w}(t)\cdot I_{s,v}(t)\cdot\cos[2\vartheta(t)-2\pi\cdot f_{fault}\cdot t-\varphi_f]/2-[I_{s,w}^2(t)/$$
$$2+I_{s,v}^2(t)/4]\cdot\cos[2\vartheta(t)]-I_{s,w}(t)\cdot I_{s,v}(t)\cdot\cos[2\vartheta(t)+$$
$$\pi\cdot f_{fault}\cdot t+\varphi_f]/2+I_{s,v}^2(t)\cdot\cos[2\vartheta(t)+4\pi\cdot f_{fault}\cdot t+$$
$$2\varphi_f]/8 \quad (42)$$

where the current squared signal ($C_s^2$) represents the amplitude demodulated signal of current $C_s$ and the term $I_{s,w}(t)\cdot I_{s,v}(t)\cdot\sin(2\pi f_{fault}(t)\cdot t+\varphi_f)$ represents an excitation due to the wind turbine generator fault. The term $I_{s,v}^2(t)\cdot\cos[4\pi\cdot f_{fault}(t)\cdot t+2\varphi_f]/4$ represents the second harmonic of the excitation in $C_s^2$ generated by the wind turbine generator fault. Both terms can be used for fault detection. Since the fundamental frequency is typically the dominant component in stator current signals, the magnitude of $I_{s,w}(t)$ is generally much larger than that of $I_{s,v}(t)$. Therefore, the second harmonic of the excitation generated by the wind turbine generator fault has a low magnitude and can be neglected, in this example.

Since wind turbine generator faults can lead to both frequency and amplitude modulations of current signals, either a frequency or an amplitude demodulation method can discover the effect caused by wind turbine generator fault in current measurements. To improve the accuracy of fault detection and increase the redundancy and reliability of the fault detection system, both the frequency and amplitude demodulation methods can be applied.

In some implementations, current signals can also be used directly for wind turbine fault detection, and the procedure of using current signals for wind turbine fault detection is similar to that of using frequency and amplitude demodulated signals corresponding to the current data. However, using the demodulated signals for wind turbine generator fault detection may provide for several advantages. In particular, using current signals directly in wind turbine generator fault detection processes can result in dispersion of the total energy of the excitations related to faults into multiple characteristic frequencies. For example, if stator current measurements are directly used for wind turbine generator fault detection, the energy of excitations related to wind turbine generator faults will disperse to multiple characteristic frequencies. The magnitudes of excitations at these multiple characteristic frequencies may be less outstanding than that at the only fault characteristic frequency $f_{fault}$ of the current demodulated signals in the frequency domain, for example.

1P-invariant Frequency Spectrum Analysis

Since the fault characteristic frequencies of a wind turbine generator vary with the shaft rotating frequency during variable-speed operating condition of the wind turbine generator, it can be difficult to extract the fault signatures from the non-stationary current signals of the wind turbine generator using classical frequency spectrum analysis methods. However, if a wind turbine generator rotates at a constant frequency, classical frequency spectrum analysis can be used to identify a wind turbine generator fault effectively based on characteristic frequencies. For example, if the wind turbine generator current signals or current demodulated signals are preprocessed in such a way that the variable fault characteristic frequencies of the wind turbine generator are converted into constant values, the classical frequency spectrum analysis methods can be used to detect the faults for a variable-speed wind turbine generator.

In operation, the systems described in this document can begin by defining both a normalized frequency of a current demodulated signal $\Omega_r$ as well a sampling frequency $f_s$ of the current measurement. An example relationship amongst $f_r$, $f_s$, and $\Omega_r$ is shown below by equation (43):

$$\Omega_r(t)/2\pi = f_r(t)/f_s \tag{43}$$

where $\Omega_r(t)$ is expected to be constant to facilitate the fault detection by using classical frequency spectrum analysis. Therefore, if the sampling frequency $f_s$ is changed continuously with $f_r(t)$ to make the right-hand side of equation (43) constant, $\Omega_r(t)$ will eventually become constant. The above method can include preprocessing the current demodulated signal of a wind turbine generator to obtain a constant $\Omega_r(t)$, which can be implemented in the following example steps, as shown in FIG. 2.

Figure 2:
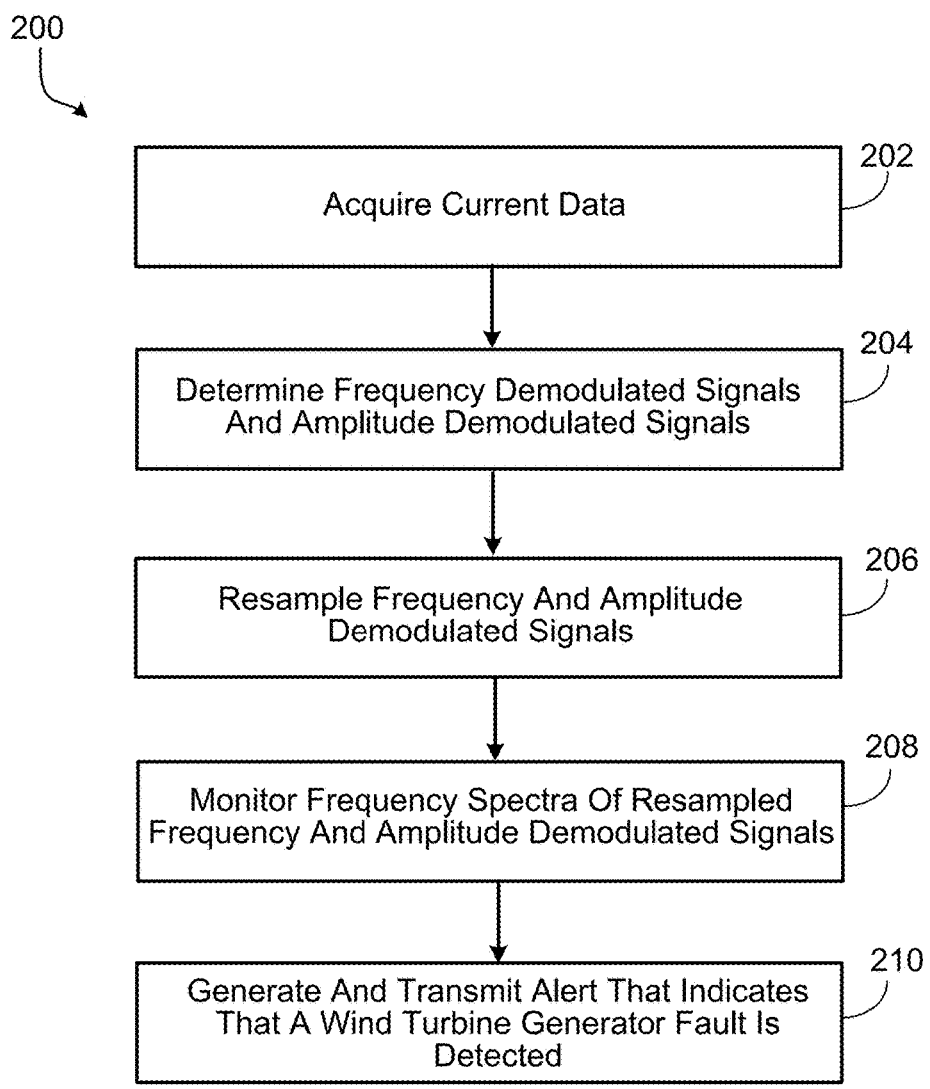
FIG. 2 is a flow chart of a process for identifying a generator fault.

FIG. 2 is a flow chart of a process 200 for identifying a generator fault. In short, process 200 generates an alert in response to detecting a wind turbine generator fault. The fault may be a wind turbine generator fault having one or more characteristic frequencies. For example, the fault may be a wind turbine generator imbalance fault. In general, the process 200 can be performed by a processor, controller, or computer system capable of analyzing complex signals. The mechanism that performs each of the steps in this method will be referred to as a system, but such a system contemplates employing a number of processors, computers, sensors, and/or other peripherals. The process 200 can begin by acquiring (202) current data from a wind turbine generator during operation. For example, the current data can be acquired by a server system from a sensor measuring current from a generator operating the wind turbine. In some implementations, the current data can be acquired during operation of the wind turbine generator by measuring one phase of a stator (i.e., in a permanent magnet synchronous generator) or rotor (i.e., in a doubly fed induction generator) current in the generator.

Upon acquiring the current data, the system determines (204) frequency demodulated signals and amplitude demodulated signals by frequency demodulating and amplitude demodulating the current data. For example, the current data typically includes signals with both amplitude portions and frequency portions. The system can perform demodulation techniques on both the frequency portions and the amplitude portions to retrieve signal information, for example. In some implementations, demodulated signals can be used as inputs when calculating other information used in fault detection of wind turbine generators. For example, the system can use frequency demodulated signal information corresponding to the acquired current data, from step 202, to calculate a shaft rotating frequency of the wind turbine generator that supplied the current data.

At some point during operation, the system can resample (206) the frequency and amplitude demodulated signals corresponding to the current data. The resampling can include using upsampling and/or downsampling techniques on the frequency and/or the amplitude demodulated signals. Such resampling may result in converting one or more variable characteristic frequencies of at least one identified wind turbine generator fault into one or more constant values. For example, the upsampling techniques can include using a constant upsampling ratio to upsample the frequency and amplitude demodulated signals corresponding to the current data. In some implementations, the resampling can include using a variable downsampling step size to downsample the upsampled frequency and amplitude demodulated signals. In particular, the downsampling step size may be based at least in part on an estimated shaft rotating frequency of the wind turbine generator. In some implementations, the downsampling step size may be selected to ensure particular frequency sampling occurs. For example, the system can select a downsampling step size that ensures that the sampling frequency of the resampled signals is greater than twice the wind turbine generator fault characteristic frequency such that each resampled signal can be reconstructed from its countable sequence of samples and contain the fault characteristic frequency (according to the Nyquist-Shannon sampling theorem). In some implementations, the resampling can include resampling the acquired current data directly in addition to resampling the frequency and amplitude demodulated signals. This resampling can include converting the variable 1P frequency to a constant value and monitoring a frequency spectra of the resampled current data to detect a wind turbine generator fault.

The system can monitor (208) a frequency spectra of the resampled frequency and amplitude demodulated signals corresponding to the current data. The monitoring can be performed to identify one or more excitations at the fault characteristic frequency or frequencies in the frequency spectra. An excitation at a fault characteristic frequency in the frequency spectra can indicate a fault has occurred in the wind turbine generator. The fault may be caused by yaw error, wind shear, tower shadow, blade imbalance, or aerodynamic asymmetry, just to name a few examples. Identifying an excitation in the frequency spectra at one of the converted constant fault characteristic frequencies can include implementing an impulse detection method to discover and isolate a fault component of at least one identified wind turbine generator fault. Example impulse detection methods are described with reference to FIG. 5 below.

In some implementations, monitoring the frequency spectra of the resampled frequency and amplitude demodulated signals can include iteratively calculating the frequency spectra of the resampled signals corresponding to the current data. In some implementations, identifying an excitation in the frequency spectra can include locally normalizing the frequency spectra of the resampled frequency and amplitude demodulated signals corresponding to the current data. In certain implementations, identifying an excitation in the frequency spectra can include using a median filter to calculate a threshold to determine the excitations in the locally normalized frequency spectra of the frequency and amplitude demodulated signals corresponding to the current data. In some implementations, the threshold level is predetermined by the system. In other implementations, each wind turbine generator is set to a unique threshold level.

In response to identifying one or more excitations in the frequency spectra at the converted constant fault characteristic frequencies, the system can generate (210) and transmit an alert message that indicates that a wind turbine generator fault has been detected. The alert can be presented at or near the wind turbine, or alternatively sent to a server system to be analyzed.

Figure 3:
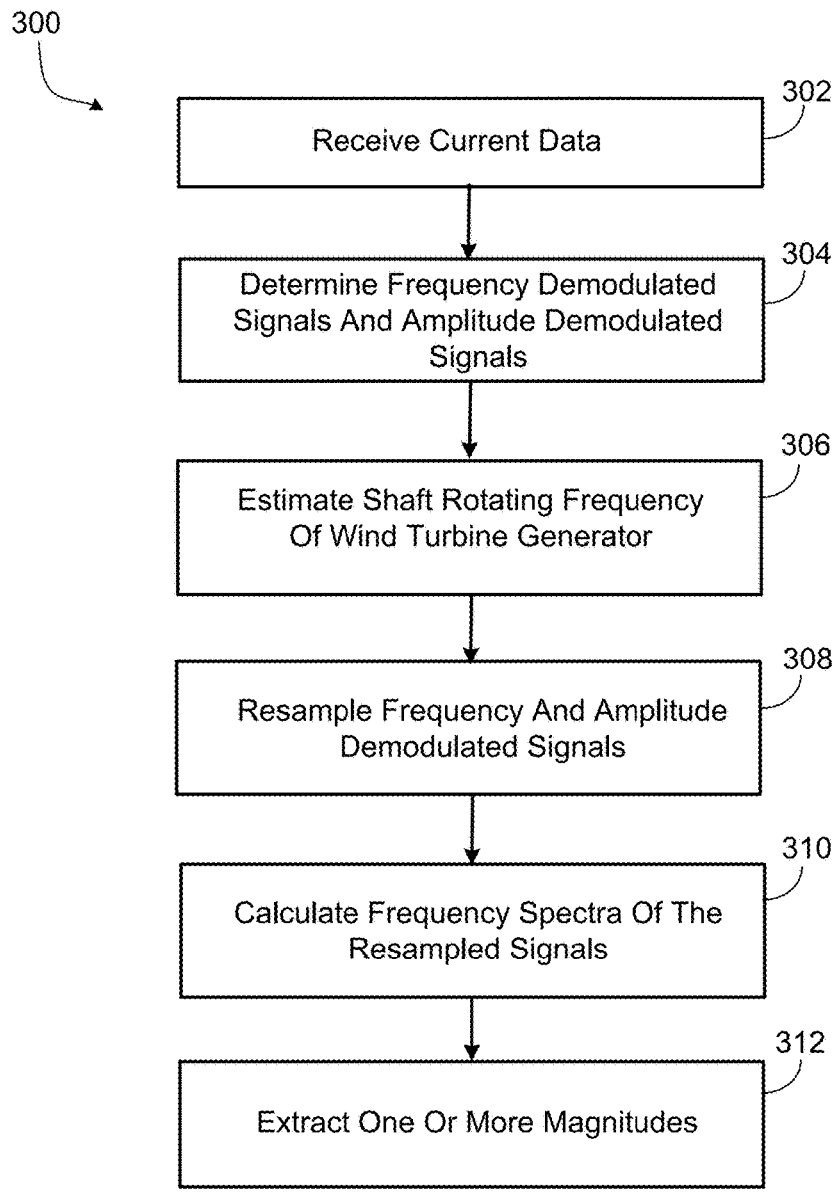
FIG. 3 is a flow chart of a process for detecting one or more impulses in a frequency spectrum.

FIG. 3 is a flow chart of a process 300 for detecting one or more impulses in a frequency spectrum. The process 300 can, for example, be performed by a controller configured to detect wind turbine generator faults. The controller can include a current sensor configured to generate current data by measuring one or more stator currents of a permanent magnet synchronous generator and measuring one or more rotor currents of a doubly-fed induction generator. The controller can also include a low-pass filter configured to receive the generated current data from the current sensor and an analog-to-digital converter configured to receive the filtered current data from the low-pass filter.

The process can begin by receiving (302) a set of real-time operating current data from a wind turbine generator during operation. The received current data can be used to determine (304) frequency demodulated signals and amplitude demodulated signals by demodulating the current data.

The system can estimate (306) a shaft rotating frequency of the wind turbine generator based on the frequency demodulated signal corresponding to the current data. In some implementations, the system (or a user) may select a base frequency $f_b$ to be an averaged value of the estimated shaft rotating frequency during a certain period. In this way, the quantization error due the variable downsampling rate will be minimized.

The system can resample (308) the frequency and amplitude demodulated signals of the current data based on the estimated shaft rotating frequency of the wind turbine generator and calculate (310) frequency spectra of the resampled frequency and amplitude demodulated signals corresponding to the current data. In some implementations, the processor may be further programmed to use a moving window to locally normalize the frequency spectra of the resampled frequency and amplitude demodulated signals corresponding to the current data.

The system can extract (312) magnitudes of one or more impulses in the frequency spectra to detect any wind turbine generator faults. The extracted magnitudes of the impulses can be used as an index to detect wind turbine generator faults in the frequency domain. In some implementations, the system can select a threshold to determine an impulse by using a median filter. The threshold can be automatically generated by setting its value to be the maximum value of the output signal of the median filter. If the magnitude of the locally normalized frequency spectrum of the resampled frequency or amplitude demodulated signal corresponding to the current data is greater than the threshold at a certain frequency point, it indicates that there is an impulse at that frequency.

Figure 4:
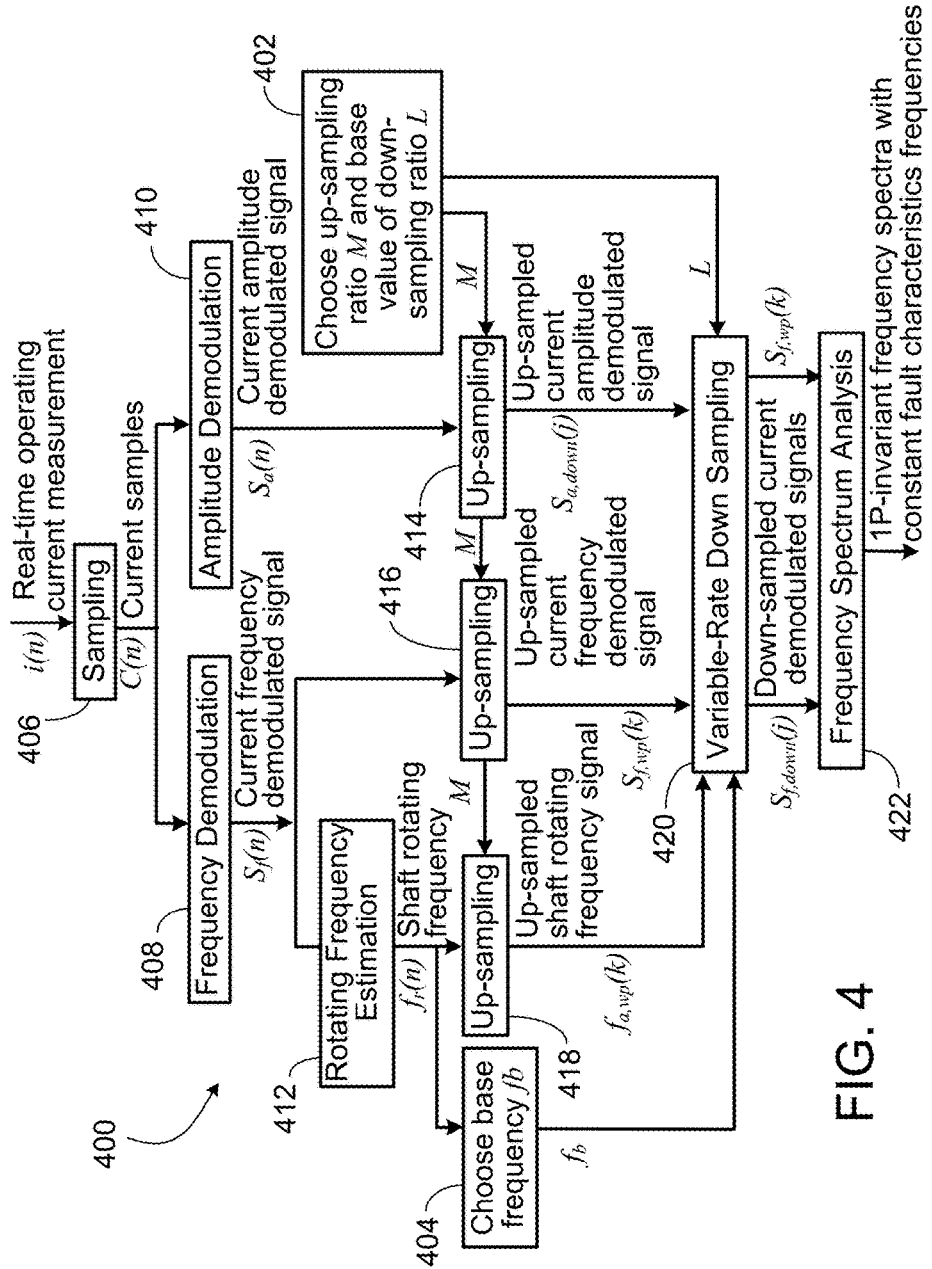
FIG. 4 is a flow chart of a process for performing a frequency spectrum analysis.

FIG. 4 is a flow chart of an example process 400 for performing a frequency spectrum analysis. The process 400 performs the analysis using the 1P-invariant frequency. In operation, the process 400 may begin by receiving real-time operating current measurements i(t). The process 400 can also include receiving or selecting particular predetermined variables that can be applied during resampling or demodulation techniques. For example, the process 400 can include receiving (402) user input that selects an upsampling ratio M. In addition, the process 400 can also include selecting or receiving a base value of a downsampling step size of L. The process 400 can additionally include receiving or selecting (404) a base frequency $f_b$. For example, the system (or a user) may select a base frequency $f_b$ to be an averaged value of an estimated shaft rotating frequency during a certain period.

As shown in FIG. 4, the real-time operating current measurements i(t) can be sampled (406) to obtain current samples C(n), where n=1,2, 3, ..., N and N is the length of the current measurement. The sampling generally includes sampling of measured non-stationary current i(t) of the wind turbine generator with a fixed sampling rate.

The process 400 includes demodulating the frequency (408) and demodulating the amplitude (410) of the non-stationary current signal C(n). The demodulation results in a current frequency demodulated signal $S_f(n)$ and a current amplitude demodulated signal $S_a(n)$.

For the frequency demodulated signal $S_f(n)$, the process 400 includes estimating (412) the shaft rotating frequency $f_r(n)$ by using the current frequency demodulated signal $S_f(n)$. The process may include choosing (404) a base frequency $f_b$ based on $f_r(n)$. Alternatively, the base frequency may be predetermined before the demodulation occurs. In an example of a permanent magnet synchronous generator, the shaft rotating frequency can be represented by the equation $f_r(n)=s_f(n)/p$. For a doubly-fed induction generator, the shaft rotating frequency can be represented by the equation $f_r(n)=[s_f(n)+f_{syn}]/p$. Here p is the number of pole pairs of the generator.

For the amplitude demodulated signal $S_a(n)$, the previously selected upsampling ratio M and a base value of downsampling ratio L is selected (402). The process can include upsampling (414-418) which may represent interpolating the shaft rotating frequency $f_r(n)$, the frequency demodulated signal $s_f(n)$, and the amplitude demodulated signal $s_a(n)$ by a constant upsampling ratio of M. The results are represented by the upsampled shaft rotating frequency signal $F_{r,up}(k)$, the upsampled current frequency demodulated signal $S_{f,up}(k)$, and the upsampled current amplitude demodulated signal $S_{a,up}(k)$, where k=1, 2, 3, ..., M×N.

Next, the process 400 includes a variable rate downsampling (420). For example, the process can downsample $S_{f,up}(k)$ and $S_{a,up}(k)$ by a variable downsampling step size. The results may include $S_{f,down}(j)$ and $S_{a,down}(j)$, respectively, where j=1, 2, 3, ..., J and J is determined by M, N, and L. Suppose that s(n) stands for $s_f(n)$ or $s_a(n)$ and $S_{down}(j)$ stands for $S_{f,down}(j)$ or $S_{a,down}(j)$; and $S_{up}(k)$ stands for $S_{f,up}(k)$ or $S_{a,up}(k)$. In the downsampling process, equations (44) and (45) are rendered as:

$$S_{down}(1)=S_{up}(1) \quad (44)$$

If $S_{down}(j)=S_{up}(k)$, then, $$S_{down}(j+1)=S_{up}(k+\text{round}[L \cdot f_b/f_{r,up}(k)]) \quad (45)$$

where round $[L \cdot f_b/f_{r,up}(k)]$ is the variable downsampling step size, which depends on the upsampled shaft rotating frequency $f_{r,up}(k)$. In addition, round(.) stands for rounding a number to the nearest integer. The downsampling process to obtain $S_{down}(j)$ is equivalent to resampling the original or upsampled current demodulated signal $[s(n)$ or $S_{up}(k)$, respectively] with a variable sampling frequency $f_s(k)$, whose value is proportional to the value of $f_{r,up}(k)$. According to equation (43) above, the normalized frequency of $s_{down}(j)$, which is $\Omega_{down}(j)$, is given by the following equation $\Omega_{down}(j)/2\pi = s_{down}(j)/f_s(j)$, where $\Omega_{down}(j)$ is now a constant value.

The process 400 includes calculating (422) the classical frequency spectrum of the downsampled current demodulated signal $S_{down}(j)$ for the fault signature extraction, which now has a constant characteristic frequency. By using the above method 400, the variable 1P frequency of the wind turbine generator and variable characteristic frequency $f_{fault}$ of a wind turbine generator fault become constant values in the frequency spectrum of $S_{down}(j)$. Therefore, the resulting frequency spectrum is called the 1P-invariant frequency spectrum and the magnitude of the excitation at $f_{fault}$ in the frequency spectrum of $s_{down}(j)$ can be used as a signature to clearly identify and quantify wind turbine generator faults.

In some implementations of method 400, the constant base value of the downsampling step size L is chosen based on two criteria. First L should be large enough to eliminate the quantization error due to the requirement of an integral downsampling step size. Second, L should be small enough to ensure that the sampling frequency after downsampling is greater than twice the $f_{fault}$ frequency. In one example, L is larger than 10. The base frequency $f_b$ is chosen to be the mean value of the estimated shaft rotating frequency $f_r(n)$. Furthermore, if the measured current is sampled with a sufficiently high sampling rate, as in step 406, such that the sampling frequency of the downsampled signal $S_{down}(j)$ without using upsampling is greater than twice the characteristic frequency of the wind turbine generator fault, then M is 1 and the upsampling steps 414-418 can be excluded.

Impulse Detection for the 1P-invariant Frequency Spectra

Figure 5:
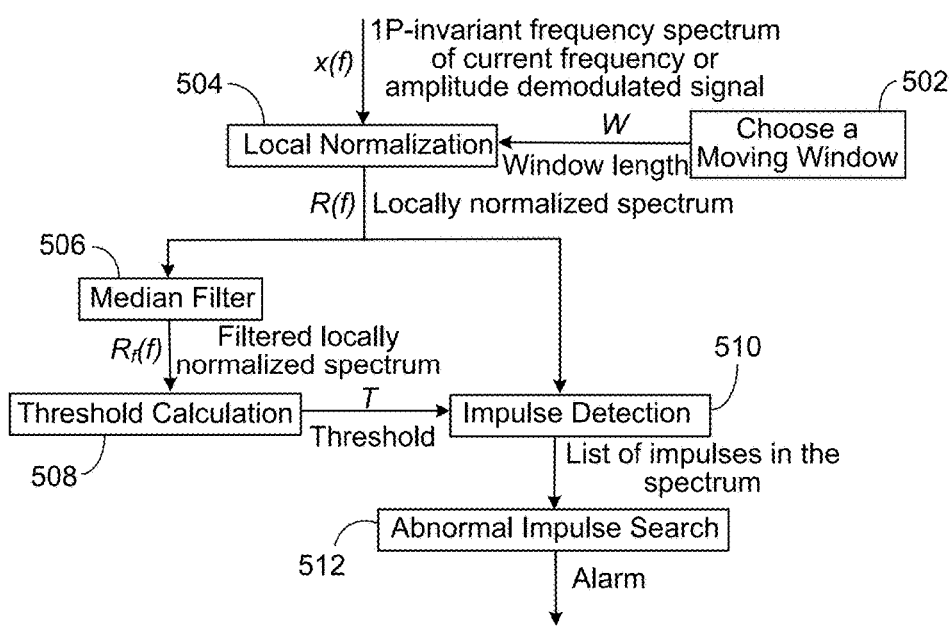
FIG. 5 is a flow chart of a process for detecting faults in wind turbine generators.

FIG. 5 is a flow chart of a process 500 for detecting faults in wind turbine generators. The process 500 provides an impulse detection algorithm for automatic extraction of fault signatures from the 1P-invariant frequency spectra. The 1P-invariant frequency spectra of the current demodulated signals usually have non-stationary amplitudes. Therefore, a localized process for impulse detection from the frequency spectra is employed. In a 1P-invariant frequency spectrum, the magnitude at one frequency represents the energy of the time-domain signal at that frequency. If the energy around a certain frequency is high, it will generate an impulse in the frequency spectrum. The impulse detection method is proposed based on the amplitude of a 1P-invariant frequency spectrum.

In this example, assume that $x(f)$ represents the sampled 1P-invariant frequency spectrum of a current demodulated signal, where $f=1, 2, 3, \ldots F$ and F is the length of $x(f)$. The process 500 includes defining the energy of $x(f)$ as $P_x(f)=x(f)$ and selecting (502) a moving window W. If the moving window W is of length 2W+1 is used, the energy of the data in the window can be defined as $P_w=x(f-W)+x(f-W+1)+\ldots+x(f+W)$. A ratio $R(f)$ is defined to present the percentage of the energy at the frequency f with respect to the total energy of the points contained in the moving window $R(f)=P_x(f)/P_w$. In some implementations, the system can use a moving window to locally normalize the frequency spectra of particular resampled frequency and amplitude demodulated signals.

The process 500 includes locally normalizing (504) $x(f)$ resulting in $R(f)$, which represents a locally normalized spectrum of the original frequency-domain signal $x(f)$. If $R(f)$ at a certain frequency point is greater than a predetermined threshold T, it can indicate that there is an impulse at that frequency. In operation, the threshold T is automatically generated from the 1P-invariant frequency spectrum.

The process 500 includes filtering (506) $R(f)$ using a median filter, which is a nonlinear filter, to remove the impulse. The filtered $R(f)$ is represented by $R_f(f)$, which is the result of $R(f)$ processed by the median filter. The process 500 includes selecting a threshold T by performing (508) a threshold calculation. The threshold T is generally set to be the maximum value of $R_f(f)$. If an impulse is detected (510) at a fault characteristic frequency $f_{fault}$ in the locally normalized frequency spectrum of $S_{down}(j)$, it indicates that one or more components of the wind turbine generator have a fault. This is typically an abnormal condition and as such, the process 400 can determine the abnormal condition by performing (512) an abnormal impulse search and if the impulse is indeed abnormal, the process 400 can issue an alarm or message indicating the abnormal condition.

Although the various actions in FIGS. 2-5 have been shown in a linear grouping as one example, the particular determinations made in the process and the order of those determinations may vary depending on the implementation.

The following examples of experimental studies include use of a direct-drive wind turbine generator. The generator includes six pole pairs and is operated in a wind tunnel. The wind tunnel can use a variable-speed fan to generate controllable wind flows with speeds from 0 to 10 m/s. In the experimental studies, the rotating speed of the fan is varied to generate variable wind speed in the wind tunnel. One phase stator current of the wind turbine generator is recorded via a current clamp and data acquisition system at a sampling rate of 10 kHz. The current samples are acquired by the software operating on a computing system. The length of each current record is 60 seconds.

Example: Blade Imbalance Detection

To create a blade imbalance, additional masses are added close to the tip of a blade of the wind turbine generator. The mass of a healthy blade is measured to be 181 grams. Four blade imbalance scenarios are tested by adding a mass of 2.3 grams, 4.5 grams, 6.8 grams, and 9 grams, respectively, to a blade. Therefore, the weight of the blade is increased by 1.25%, 2.5%, 3.75%, and 5%, respectively. During the experiments, the wind turbine generator is operated at variable speeds in the range of 6-13 Hz, which represents the variable 1P frequency. The proposed methods above are applied to obtain the 1P-invariant Power Spectral Density (PSD) of the estimated shaft rotating frequency of the wind turbine generator for the four blade imbalance scenarios and the baseline case. In the proposed methods, the base frequency $f_b$ is chosen to be 10 Hz and the base value of the downsampling step size L is 100. In the experiments, excitations are observed at the fixed 1P frequency of 10 Hz in the 1P-invariant power spectral density plots in the blade imbalance scenarios. Thus, the magnitude of this excitation provides an effective index for detecting blade imbalance faults. The greater the magnitude of the excitation appears at the 1P frequency, the higher degree of the blade imbalance. Therefore, the proposed methods can not only identify, but can also quantify the degree of blade imbalance of the wind turbine generator.

Example: Bent Blade Detection

A bent blade is a blade of a wind turbine generator that twists flapwise or edgewise from the respective normal. A bent blade may also generate an imbalance fault in the wind turbine generator. During the experiments, one blade of the wind turbine is bent edgewise at 2, 4, and 6 degrees, respectively.

In the experimental studies, an excitation appears at a fixed frequency of 1P (10 Hz) in the 1P-invariant power spectral density plots of the bent blade cases. The magnitude of the 1P excitation provides an effective index for detecting and quantifying the bent blade faults. Since the wind turbine is operated in the wind tunnel during the experiments and there is no wind shear or yaw error in the wind tunnel, there is no excitation at 2P frequency in the experimental results, which is another characteristic frequency of aerodynamic asymmetries.

Synchronous Sampling and Impulse Detection

The following describes a fault detection process that uses a synchronous sampling and impulse detection technique. The current signals are synchronously sampled or resampled such that the varying characteristic frequencies of the excitations generated by wind turbine faults in the current signals become constant values. An impulse detection algorithm is used to detect the faults by identifying the excitations from the frequency spectra of the synchronously sampled or reampled stator current signals. The current signal can be a raw analog current signal measured from a turbine generator. The current signal can also be a digital current signal that has been used by the control system of the turbine generator. In this case, the current signal is still measured from the turbine generator using a current sensor, but has been sampled for other purposes, such as control. The fault detection process can use raw analog current signal measured by using one or more additional current sensors, but can also use the existing current signal which is already available in the turbine generator control system. In the latter case, there is no need to install additional current sensors or data acquisition devices (e.g., analog to digital converters) to implement the fault detection process described here.

In some implementations, a current-based fault detection process for direct-drive wind turbines operating with varying shaft rotating frequencies includes a low-computational-cost, high-resolution, wide-band, synchronous sampling process and an impulse detection process. In the synchronous sampling process, the phase of the original time-domain uniformly sampled generator current signal is first estimated. According to the estimated phase, synchronous resampling is then performed for the current signal such that the varying characteristic frequencies of wind turbine faults in the current signal are converted to constant values. An impulse detection process then identifies the fault signatures, which are the excitations (i.e., impulses) generated by wind turbine faults at the fault characteristic frequencies in the frequency spectrum of the synchronously sampled current signal. The detected impulses are then used for health condition evaluation and fault detection of the wind turbine.

Synchronous Sampling for Current Signals

Many faults in direct-drive wind turbines, e.g., blade imbalance, aerodynamic asymmetry, rotor eccentricity, bearing faults, etc., will generate excitations at certain frequencies (called fault characteristic frequencies) in the frequency spectra of generator current signals. In general, a fault characteristic frequency $f_{fault}$ can be expressed as follows.

$$f_{fault} = k_f \cdot f_r = \frac{k_f}{p} \cdot f_1 \tag{46}$$

where $f_r$ is the shaft rotating frequency of the wind turbine, $f_1$ is the fundamental frequency of the stator current signal; $k_f$ is a positive real number; and p is the number of pole pairs of the generator. Since a wind turbine is typically operated with a varying shaft rotating frequency, $f_1$ and $f_{fault}$ are varying.

Synchronous Sampling

Figure 6A:
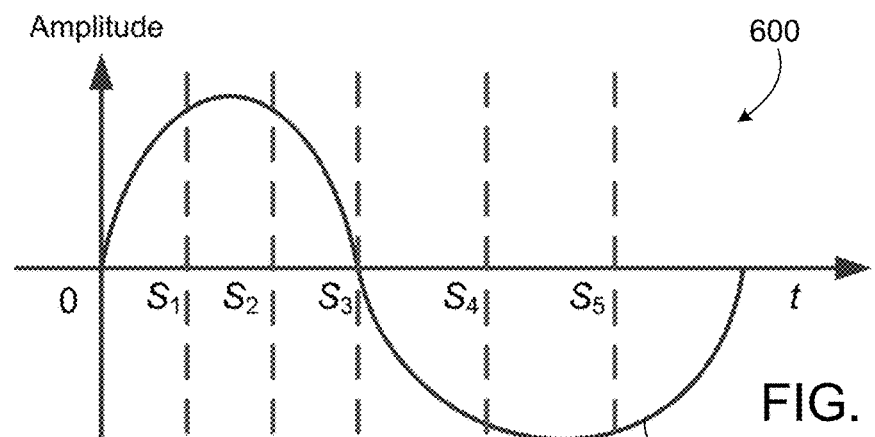
FIG. 6A is a graph showing an exemplary synchronously sampled nonstationary sinusoidal signal.
Figure 6B:
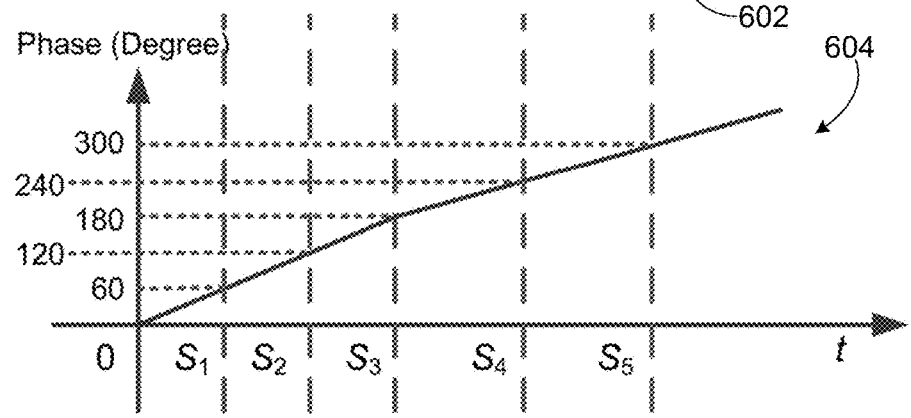
FIG. 6B is a graph showing the phase of the synchronously sampled nonstationary sinusoidal signal.

Synchronous sampling is a non-uniform sampling method for signal processing. FIG. 6A is a graph 600 showing a synchronously sampled nonstationary sinusoidal signal 602. FIG. 6B is a graph 604 showing the phase of the signal 602, in which "nonstationary" means that the amplitude, frequency, and/or phase of the sinusoidal signal are variable. For example, when the wind is stronger, the wind turbine rotor blades may rotate at a faster rate, whereas when the wind is weaker, the rotor blades may rotate at a slower rate. If the current signal from the wind turbine is sampled at constant time intervals, the intervals of the phases of the current samples will not be constant—the phase interval between two samples will be smaller if the rotor blades rotate at a slower speed, and the phase interval between two samples will be larger if the rotor blades rotate at a higher speed.

In synchronous sampling, the phases, instead of the time intervals, of the time-domain sampling points of the sinusoidal signal are evenly distributed. As shown in FIG. 6A, $S_1, S_2, S_3, S_4$, and $S_5$ are the time instants of the synchronous sampling points of the sinusoidal signal 602 in one cycle. As shown in FIG. 6B, the corresponding phases of the signal 602 at the five sampling points are 60, 120, 180, 240, and 300 degree, respectively. In this example, the signal is sampled at a constant phase interval (i.e., 60 degree interval). In this case, in each cycle of the synchronously sampled nonstationary sinusoidal signal, the number of the sampling points is a constant.

Signal Phase Estimation

To perform synchronous sampling, one needs to find the location of each synchronous sampling point of the processed signal in the time domain. In some examples, this is done using the phase of the signal.

Figure 7:
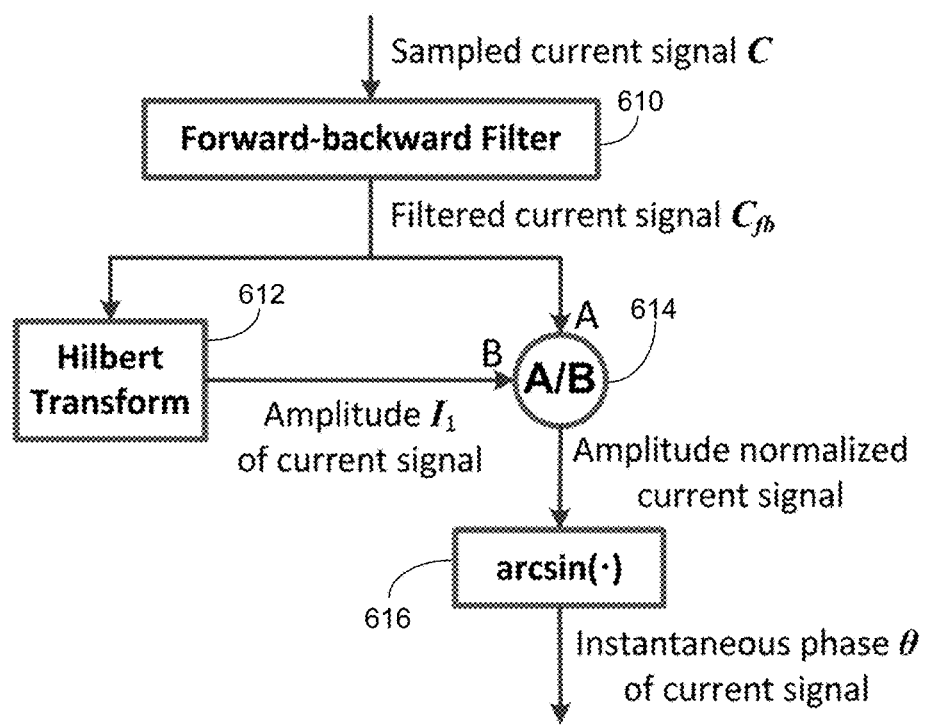
FIG. 7 is a diagram of an exemplary process for estimating the phase of the nonstationary sinusoidal signal, such as a generator current signal of a wind turbine.

FIG. 7 is a diagram of a process for estimating the phase of the nonstationary sinusoidal signal, which for example can be a generator current signal of a wind turbine. First, a forward-backward filter 610 is used to filter out the high-frequency sampling noise in the current signal, which is implemented as follows.

$$C = I_1 \cdot \sin(\theta) + C' \tag{47}$$

$$C_f = H_f \cdot C \tag{48}$$

$$C_{fb}^R = H_f \cdot C_f^R \tag{49}$$

$$H_f = \begin{pmatrix} h_{f,0} & 0 & \cdots & 0 \\ h_{f,1} & h_{f,0} & 0 & \cdots \\ \cdots & & \cdots & \\ h_{f,N-1} & \cdots & h_{f,1} & h_{f,0} \end{pmatrix} \tag{50}$$

$$C_{fb} = I_1 \cdot \sin(\theta) \tag{51}$$

where $C=[C(1), \ldots, C(N)]^T$ is a column vector representing the sampled generator current signal with a constant sampling frequency, such as that used in the control system of the wind turbine; N is the length of the sampled current signal; $I_1$ and $\vartheta$ are the instantaneous amplitude and phase of the fundamental frequency component of C, respectively; C' represents the harmonics of C and the sampling noise; $H_f$ is a filter expressed in a matrix form; $C_f$ is the forward-filtered result of C; $C_f^R$ is obtained by reversing the sequence of the samples of $C_f$; therefore, $C_{fb}^R$ is the backward-filtered result of $C_f$. Finally, $C_{fb}$, which is the forward-backward filtered result of C, is obtained by reversing the sequence of the samples of $C_{fb}^R$. As given in equation (51), $C_{fb}$ is an estimation of the fundamental frequency component of C. The forward-backward filter 610 is a zero-phase-distortion filter used to facilitate the phase estimation of the signal, which is critical to synchronous sampling.

A Hilbert transform 612 is used to calculate the instantaneous amplitude $I_1$ of the forward-backward filtered current signal $C_{fb}$.

$$H[C_{fb}] = F^{-1}\{F[C_{fb}] \cdot \mu\} \tag{52}$$

$$u = \begin{cases} 1, & n = 0, N/2 \\ 2, & n = 1, 2, \ldots, N/2 - 1 \\ 0, & n = N/2 + 1, \ldots, N - 1 \end{cases} \tag{53}$$

$$I_1 = \sqrt{\{C_{fb}^2\}^2 + \{H[C_{fb}]\}^2} \tag{54}$$

where $H(\cdot)$ stands for the Hilbert transform; $F(\cdot)$ and $F^{-1}(\cdot)$ stand for the fast Fourier transform (FFT) and inverse FFT (IFFT), respectively. $C_{fb}$ is then normalized 614 with respect to its instantaneous amplitude $I_1$ and the result is the following according to equation (51).

$$\frac{C_{fb}}{I_1} = \sin(\theta) \tag{55}$$

The inverse sine function "arcsin(·)" 616 is applied to the normalized current signal and the result is the instantaneous phase $\vartheta$ of the fundamental component of the original current signal C with a domain of definition of [0, 360) degree.

Resampling

Assume that the original nonstationary generator current signal is uniformly sampled with a constant sampling frequency $F_s$. The total number of the sampling points in one cycle of the fundamental component of the current signal is $F_s/f_1$, which is variable because the fundamental frequency of the nonstationary stator current signal, $f_1$, is variable. A resampling algorithm is used to achieve syncgronous sampling of the generator current signal. Assume that there are $L_s$ sampling points in each cycle of the synchronously sampled generator current signal, where $L_s$ is a constant natural number. According to the Nyquist-Shannon sampling theorem, $L_s$ needs to satisfy the following condition:

$$L_s \cdot f_1 > 2 \cdot f_{fault} \tag{56}$$

The phase value $\vartheta_s$ of the $I_s$-th ($I_s = 1, 2, \ldots, L_s$) synchronous sampling point is:

$$\theta_s(L_s) = \frac{360}{L_s}(l_s - 1) \tag{57}$$

Figure 8:
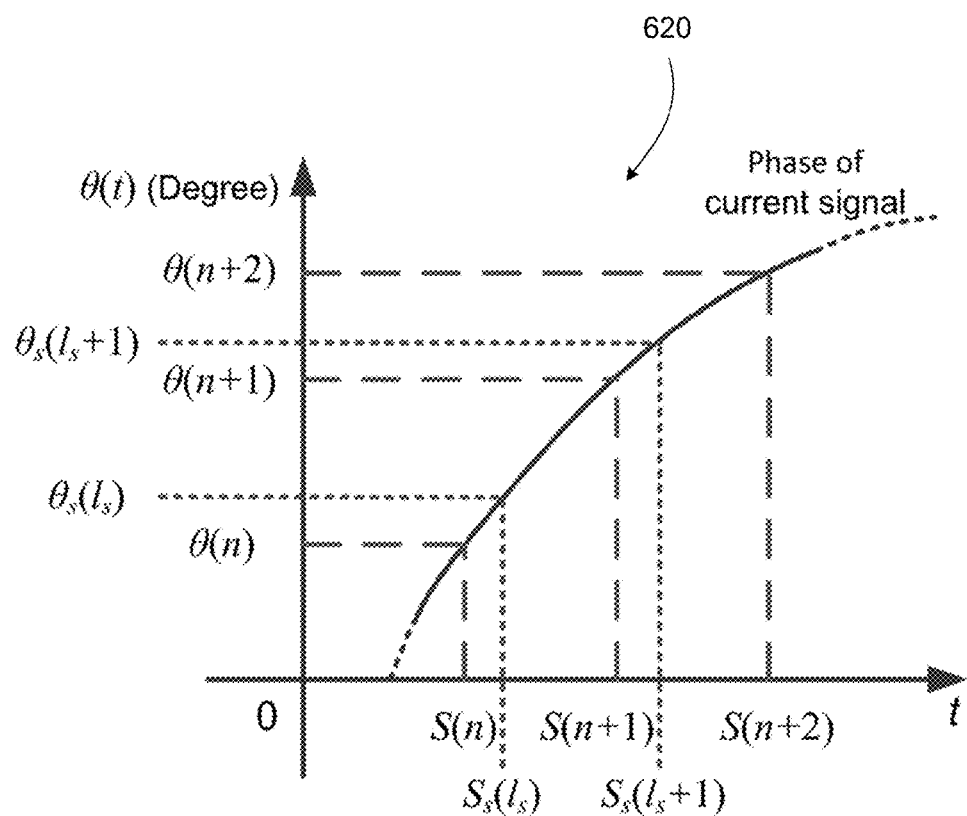
FIG. 8 is a graph that illustrates the calculation of synchronous sampling times.

Referring to FIG. 8, a graph 620 illustrates the calculation of synchronous sampling times. The graph 620 shows the phase $\vartheta(t)$ of the current signal versus time t in a segment of the signal, where S(n), S(n+1) and S(n+2) are the sampling times of the original current samples; $\vartheta(n)$, $\vartheta(n+1)$ and $\vartheta(n+2)$ are the corresponding phase values of the original current samples, respectively, obtained by using the process in FIGS. 7. $S_s(I_s)$ and $S_s(I_s+1)$ are the pending synchronous sampling times of the current signal satisfying $$S(n) \leq S_s(l_s) \leq S(n+1) \tag{58}$$

and $\vartheta_s(I_s)$ and $\vartheta_s(I_s+1)$ are the corresponding phase values of the synchronously sampled current signal, respectively. If the sampling frequency $F_s$ is sufficiently higher than $f_1$, e.g., $F_s > 50 \cdot f_1$, then it is reasonable to assume that the phase value $\vartheta$ is linear between any two consecutive samples, such as S(n) and S(n+1). Therefore, $S_s(I_s)$ can be calculated by:

$$S_s(l_s) = S(n) + \frac{S(n+1) - S(n)}{\theta(n+1) - \theta(n)} \cdot [\theta_s(l_s) - \theta(n)] \tag{59}$$

The calculated synchronous sampling time $S_s(I_s)$ will be used to resample the current signal in the next step. Similarly, it is reasonable to assume that the current signal C is linear between any two consecutive samples.

Figure 9:
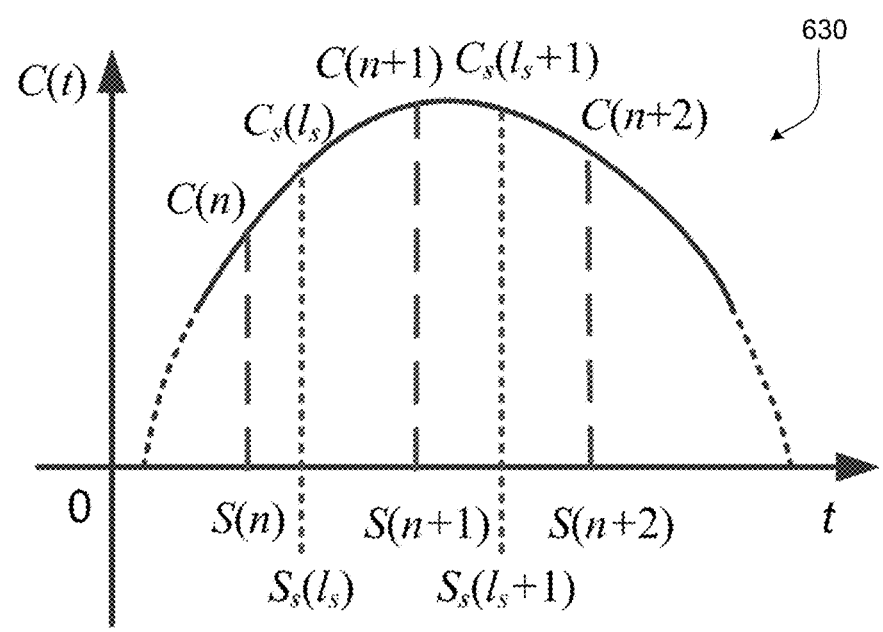
FIG. 9 is a graph that illustrates the calculation of synchronous samples of the generator current signal.

Referring to FIG. 9, a graph 630 illustrates the calculation of synchronous samples of the generator current signal. The graph 630 shows the current sample $C_s(I_s)$ at the time $S_s(I_s)$ can be calculated via synchronous resampling as follows:

$$C_s(l_s) = C(n) + \frac{C(n+1) - C(n)}{S(n+1) - S(n)} \cdot [S_s(l_s) - S(n)] \tag{60}$$

In the example above, linear interpolation is used to estimate the sampling time $S_s(I_s)$ and the current sample $C_s(I_s)$, but other interpolation methods can also be used, such as polynomial interpolation or spline interpolation.

Power Spectral Density Analysis

The power spectral density analysis is applied to extract the wind turbine fault signature from the synchronously sampled current signal $C_s(I_s)$, where $I_s = 1, 2, \ldots, L_s$. In the power spectral density analysis, $C_s(I_s)$ is treated as a uniformly sampled signal, namely, the sampling interval $T_s$ of $C_s(I_s)$ is treated as a constant. Since the number of the sampling points, $L_s$, in each cycle of $C_s(I_s)$ is also a constant, the fundamental frequency $f_1$ of $C_s(I_s)$ is now a constant value in the power spectral density analysis:

$$f_1 = \frac{1}{T_s \cdot L_s} \tag{61}$$

In a direct-drive wind turbine, the relationship between the shaft rotating frequency $f_r$ and the fundamental frequency $f_1$ of the generator stator current is given below:

$$f_1 = p \cdot f_r \tag{62}$$

Thus, $f_r$ is also a constant value in the power spectral density analysis of the synchronously sampled current signal $C_s(I_s)$. Moreover, since the wind turbine fault characteristic frequency $f_{fault}$ is proportional to $f_1$ and $f_r$, as expressed in equation (46), $f_{fault}$ also becomes a constant value in the power spectral density analysis of $C_s(I_s)$.

Fault Signature Extraction and Evaluation

In a power spectral density spectrum, the magnitude at a certain frequency represents the energy of the time-domain signal at the frequency. If the signal has high energy at a certain frequency, it will generate an excitation or impulse at that frequency in the power spectral density spectrum of the signal.

Figure 10:
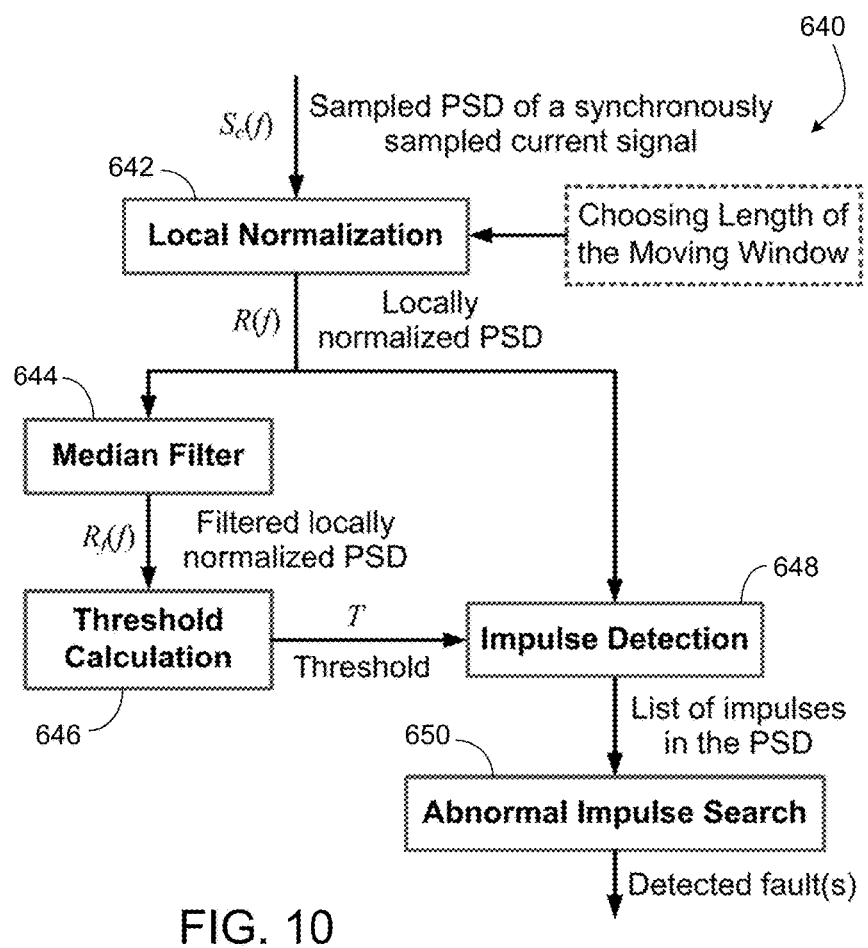
FIG. 10 shows an exemplary impulse detection process for identifying the impulses in the power spectral density spectrum of the synchronously sampled generator current signal.

FIG. 10 shows an impulse detection process 640 for identifying the impulses in the power spectral density spectrum of the synchronously sampled generator current signal. In some examples, the power spectral density spectrum of the synchronously sampled current signal has nonstationary amplitudes, so it is difficult to use a global threshold to identify the impulses of the power spectral density spectrum. Thus, a localized method is used to preprocess the power spectral density spectrum for impulse detection.

Assume that $S_c(f)$ is the sampled power spectral density of the synchronously sampled current signal, where f=1, 2, 3, . . . F; and F is the length of $S_c(f)$. Define the energy of the synchronously sampled signal at frequency f is $P_x(f)$, then:

$$P_x(f)=S_c(f) \qquad (63)$$

The process 640 includes applying local normalization, in which a moving window of length 2W+1 is applied to $S_c(f)$ (642). The total energy of the signal at the frequencies in the moving window is defined as $P_w(f)$, which can be calculated according to the following:

$$P_W(f) = \sum_{j=-W}^{W} S_c(f+j) \qquad (64)$$

The ratio R(f) is defined to be the percentage of the energy of the synchronously sampled current signal at the frequency f with respect to the total energy of the signal at all frequencies contained in the moving window:

$$R(f) = \frac{P_x(f)}{P_W(f)} \qquad (65)$$

The R(f) represents the locally normalized power spectral density of the synchronously sampled current signal. If R(f) at a certain frequency is greater than a threshold T, it indicates there is an impulse at that frequency. In some implementations, T is automatically generated from the power spectral density spectrum. The process 640 includes applying a median filter, which is a nonlinear filter, to process R(f) as follows to generate the threshold:

$$R_f(f) = F_{Median}\left[R\left(f - \frac{L-1}{2}\right), \ldots, R(f), \ldots, R\left(f + \frac{L-1}{2}\right)\right] \qquad (66)$$

where $R_f(f)$ is the filtered result of R(f), L(≥3) is the order of the median filter, and $F_{Median}[\cdot]$ stands for selecting the median in the set [·] (644). The process 640 includes calculating the threshold T according to the following:

$$T=F_{Max}[R_f(1), R_f(2), \ldots, R_f(F)] \qquad (67)$$

where $F_{Max}[\cdot]$ stands for selecting the maximum value in the set [·](646). In order to effectively extract the impulses in the power spectral density using equation (65), the length of the moving window 2W+1 is chosen to be shorter than the distant between two nearest excitations in the power spectral density spectrum, so that the normalized energy (i.e., magnitude) of each impulse calculated by equation (65) will not be reduced by the existence of multiple impulses in the same window. In addition, the length of the moving window 2W+1 should be large enough (e.g., 2W+1>50) to minimize the values of R(f) in the frequency intervals without any impulses.

The process 640 includes analyzing the locally normalized power spectral density of the synchronously sampled current signal R(f) to detect impulses based on the threshold T, and generate a list of impulses in the power spectral density spectrum (648). The process 640 includes searching for abnormal impulses (650). In the locally normalized power spectral density of the synchronously sampled current signal, the amplitudes of the impulses at the characteristic frequencies of wind turbine faults are the signatures for fault detection. Usually there are no impulses at the fault characteristic frequencies when the wind turbine is in healthy conditions. On the other hand, if an impulse is detected at a characteristic frequency of the wind turbine faults, it indicates that the wind turbine is in a faulty condition and maintenance may be required.

Signatures of Wind Turbine Faults in Current Signals

Rotor eccentricity and bearing fault of direct-drive wind turbines can be detected using synchronous sampling and impulse detection.

Rotor Eccentricity

The following describes rotor eccentricity detection for direct-drive wind turbines, which for example can be equipped with permanent-magnet synchronous generators (PMSGs) operating in variable-speed conditions. The characteristic frequencies $f_{ecc}$ of rotor eccentricity faults of a direct-drive wind turbine in the power spectral density of a permanent-magnet synchronous generator stator current signal can be expressed below:

$$f_{ecc} = \left(1 \pm \frac{2k-1}{p}\right) \cdot f_1 \qquad (68)$$

where k=1, 2, 3, . . . are integers. Since the fundamental frequency $f_1$ is not constant due to the variable-speed operation of the wind turbine, resampling of the current signal is performed to produce a constant fundamental frequency before applying current spectrum analysis directly for rotor eccentricity detection.

Bearing Fault

FIGS. 11A and 11B are diagrams showing the configuration of a ball bearing 660 that has balls 662 held by a cage 668 positioned between an outer race 664 and an inner race 666. In FIG. 11A, the rotational axis of the ball bearing 660 is perpendicular to the page, and in FIG. 11B, the rotational axis of the ball bearing 660 is parallel to the page. As shown in FIG. 11B, $D_b$ is the ball diameter, $D_c$ is the pitch diameter, and φ is the ball contact angle, which can be, e.g., zero. The single-point faults of this type of bearings include, e.g., inner-race fault, outer-race fault, ball fault, and cage fault. The theoretical characteristic frequencies of the four types of single-point bearing faults in vibration measurements are given below:

$$f_i = 0.5 \cdot N_B \cdot f_r\left(1 + \frac{D_b \cdot \cos\phi}{D_c}\right) \qquad (69)$$

$$f_o = 0.5 \cdot N_B \cdot f_r\left(1 - \frac{D_b \cdot \cos\phi}{D_c}\right) \qquad (70)$$

$$f_b = f_r \cdot \left(\frac{D_c}{D_b}\right) \cdot \left[1 - \left(\frac{D_b \cdot \cos\phi}{D_c}\right)^2\right] \qquad (71)$$

$$f_c = 0.5 \cdot f_r\left(1 - \frac{D_b \cdot \cos\phi}{D_c}\right) \qquad (72)$$

where $f_i$, $f_o$, $f_b$, and $f_c$ are the characteristic frequencies of inner-race bearing fault, outer-race bearing fault, bearing ball fault, and bearing cage fault, respectively; $f_r$ is the rotating frequency of the bearing; and $N_B$ is the number of balls in the bearing. These characteristic frequencies of the single-point bearing faults in vibration measurements depend on the bearing geometry and the rotating frequency. The excitations at these frequencies can be used for bearing fault detection.

To use permanent-magnet synchronous generator stator current signals for bearing fault detection, the influence of bearing faults on the stator current signals needs to be modeled. Similar to electric machines, due to the radial rotor movement and the shaft torque variation generated by a wind turbine bearing fault, both the frequency and the amplitude of the permanent-magnet synchronous generator stator current signals are modulated by the characteristic frequency $f_{bf}$ of the bearing fault in vibration measurements, where $f_{bf}$ stands for $f_i$, $f_o$, $f_b$, or $f_c$. Thus, the characteristic frequencies $f_{c,bf}$ of the bearing fault in a current signal due to the modulation of its fundamental frequency $f_1$ by $f_{bf}$ can be expressed as follows:

$$f_{c,bf} = |f_1 + k \cdot f_{bf}| \tag{73}$$

where k takes the same values as that in equation (68). In addition, the harmonics of the stator current signals are also modulated by $f_{bf}$. Because the harmonics may have much lower magnitudes than the fundamental component, the excitations generated at the frequencies caused by the current harmonics modulation can be much smaller than those generated at the frequencies $f_{c,bf}$ given by equation (73). Based on equations (69) to (73), it is also a challenge to use current spectrum analysis directly for bearing fault detection due to the nonstationary current fundamental frequency $f_1$ and rotating frequency $f_r$ of the wind turbine.

Experimental Results

The following describes experimental results of applying synchronous sampling and impulse detection for detecting bearing faults.

Experimental Setup

Experiments were conducted in which a 160-W Southwest Windpower Air Breeze direct-drive permanent-magnet synchronous generator wind turbine was used. The permanent-magnet synchronous generator has six pole pairs (p=6). The test wind turbine was operated in a wind tunnel, which uses a variable-speed fan to generate controllable wind flows with the speed from 0 to 10 m/s. One phase stator current of the permanent-magnet synchronous generator was recorded by a Fluke 80i-110s AC/DC current clamp. The measured current signals were digitalized by a National Instrument data acquisition system with a sampling rate of 10 kHz. The current samples were acquired by the LabView software operating on a computer, which implements the synchronous sampling and impulse detection process for detecting mechanical faults of the wind turbine.

Rotor Eccentricity

Figure 12:
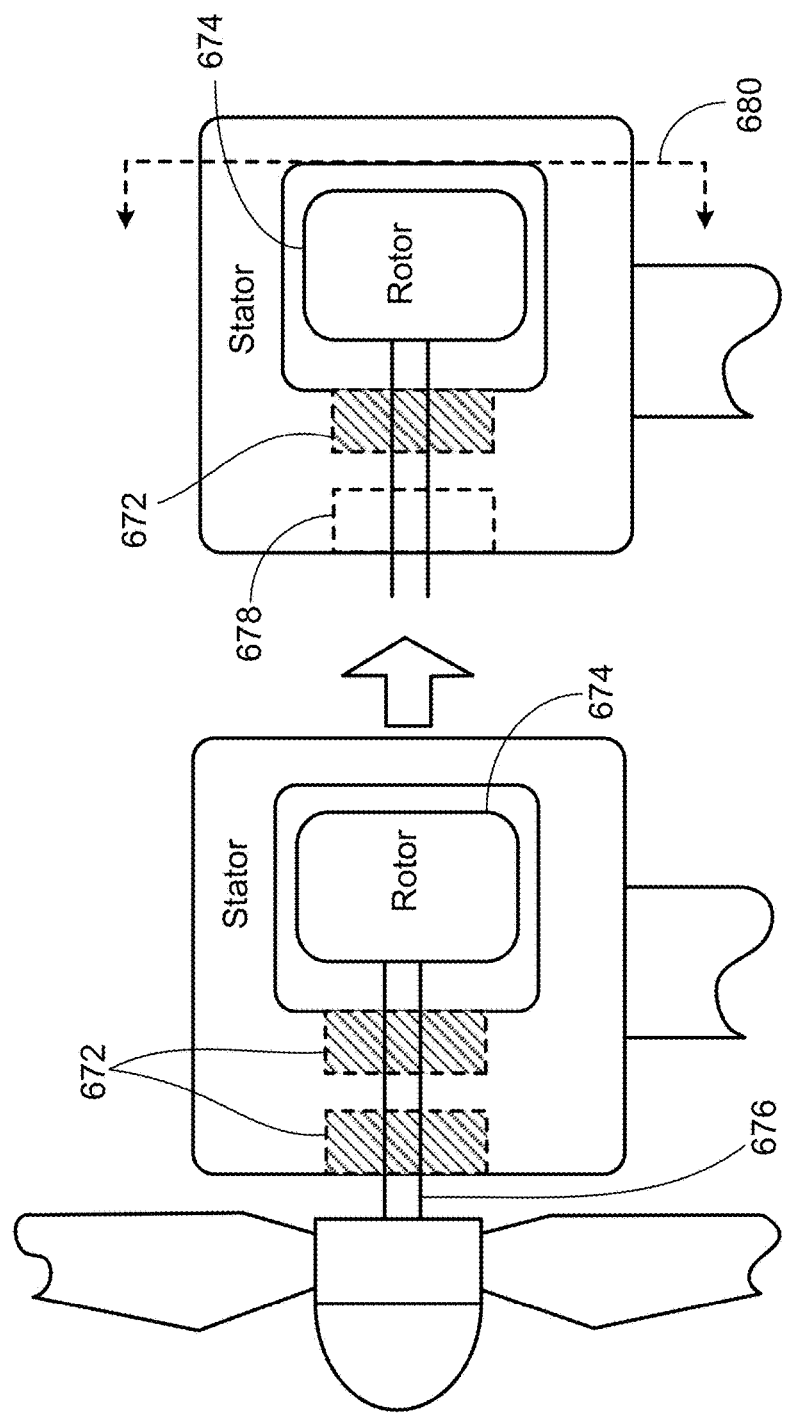
FIG. 12 is a diagram showing emulation of a rotor eccentricity in a test wind turbine.

FIG. 12 is a diagram showing emulation of a rotor eccentricity in a test wind turbine. As shown in FIG. 12, a wind turbine 670 uses two bearings 672 to support a rotor 674 and a shaft 676. To emulate a rotor eccentricity, one bearing 678 was removed to increase the degree of freedom of the rotor 674 in the vertical direction, as represented by the dash-line arrow 680. Experiments were performed for the wind turbine with two bearings (healthy case) and one bearing (rotor eccentricity case) operated with a nonstationary shaft rotating frequency in the range of 6 Hz to 13 Hz. The length of the data record was 100 s in each case.

The synchronous sampling process was applied to calculate the power spectral densities of the stator current signals of the wind turbine 670 in the healthy condition and with the rotor eccentricity. In the synchronous sampling, $L_s$ was chosen to be 32; $T_s$ was chosen to be 1/1920 second in the power spectral density analysis; and the MATLAB function "filtfilt(b, a)" was used to implement the forward-backward filter for phase estimation of the current signal, where b=ones(1, 10)/10 and a=1. The function "ones" generated a 1×10 array with all elements being one. According to equation (61), the fundamental frequency $f_1$ of the synchronously sampled stator current signal was 60 Hz in both cases.

Referring to FIGS. 13A and 13B, graphs 690 and 700 show the power spectral density spectra of the synchronously sampled stator current signals for (a) the healthy case, and (b) the rotor eccentricity case, respectively. In these examples, 50 Hz and 70 Hz are two characteristic frequencies of the rotor eccentricity corresponding to k=1 in equation (68). Referring to FIG. 13A, the graph 690 shows the power spectral density of synchronously sampled stator current for the healthy case, in which small excitations 692 caused by the inevitable small blade imbalance and aerodynamic asymmetry are observed at 50 Hz and 70 Hz. Referring to FIG. 13B, the graph 700 shows the power spectral density of synchronously sampled stator current for the case with the emulated rotor eccentricity fault caused by the loss of one bearing. In the graph 700, the magnitudes of the excitations 694 at 50 Hz and 70 Hz increased significantly when compared to those in FIG. 13A. In addition, there are excitations at 30 and 90 Hz in both cases. These frequencies correspond to k=2 in equation (68). These excitations are not chosen for emulated rotor eccentricity detection of the test wind turbine because the effects of yaw error and tower shadow of a three-blade wind turbine may also generate excitations at these frequencies, and the amplitudes of these excitations do not increase significantly compared to those at 50 Hz and 70 Hz in the case of the emulated rotor eccentricity fault.

The impulse detection process was then applied to identify the excitations in the power spectral density of the synchronously sampled stator current signal for detection of the emulated rotor eccentricity. The length of the moving window was chosen to be 101. A 3rd-order median filter was used to calculate the threshold T.

Referring to FIGS. 14A and 14B, graphs 710 and 720 showing the locally normalized power spectral density spectra [i.e., R(f)] of the synchronously sampled stator current signals and the threshold generated by the impulse detection process for (a) the healthy case, and (b) the emulated rotor eccentricity case, respectively. Referring to FIG. 14A, the graph 710 shows that in the healthy case, the amplitudes of the excitations at 50 Hz and 70 Hz are below the threshold 712. Referring to FIG. 14B, the graph 720 shows that the impulse detection process successfully extracted the fault signatures, which are the excitations 722 at the fault characteristic frequencies of 50 Hz and 70 Hz, for the emulated rotor eccentricity detection.

Figure 15:
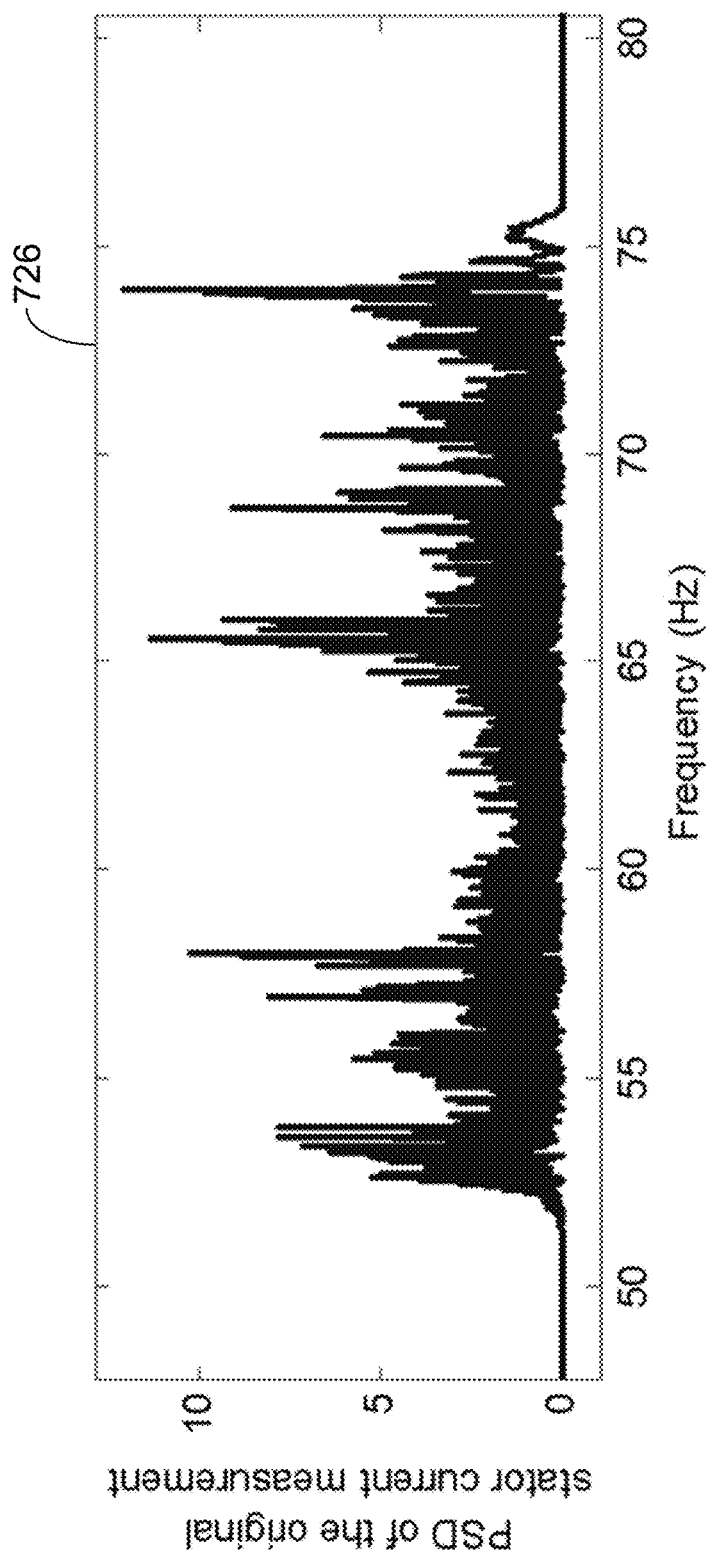
FIG. 15 is a graph that shows an exemplary power spectral density spectrum of the original uniformly sampled stator current signal for the emulated rotor eccentricity case.

Referring to FIG. 15, a graph 726 shows the power spectral density spectrum of the original uniformly sampled stator current signal for the emulated rotor eccentricity case. Due to the varying shaft rotating frequency of the wind turbine, the fault characteristic frequencies vary and overlap the varying fundamental frequency $f_1$ of the original uniformly sampled stator current signal in the current power spectral density spectrum. As a result, the fault characteristic frequencies cannot be detected by simply using the power spectral density spectrum analysis for the original uniformly sampled stator current signal.

Figure 16:
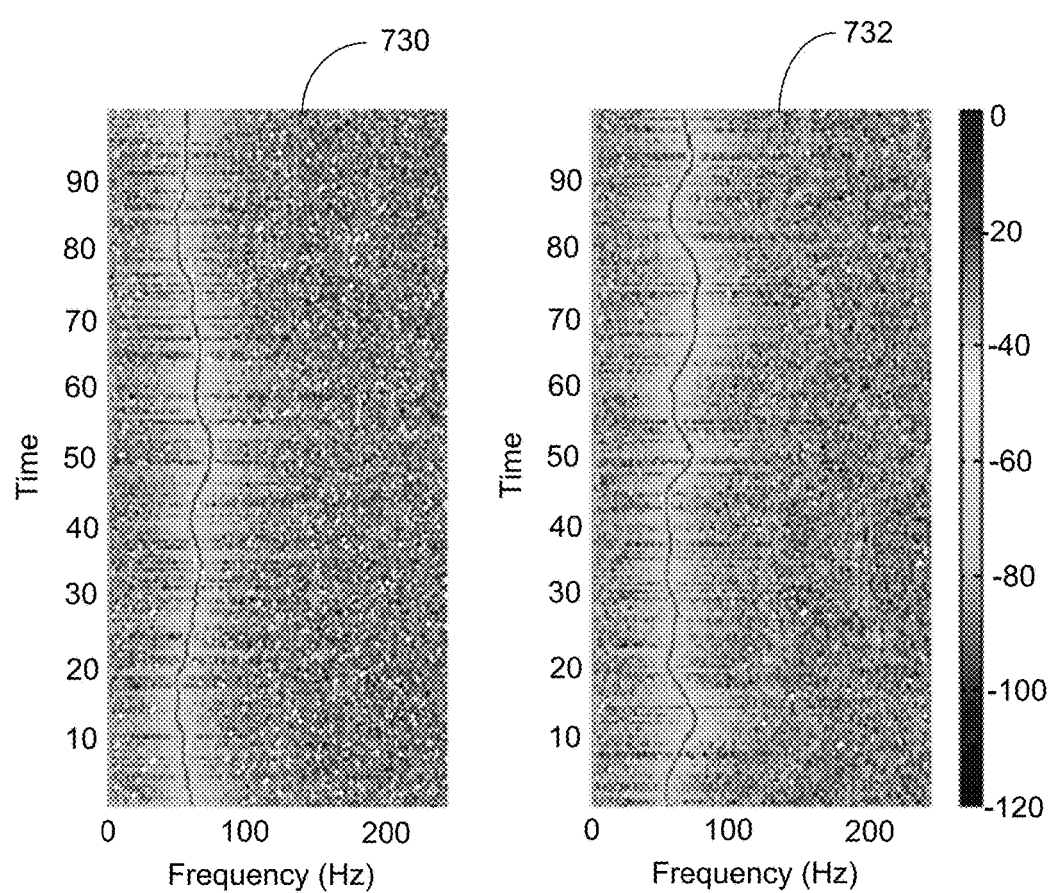
FIG. 16 shows exemplary spectrograms of the original uniformly sampled stator current signal generated by using the short-time Fourier transform for (a) the healthy case, and (b) the emulated rotor eccentricity case.

Referring to FIG. 16, graphs 730 and 732 show the spectrograms of the original uniformly sampled stator current signal generated by using the short-time Fourier transform for (a) the healthy case, and (b) the emulated rotor eccentricity case, respectively. The fundamental frequency of the nonstationary current signal is in the range form 40 Hz to 80 Hz. From the graphs 730 and 732, it is difficult to identify any excitations caused by the emulated rotor eccentricity fault around the fundamental frequency due to low amplitudes of these excitations.

The phase-based synchronous sampling process can be implemented using a relatively low memory space for storing data, has a relatively low computational cost and has low or no truncation error, and can synchronously resample a signal with a frequency close to its original sampling frequency. The synchronous sampling process is a novel, computationally-efficient, and wide-band digital synchronous sampling approach that is suitable for online detection of wind turbine faults, e.g., the faults having high characteristic frequencies in the current signals.

Bearing Cage Fault

Figure 17:
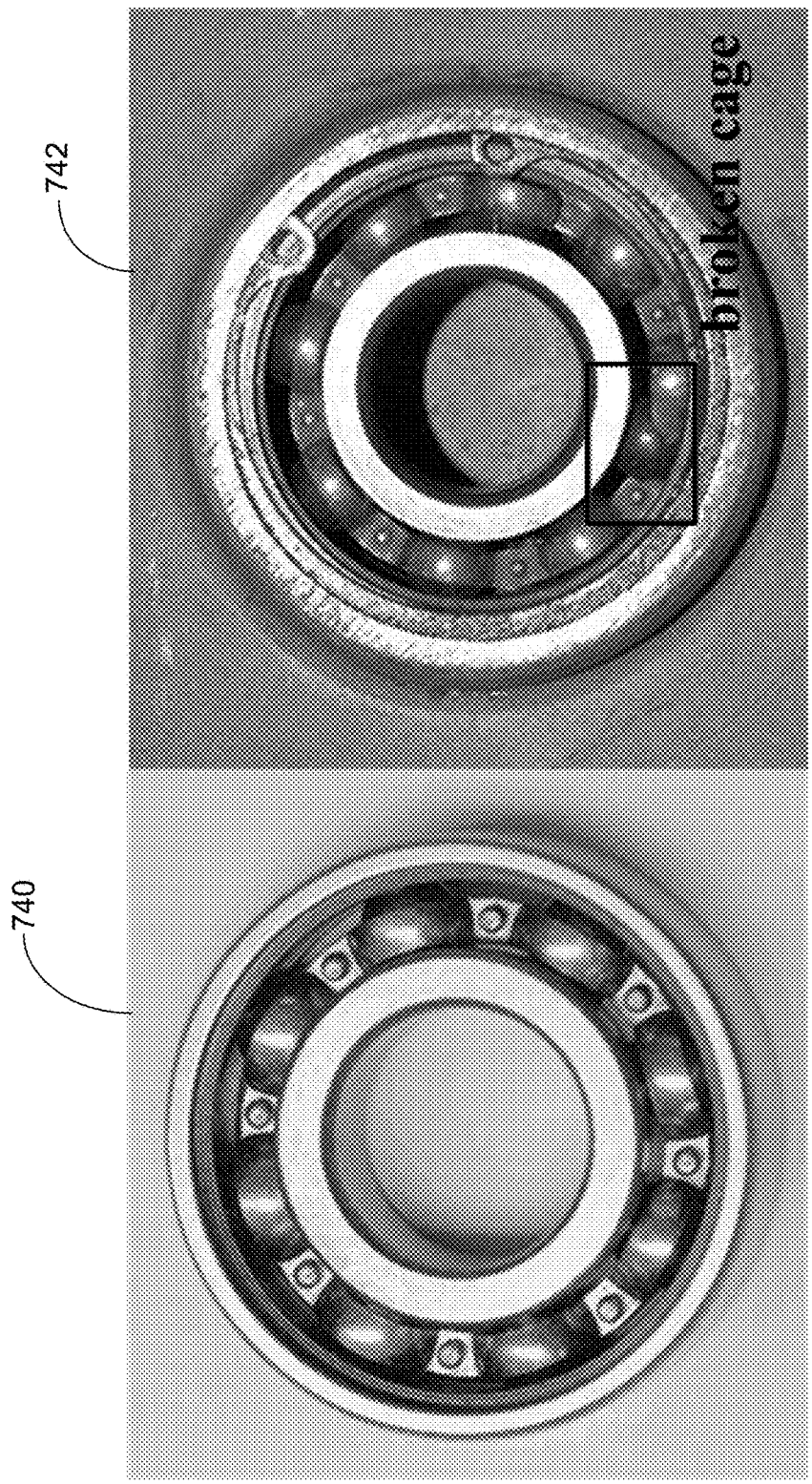
FIG. 17 show photographs of an exemplary bearing before and after the experiment.

The following describes an experiment for testing bearing cage faults. In this test, the test bearing (7C55MP4017) was initially a new bearing and pretreated by removing the lubrication oil to accelerate its degradation. The parameters of the test bearing were $N_B=8$, $D_c=33$ mm, and $D_b=8$ mm. The wind turbine with the pretreated bearing was operated with varying shafting rotating speed in the wind tunnel continuously for about 25 hours. The permanent-magnet synchronous generator stator current signal was recorded every 20 minutes. The length of each record was 100 s. The wind turbine stopped rotating at the end of the experiment due to the damage of the cage of the test bearing. FIG. 17 show photographs 740 and 742 of the test bearing before and after the experiment, respectively.

Referring to FIGS. 18A and 18B, graphs 750 and 752 show the power spectral densities of the synchronously sampled stator current signals for (a) the healthy bearing case, and (b) the faulty bearing case, respectively, where $L_s$ was chosen to be 32; $T_s$ was 1/1920 second; and the same forward-backward filter used for the rotor eccentricity detection was used for the bearing fault detection. The frequency $f_1$ of the synchronously sampled stator current signal was 60 Hz and $f_r$ was 10 Hz according to equation (62) for both cases. According to equations (72) and (73), the characteristic frequencies $f_{c,bf}$ of the bearing cage fault in the synchronously sampled stator current signal were approximately 60±k·3.8 Hz. As shown in FIG. 18B, excitations 754 appear at the fixed frequencies of 56.1 Hz and 63.9 Hz in the power spectral density of the synchronously sampled current signal in the faulty bearing case. These two fault characteristic frequencies are close to the calculated theoretical values of 60±3.8 Hz when k=±1. Moreover, there are excitations 756 at 53.9 Hz and 66.1 Hz in FIG. 18B, which were generated by the modulation between the bearing cage fault frequencies and the shaft rotating frequency $f_r$.

The impulse detection process was applied to extract the excitations in the power spectral density of the synchronously sampled stator current signal for bearing cage fault detection. The length of the moving window was chosen to be 101. A 3rd-order median filter was used for threshold calculation.

Figure 19:
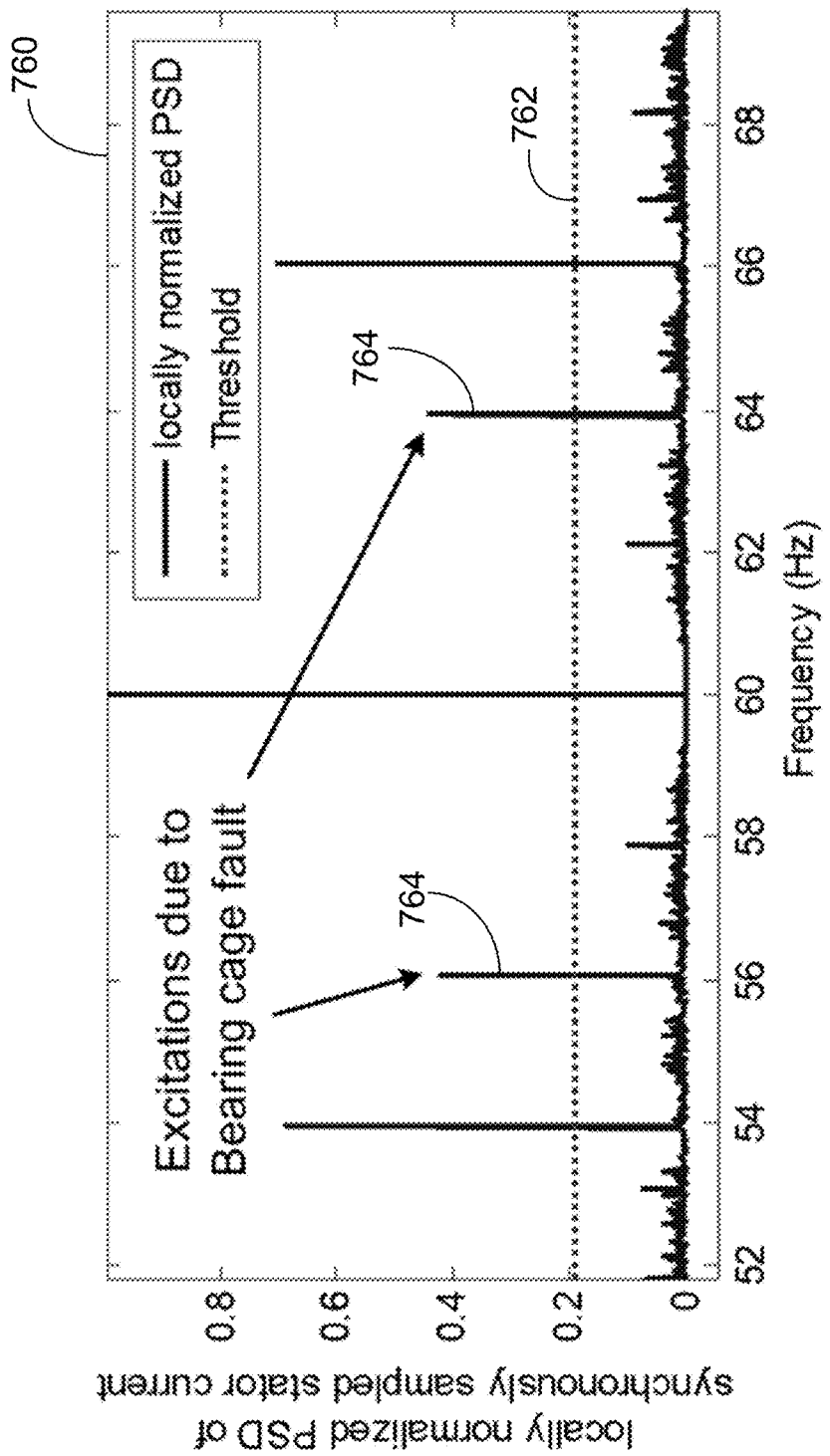
FIG. 19 is a graph that shows an exemplary locally normalized power spectral density spectrum of the synchronously sampled stator current signal and threshold generated by the impulse detection process for the faulty bearing case.

Referring to FIG. 19, a graph 760 shows the locally normalized power spectral density [i.e., R(f)] of the synchronously sampled stator current signal and the threshold generated by the impulse detection process for the faulty bearing case. The threshold 762 was calculated to be 0.19. The impulses 764 appear at 56.1 Hz and 63.9 Hz, which are the signatures of the bearing cage fault in the test wind turbine.

The impulse detection process was also applied to extract a signature of the bearing cage fault from the power spectral densities of the synchronously sampled current signals during the entire 25-hour experiment.

Figure 20:
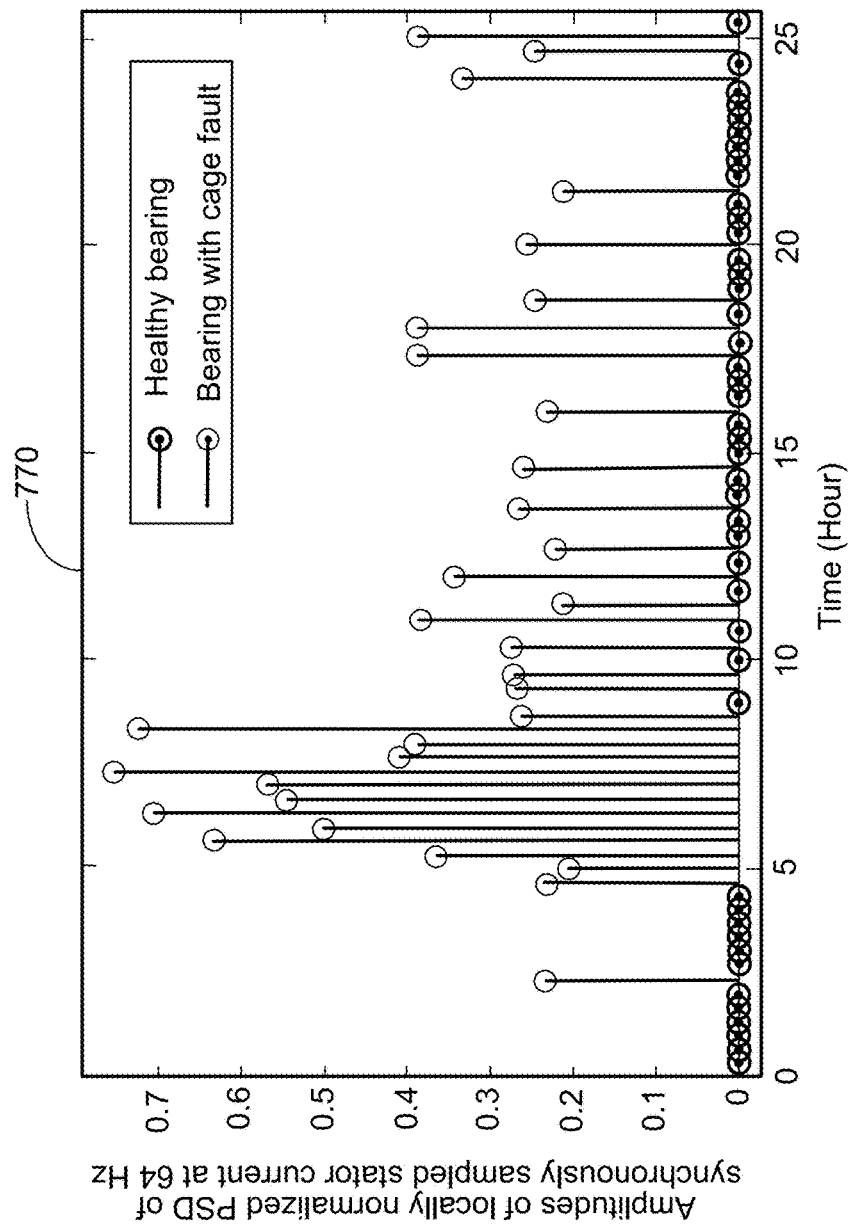
FIG. 20 is a graph that shows exemplary amplitudes of the locally normalized power spectral densities of the synchronously sampled stator current records at a bearing cage fault characteristic frequency of 64 Hz during the 25-hour experiment.

Referring to FIG. 20, a graph 770 shows amplitudes of the locally normalized power spectral densities of the synchronously sampled stator current records at a bearing cage fault characteristic frequency of 63.9 Hz, which is rounded up to 64 Hz in the caption of the vertical axis of FIG. 20, during the 25-hour experiment. The signature is the amplitude at 63.9 Hz (i.e., one of the bearing cage fault characteristic frequencies) of the locally normalized power spectral density of each synchronously sampled current record. The graph 770 shows that the signature of the bearing cage fault firstly appeared at the $2.5^{th}$ hour, and then disappeared, and then continuously appeared from the $5^{th}$ hour to the $8^{th}$ hour of the experiment. This result indicates a significant degradation of the bearing cage and maintenance should be taken immediately after the $5^{th}$ hour of the experiment. From the $8^{th}$ hour until the end of the experiment, the wearing of the broken cage mitigated the amplitude of the excitation at 63.9 Hz. As a result, the excitations at 63.9 Hz of some current records were occasionally below the threshold and could not be detected. Since there was no maintenance taken during the experiment, the bearing was damaged and the wind turbine stopped at the $25^{th}$ hour of the experiment by the protection system. This result demonstrates that the fault detection method described above, which includes the synchronous sampling and impulse detection processes, is effective for online monitoring the wind turbine health condition, detecting the wind turbine fault, and determining when maintenance is require.

A current-based online fault detection method has been described. The fault detection process includes a novel computationally efficient, high-resolution, wide-band, synchronous sampling process and an impulse detection process, and can be used to detect faults in variable-speed direct-drive wind turbines. The fault detection process converts the variable characteristic frequencies of wind turbine faults in the generator current signals to constant values via the synchronous sampling process, which in some implementations does not require additional hardware to implement. The impulse detection process extracts wind turbine fault signatures from the power spectral density spectra of the synchronously sampled generator current signals. This method has a high resolution in the frequency domain and, therefore, is effective in extracting the frequency-domain signatures of a wind turbine fault from current signals which may have a low signal-to-noise ratio. This method also has a low computational cost, needs low memory space, and has a high accuracy and a high frequency bandwidth for fault detection. The method has been validated by experimental studies for detecting a rotor eccentricity fault and a bearing cage fault of a direct-drive wind turbine operating with variable shaft rotating frequencies in a wind tunnel.

Gear Fault Detection

Gearbox faults constitute a significant portion of all faults and downtime in wind turbines. Gearbox fault detection using the electrical signals acquired from generator terminals has significant advantages over traditional vibration-based techniques in terms of cost, implementation and reliability. The following describes the principle of using the stator current signals of a generator for fault detection of a multi-stage gearbox connected to the generator. Based on the analysis, the characteristic frequencies of gearbox faults in the frequency spectra of the generator stator currents are identified. A process for detecting gear fault in the gearbox is provided. The process includes an adaptive signal resampling process to convert the varying fault characteristic frequencies in the stator current signals to constant values for the gearbox running in varying speed conditions, a frequency spectrum statistical analysis-based process to extract the fault features from the frequency spectra of the resampled stator current signals, and a fault detection process to detect the faults based on the fault features extracted. Experimental results on a two-stage gearbox connected to an electric generator are provided to show the effectiveness of the analysis and method for detection of a variety of gear faults in the gearbox.

The common gear faults include, e.g., tooth breakage, crack, and surface wear, which may be caused by factors such as fatigue, cyclic bending stresses beyond the physical limits of the materials, heavy wear accumulated over time, and sudden shock overload transmitted from the rotor. A gear fault may lead to performance degradation of the wind turbine drivetrain and may cause a catastrophic failure of the gearbox or even failures of other components in the wind turbine drivetrain. Thus, it is useful to detect gear faults in time and repair the faulted gearbox in a timely manner to reduce the downtime and prevent catastrophic damages of the wind turbine.

The characteristic frequencies of the faults in a gearbox may be present in current signals even when the gearbox is in a healthy condition (e.g., due to inherent gear eccentricities). The faults may change the magnitudes or distributions of the characteristic frequency components. The following describes a current-based method for detection of gear faults in variable-speed wind turbine gearboxes. The principle of using current signals measured from the stator terminals of an electric machine connected to a multistage gearbox for the fault detection of the gearbox is analyzed. Based on the analysis, the characteristic frequencies of gear faults in the frequency spectra of the current signals are identified. The fault characteristic frequencies depend on the shaft rotating frequencies of the gearbox, which may vary in wind turbine applications.

The fault detection process includes an adaptive signal resampling process for signal conditioning, a fault feature extraction process, and a fault detection process. The adaptive signal resampling process converts the varying characteristic frequencies of gearbox faults to constant values in the frequency spectra of the current signals. Then, in the feature extraction process, a frequency analysis technique, such as the Fast Fourier transform (FFT), can be applied to the resampled current signals to generate their frequency spectra, from which the amplitudes of the fault characteristic frequency components can be extracted. The fault features, called the normalized power differences (NPDs), are then generated by using statistical analysis on the extracted amplitudes of the fault characteristic frequency components. The fault detector is then developed to detect the gear faults by comparing the standard deviation (STD) of the normalized power differences against a pre-determined threshold. Experimental studies are carried out on an emulated wind turbine drivetrain that includes a two-stage gearbox connected with an electric generator to validate the analysis and fault detection method for various gear faults in the gearbox operating with time-varying shaft speeds.

Characteristic Frequencies of Gear Faults in Frequency Spectra of Machine Stator Currents In some implementations, a multistage gearbox is used in the drivetrain of an indirect drive wind turbine to transmit the power captured from wind by the wind turbine rotor blades from a low-speed turbine rotor to a high-speed generator. The generator then converts the captured wind power into electricity.

Due to the torsional vibrations induced by transmission errors in the gears and the stiffness variation of the gear teeth contact, the rotation of a gearbox adds the rotational and meshing frequency components into the torque signature of the output shaft. The characteristic frequencies of torsional vibrations caused by the gearbox rotation include the shaft rotating frequencies $f_n$ (n=1,2, ..., N), where N is the number of shafts in the gearbox, and the gear meshing frequencies $f_{mesh,p}$ (p=1,2, ..., P), where P is the number of gear pairs meshing together.

The torsional vibrations in a gearbox may affect the stator currents of the electric machine connected to the gearbox. Since the shaft of the electric machine is connected to the output shaft of the gearbox, the torsional vibrations in the gearbox may cause oscillations of the air-gap torque of the electric machine. As a result, the air-gap torque T may include a constant component $T_0$ and some oscillatory components at the frequencies of $f_n$ and $f_{mesh,p}$ due to the torsional vibrations $$T(t) = T_0(t) + \sum_{n=1}^{N} T_n(t) \cdot \cos\left[\int 2\pi \cdot f_n(t) \cdot dt + \phi_n(t)\right] + \sum_{p=1}^{P} T_{mesh,p}(t) \cdot \cos\left[\int 2\pi \cdot f_{mesh,p}(t) \cdot dt + \phi_{mesh,p}(t)\right] \quad (74)$$

where $T_n$ and $T_{mesh,p}$ are the amplitudes, and $\phi_n$ and $\phi_{mesh,p}$ are the respective phases of the oscillatory components, respectively.

The oscillations of the air-gap torque (i.e., the torsional vibrations of the gearbox) will modulate the frequency and amplitude of the stator current signals of the electric machine connected to the gearbox. The fundamental frequency $f_{C1}$ of the modulated electric machine stator current signal can be expressed as:

$$f_{C1}(t) = f_s(t) + \sum_{n=1}^{N} A_{s,n}(t) \cdot \sin\left[\int 2\pi \cdot f_n(t) \cdot dt + \phi_n(t)\right] + \sum_{p=1}^{P} A_{smesh,p}(t) \cdot \sin\left[\int 2\pi \cdot f_{mesh,p}(t) \cdot dt + \phi_{mesh,p}(t)\right] \quad (75)$$

where $f_s$ is the fundamental frequency of the stator current when there is no torsional vibration; $A_{s,n}$ and $A_{smesh,p}$ are the amplitudes, and $\phi_n$ and $\phi_{mesh,p}$ are the respective phases of the oscillatory components caused by the torsional vibrations at the gearbox shaft rotating frequencies $f_n$ and gear meshing frequencies $f_{mesh,p}$ in the stator current fundamental frequency signal $f_{C1}(t)$, respectively.

The amplitude $I_{C1}$ of the fundamental frequency component of the modulated electric machine stator current signal can be expressed as:

$$I_{C1}(t) = I_s(t) + \sum_{n=1}^{N} A'_{s,n}(t) \cdot \sin\left[\int 2\pi \cdot f_n(t) \cdot dt + \phi'_n(t)\right] + \sum_{p=1}^{P} A'_{smesh,p}(t) \cdot \sin\left[\int 2\pi \cdot f_{mesh}(t) \cdot dt + \phi'_{mesh,p}(t)\right] \quad (76)$$

where $I_s$ is the amplitude of the fundamental frequency component of the stator current signal when there is no torsional vibration; $A'_{s,n}$ and $A'_{smesh,p}$ are the amplitudes, and $\phi'_n$ and $\phi'_{mesh,p}$ are the respective phases of the oscillatory components caused by the torsional vibrations at the gearbox shaft rotating frequencies $f_n$ and gear meshing frequencies $f_{mesh,p}$ in the amplitude signal $I_{C1}(t)$, respectively.

According to equations (75) and (76), the fundamental component of the modulated stator current, C(t), can be expressed as $$C(t) = I_{C1}(t) \cdot \sin\left[\int 2\pi \cdot f_{C1}(t) \cdot dt\right] \quad (77)$$

By expanding equation (77), the characteristic frequencies of the gearbox vibrations in the electric machine stator current, $f_{s\_gearbox}$, can be expressed as follows:

$$f_{s\_gearbox} = f_s \pm \sum_{n=1}^{N} k_n \times f_n \pm \sum_{p=1}^{P} j_p \times f_{mesh,p} \quad (78)$$

where $k_n$ (n=1,2, . . . , N) and $j_p$ (p=1,2, . . . , P) are non-negative integers, and at least one of the $k_n$ or $j_p$ is positive. The expression (78) indicates that the characteristic frequencies of the gearbox vibrations appear as sidebands across the fundamental frequency of the stator current signals of the electric machine connected to the gearbox. These sidebands will also appear around harmonics, which can be derived in a similar way.

The torsional vibrations caused by gearbox rotation may exist regardless whether the gearbox is in the healthy or faulty condition. A fault in the gearbox may change the amplitudes of the torsional vibrations of the gearbox, which subsequently may cause changes in the air-gap torque and the sidebands across the fundamental and harmonics of the electric machine stator currents. As a result, the fault may change the amplitudes of the vibrating frequency components in equation (77).

Gear Fault Detection Method

As described by equation (78), the characteristic frequencies of a gearbox fault in the frequency spectrum of a stator current signal of the electric machine connected to the gearbox are related to the gearbox shaft rotating frequencies. When the shaft rotating frequencies of the gearbox vary with time, both the characteristic frequencies of the gearbox fault in the stator current signal and the current signal itself (i.e., the frequency components of the current signal) become nonstationary. It is difficult to identify the nonstationary fault characteristic frequencies from the nonstationary stator current signal using conventional spectrum analysis methods, such as FFT. However, if the varying shaft rotating frequencies of the gearbox are converted to constant values, the characteristic frequencies of the gearbox fault will become constant, and the classical FFT will generate a stationary frequency spectrum of the stator current signal, from which the constant characteristic frequencies of the gearbox fault can be identified for fault detection of the gearbox rotating with varying frequencies.

Principles of Adaptive Signal Resampling

Figure 21:
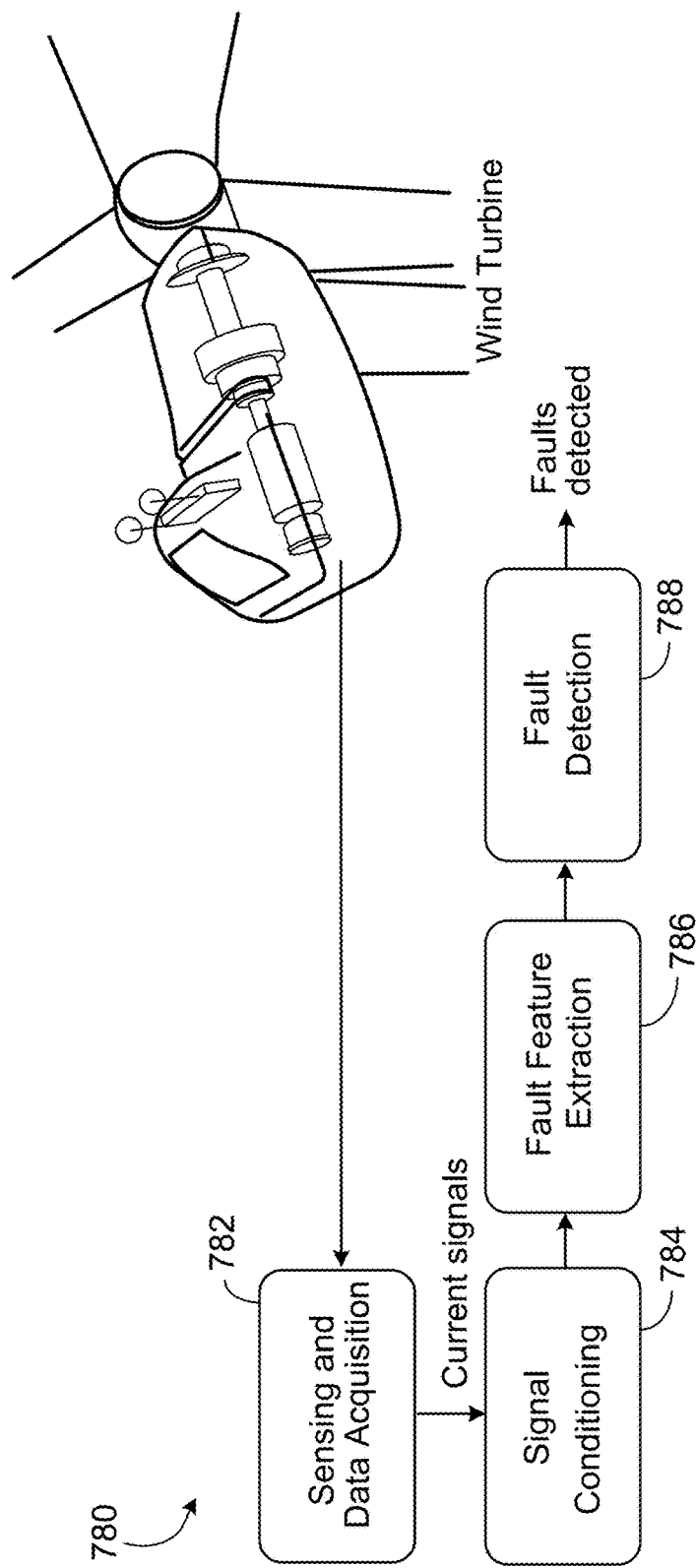
FIG. 21 is a diagram showing an exemplary fault detection process.

FIG. 21 is a diagram showing a fault detection process 780 that includes sensing and data acquisition 782, signal conditioning 784, fault feature extraction 786, and fault detection 788. Define $\Omega_r$ as the normalized frequency of a shaft rotating frequency $f_r$ of the gearbox, and $f_{SF}$ as the sampling rate of the original stator current signal. The relationship among $\Omega_r$, $f_r$ and $f_{SF}$ is as follows:

$$\frac{\Omega_r(t)}{2\pi} = \frac{f_r(t)}{f_{SF}} \quad (79)$$

The sampling rate $f_{SF}$ can be fixed during data acquisition. This makes the normalized frequency vary with time if $f_r$ is time-varying. In this document, $\Omega_r$ is expected to be constant to facilitate fault detection. To make the right-hand side of equation (79) constant, the prospective sampling rate $f_{SF}$ should be made proportional to the shaft rotating frequency $f_r$:

$$f_{SF} \propto f_r(t) \quad (80)$$

Accordingly, the prospective sampling interval $T_{SF}$ of the current signal needs to be proportional to the reciprocal of the shaft rotating frequency which is defined as $T_r$:

$$T_{SF} \propto T_r(t) \quad (81)$$

Suppose that the shaft rotating frequency changes linearly between any two consecutive samples of the original stator current signal with a constant sampling interval. In the discrete-time system, the time interval $T_r(n)$ between these two samples can be calculated as the reciprocal of the average shaft rotating frequency between the two samples. Therefore, the relationship between $T_{SF}(n)$ and $f_r(n)$ will be the following:

$$T_{SF}(n) \propto T_r(n) = \frac{2}{f_r(n) + f_r(n+1)} \quad (82)$$

For a stator current signal (i.e., time series) with N samples, there are a total of (N−1) time intervals of two consecutive sample pairs. To satisfy equation (82), the prospective sampling interval $T_{SF}(n)$ is calculated according to the ratio of the time interval $T_r(n)$ to the total time of the time series as follows:

$$T_{SF}(n) = \frac{(N-1)T_r(n)}{\sum_{k=1}^{N-1} T_r(k)} = \frac{(N-1)[f_r(k) + f_r(k+1)]^{-1}}{\sum_{k=1}^{N-1} [f_r(k) + f_r(k+1)]^{-1}} \quad (83)$$

In equation (83), both the terms (N−1) and $\Sigma_{k=1}^{N-1} T_r(k)$ have fixed values. Hence, the proportional relationship between $T_{SF}$ and $T_r$ in equation (82) is satisfied, and so is equation (80). Therefore, by adaptively resampling the original stator current signal (e.g., via interpolation) using a varying sampling interval $T_{SF}(n)$ calculated from equation (83), the objective of a constant $\Omega_r$ can be achieved for the resampled current signal to facilitate the subsequent fault detection.

In the adaptive resampling process, the varying sampling interval $T_{SF}(n)$ is adaptive to the shaft rotating frequency $f_r(n)$. However, errors are brought into the resampled current signals in each interpolation step from two sources. One error source is the interpolation itself. The other error source arises from the assumption that the shaft rotating frequency changes linearly between two consecutive samples, which is not always true in a real-world system. Therefore, a single-step interpolation may not be sufficient to convert $\Omega_r$ to a constant value. An iterative interpolation process may be required to continuously resample the current signal until $\Omega_r$ is sufficiently constant. This can be evaluated by a criterion designed for the specific application.

Adaptive Resampling Process

Figure 22:
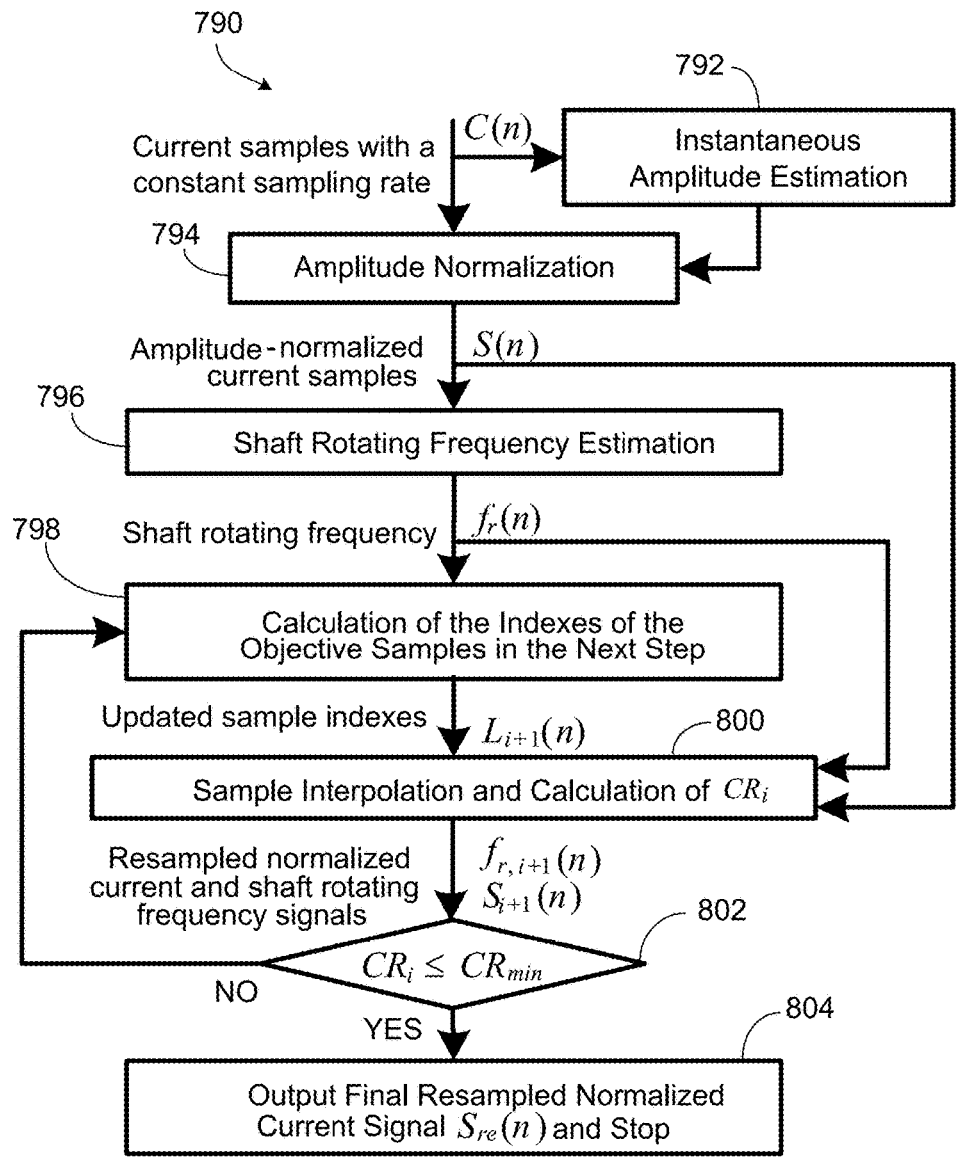
FIG. 22 is a flow diagram of an exemplary adaptive resampling process.

FIG. 22 shows a flow diagram of an exemplary adaptive resampling process 790, which includes the following steps.

(1) Collect the acquired nonstationary electric machine stator current signal with a constant sampling rate C(n), where n=1,2,3, . . . , N and N is the number of the stator current samples.

(2) Calculate the instantaneous amplitudes A(n) of the current samples using the Hilbert transform, $$A(n) = \sqrt{[C(n)]^2 + \{H[C(n)]\}^2} \quad (84)$$

where H(·) denotes the Hilbert transform of the signal (792).

(3) Normalize the stator current samples with respect to their instantaneous amplitudes A(n), and the result is s(n) (794).

$$S(n) = C(n)/A(n) \quad (85)$$

The normalization of the current samples removes the dependence of the method on the load condition of the gearbox. The instantaneous amplitudes of the current samples calculated from the Hilbert transform can also be used for the calculation of the instantaneous load of the electric machine.

(4) Estimate the rotating frequency $f_r(n)$ of the electric machine shaft (i.e., gearbox output shaft) from the normalized current samples s(n) by using a phase-locked loop (PLL) method (796).

(5) Define $L_i(n)$ the indexes of the samples $f_{r,i}(n)$ and $S_i(n)$, where I=0,1,2, . . . is the iteration number of the recursive resampling process. Initially, i=0, $L_0(n)=n$, $f_{r,0}(n) = f_r(n)$, and $s_0(n)=s(n)$.

(6) Calculate the sampling interval between two consecutive current samples $s_i(n-1)$ and $s_i(n)$ as $T_i(n)=2[f_{r,i}(n-1)+f_{r,i}(n)]^{-1}$, where i=0,1,2, . . . and n=2,3, . . . , N. Therefore, the total sampling time of the current signal is $\Sigma_{n=1}^{N} T_i(n)$.

(7) Calculate the indexes of the objective samples $f_{r,i+1}(n)$ and $s_{i+1}(n)$ in the (i+1)th iteration based on the ratio of the sampling interval between two consecutive samples to the total sampling time of the signal in the ith iteration, as follows:

$$L_{i+1}(1) = 1 \quad (86)$$

$$L_{i+1}(n+1) = L_{i+1}(n) + \frac{(N-1) \cdot [f_{r,i}(n) + f_{r,i}(n+1)]^{-1}}{\sum\limits_{k=1}^{N} [f_{r,i}(k) + f_{r,i}(k+1)]^{-1}}$$

for $2 \leq n \leq (N-1)$ (798).

(8) Interpolate the samples $f_{r,i}(n)$ and $S_i(n)$ using the cubic spline interpolation method based on the updated indexes $L_{i+1}(n)$ to obtain the objective samples $f_{r,i+1}(n)$ and $S_{i+1}(n)$, respectively (800).

(9) Repeat (6) to (8) until $CR_i = \Sigma_{n=1}^{N} |L_i(n) - L_{i+1}(n)| \leq CR_{min}$, where $CR_{min}$ is a predetermined small threshold. It means no significant improvement can be made by further resampling the signal (802). Then stop the recursion.

(10) Obtain the final resampled normalized current signal $$s_{re}(n) = s_{i+1}(n),$$

where n=1,2,3, . . . , N (804).

By using the process described above, the varying shaft frequencies of the gearbox are converted to constant values. Consequently, the varying fundamental frequency of the stator current signal and the varying characteristic frequencies of the gearbox fault become constant values in the frequency spectrum of $s_{re}(n)$.

Alternative Resampling Process

Instead using the adaptive resampling process shown in FIG. 22, it is also possible to use the resampling process described in connection with FIGS. 7-9, using equations (47) to (60).

Fault Feature Extraction Process

Since the characteristic frequencies of gearbox faults become constant in the resampled normalized current signals, the FFT can be applied to generate the frequency spectra, such as the power spectral density, of the resampled normalized current signals. Then the magnitudes of the fault characteristic frequency components can be extracted from the power spectral density spectra of the resampled normalized current signals.

The powers of the six vibrating frequency components (i.e., the sidebands), $$M_{f_s \pm f_i} \; (i=1 \ldots N),$$

across the fundamental frequency described by equation (78) in the power spectral density spectrum of the resampled normalized current signal are first normalized using equation (87) below:

$$M'_{f_s \pm f_i} = \frac{M_{f_s \pm f_i}}{\sum M_{f_s \pm f_i}} \quad (87)$$

Then the summation $M_i$ of the normalized powers of each pair of the frequency components at $f_s \pm f_i$ is calculated for the resampled normalized current signal by equation (88) below:

$$M_i = M'_{f_s - f_i} + M'_{f_s + f_i} \quad (88)$$

Finally, a fault feature is defined in equation (89) below using the normalized power differences (NPDs) of the N pairs of vibrating (i.e., fault characteristic) frequency components between the current time step and the baseline case when the gearbox is new or in the healthy condition for gear fault detection.

$$NPD_i = M_i - M_{i,baseline} \quad (89)$$

where i=1, 2, . . . , N; $M_{i,baseline}$ are the mean normalized powers at the current time step and in the baseline case, respectively. If the gearbox is in the healthy condition, all of the normalized power difference values will be close to zero.

Fault Detection Process

Gear faults may change the amplitudes of different characteristic frequency components in gearbox vibration signals differently, and subsequently change the amplitudes of different characteristic frequency components in the electric machine stator current signals differently. As a result, the absolute values of the normalized power differences defined by equation (89) at different fault characteristic frequencies $f_s \pm f_i$ (i=1,2, . . . ,) in the current signals may no longer be close to zero. Therefore, the gear faults can be detected by investigating the variations of the normalized power differences at different fault characteristic frequencies. In this document, the standard deviation defined in equation (90) below is used to quantify the changes of the normalized power differences.

$$STD = \sqrt{\frac{1}{N-1}\sum_{i=1}^{N}(NPD_i - \overline{NPD})^2} \qquad (90)$$

where $\overline{NPD}$ is the mean value of normalized power differences. For a faulty case, the standard deviation of the normalized power differences is larger than zero. For a healthy case, the standard deviation of the normalized power differences is close to zero. In some implementations, a small threshold σ is established to consider the measurement noise. If the standard deviation of the normalized power differences is greater than σ, it indicates the occurrence of a fault in the gearbox. Otherwise, if the standard deviation of the normalized power differences is equal to or smaller than σ, the gears in the gearbox are considered healthy. The value of σ for a specific wind turbine can be determined from the measurements when the wind turbine is in the healthy condition, e.g., during the period of the field test after the wind turbine was installed. In this case, multiple standard deviations of the normalized power differences can be calculated from multiple sets of measurements. Then the average value of the standard deviations can be used as the threshold σ.

Experimental System

To validate the method for detection of gear faults in wind turbine gearboxes, an emulated wind turbine drivetrain that includes a two-stage gearbox connected with an electric machine is studied. The experimental system includes a 300-W electric generator used in an Extractor wind turbine driven by an adjustable-speed induction motor drive through two back-to-back connected Siemens gearboxes, which are two-stage helical gearboxes with a total gear ratio of 10.57. One gearbox (i.e., the speed reducer) reduces the shaft speed of the induction motor. The induction motor drive and speed reducer are used to emulate the dynamics of the rotor of a wind turbine. The second gearbox (i.e., the test gearbox) is used to emulate the gearbox in a wind turbine.

Figure 23:
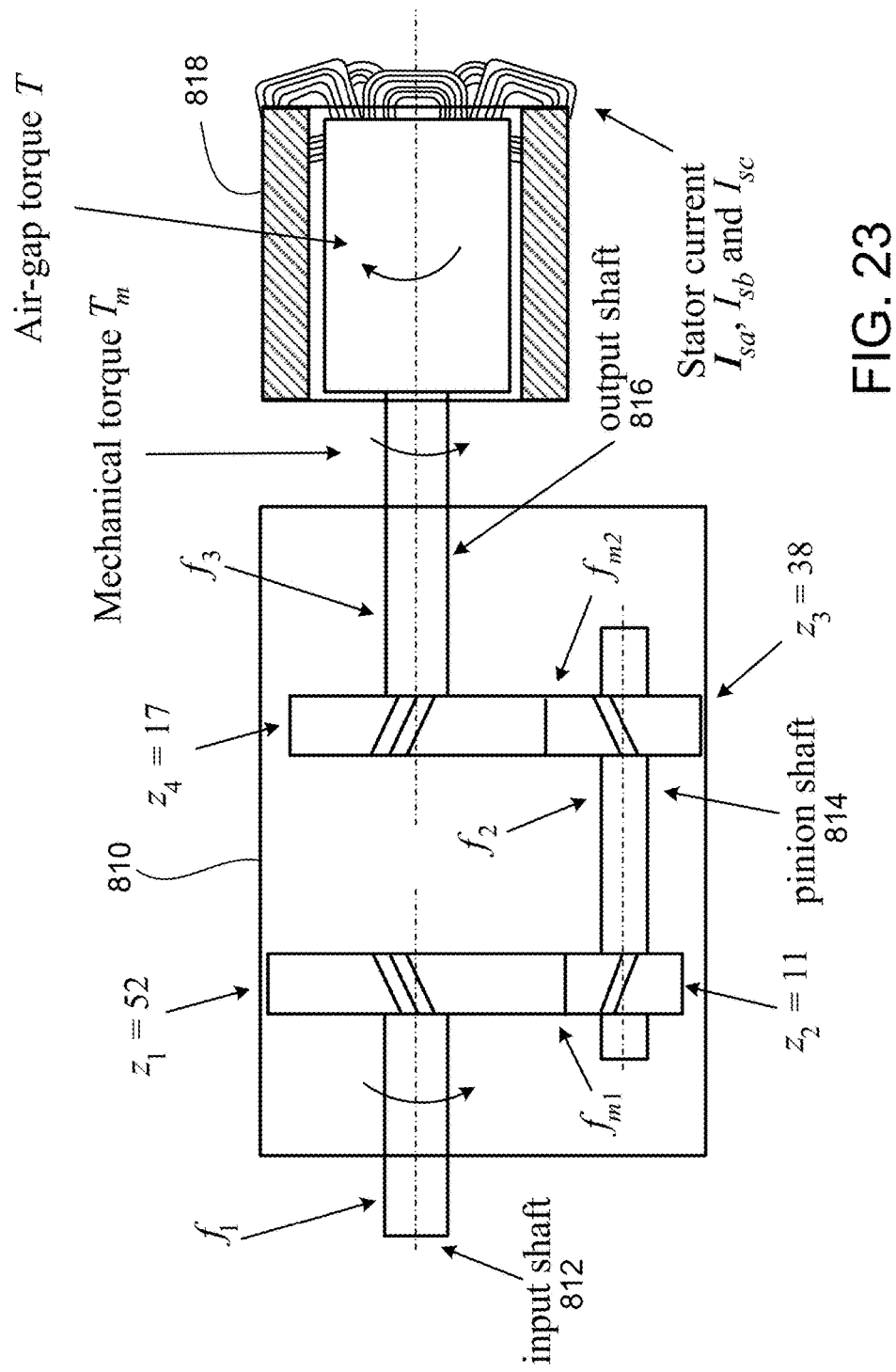
FIG. 23 is a diagram of an exemplary two-stage gearbox connected to an electric machine.

FIG. 23 is a diagram of a two-stage gearbox 810 connected to an electric machine 818, in which the internal mechanical structure of the gearbox 810 is shown. The characteristic frequencies of the gearbox vibrations include the input shaft 812 rotating frequency $f_1$, the pinion shaft 814 rotating frequency $f_2$, the output shaft 816 rotating frequency $f_3$, and the gear meshing frequencies and $f_{mesh,1}$ and $f_{mesh,2}$. $z_1$, $z_2$, $z_3$ and $z_4$ are the tooth numbers of the four gears in the gearbox. Based on equation (78), the characteristic frequencies related to gearbox vibrations in an electric machine stator current signal can be predicated as follows:

$$f_{s\_gearbox} = f_s \pm \sum_{n=1}^{3} k_n \times f_n \pm \sum_{p=1}^{2} j_p \times f_{mesh,p} \qquad (91)$$

The test gears are mounted at the input shaft of the test gearbox and pretreated artificially to generate various faults which are commonly observed in industrial systems. FIGS. 24A to 24D show the various types of faults, including (a) one-tooth breakage 820, (b) two-teeth breakage 822, (c) gear crack 824, and (d) gear surface wear at various degrees (5%, 20% and 60%), respectively.

Experimental Results

The fault detection method is applied for detection of the gear faults in the test gearbox operated in varying-speed conditions, where the rotating speed of the electric machine input shaft (i.e., the output shaft of the gearbox) is randomly varied in the range of 297 to 891 rpm. Each speed condition lasts for 8 seconds. The period of 8 seconds is chosen to simulate the wind turbine operation in the natural environment.

If the classic FFT is directly applied to the recorded stator current samples, no specific characteristic frequencies of the gearbox are observable in the power spectral density spectrum.

Figure 25:
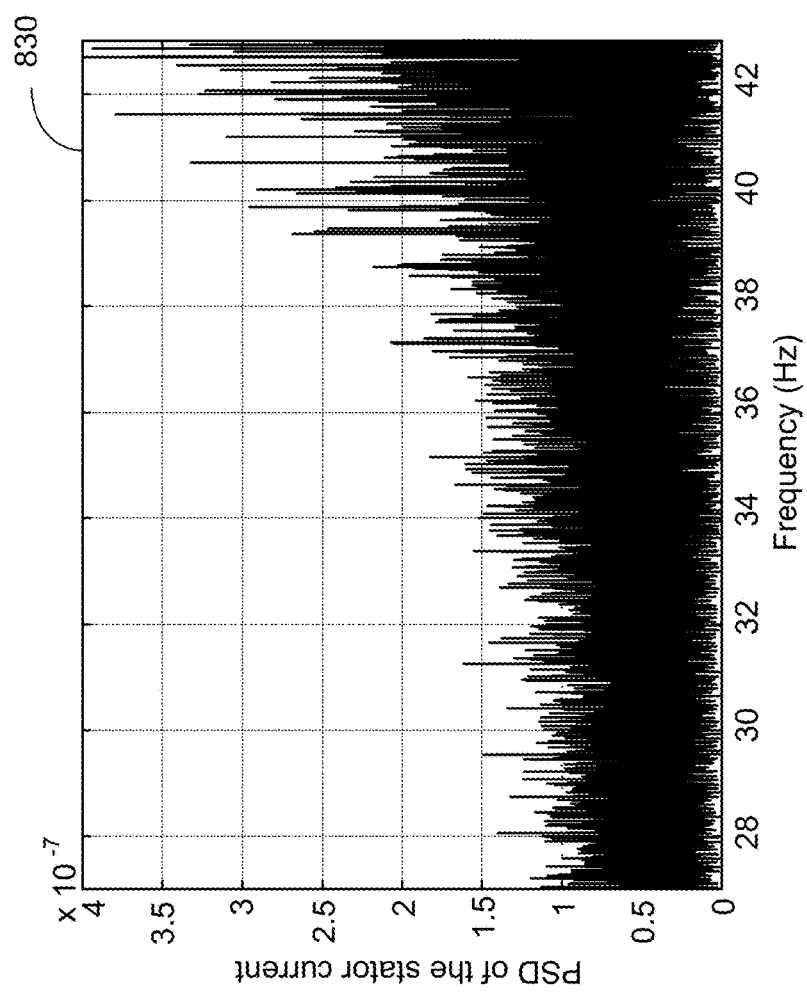
FIG. 25 is a graph showing an exemplary power spectral density spectrum of the nonstationary stator current signal obtained directly from the classical FFT analysis.

Referring to FIG. 25, a graph 830 shows the power spectral density spectrum of the nonstationary stator current signal obtained directly from classical FFT analysis. From the graph 830, no fault signatures can be extracted from the nonstationary stator current signal caused by the varying shaft rotating frequencies using the classical FFT analysis.

In order to detect fault signatures, the adaptive signal resampling process described above is applied to the recorded stator current signals to facilitate the fault feature extraction under variable-speed conditions.

Figure 26:
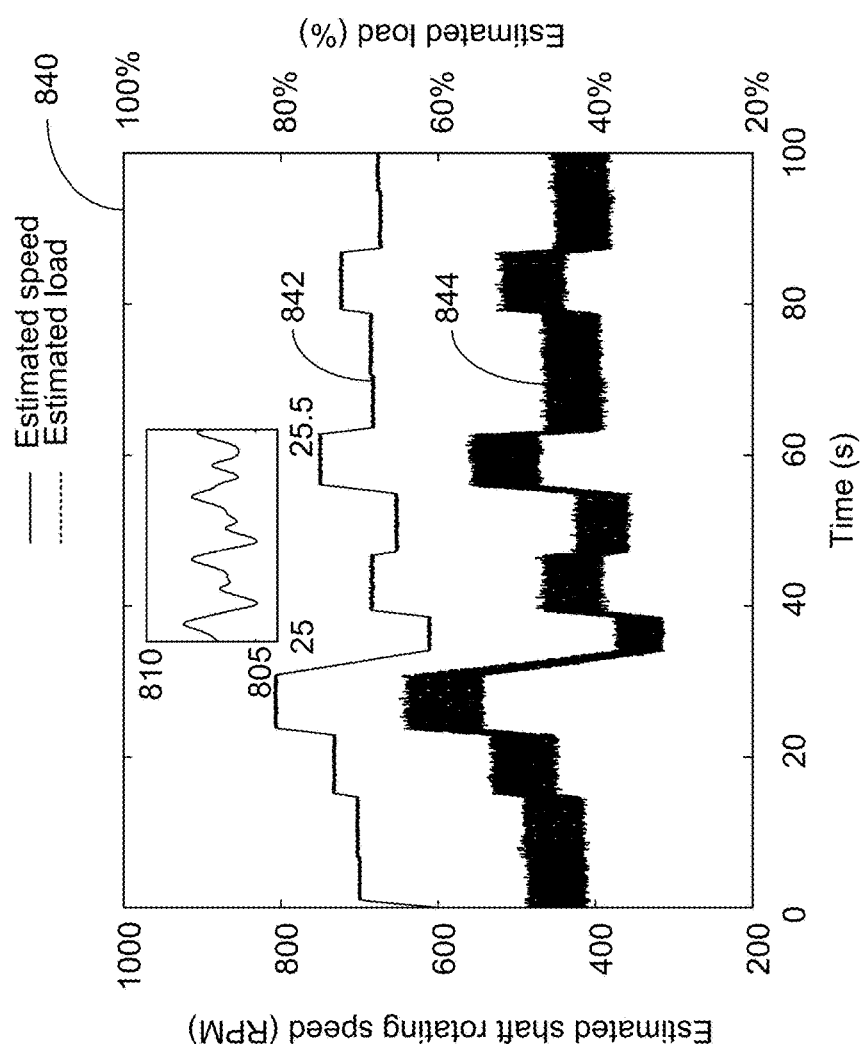
FIG. 26 is a graph that includes exemplary data about the shaft rotating speed of the electric machine and the instantaneous load of the machine.

Referring to FIG. 26, a graph 840 includes a curve 842 representing the shaft rotating speed of the electric machine, estimated by using a phase-locked loop (PLL) method, and a curve 844 representing the instantaneous load of the machine calculated by using the Hilbert transform. The curves 842 and 844 indicate the variation of the nonstationary operation condition of the system. Fluctuations around an average value are observed in the load curve, even in the periods of constant speeds. The load connected to the electric machine is purely resistive and, therefore, is proportional to the rotating speed. Since the speed fluctuations exist due to the torsional vibrations, even when the designated operating speed is constant, the load fluctuations are observed and amplified from the speed fluctuations.

The fault features are then extracted from the resampled normalized stator current signal by using the process described above. The classical FFT method is used to generate the power spectral density for the resampled normalized stator current signal in each case, as shown in FIGS. 27A to 27G. The characteristic frequencies of the gearbox in the stator current described by equation (91), including the fundamental frequency and its sidebands, can be observed in FIGS. 27A to 27G, where only the sidebands at $f_s \pm f_1$, $f_s \pm f_2$ and $f_s \pm f_2$ are considered because their magnitudes are most significant among all sidebands described by equation (91).

Referring to FIGS. 27A to 27G, graphs 850, 852, 854, 856, 858, 860, and 862 show the power spectral density spectra of the resampled normalized stator current signal showing the fundamental frequency component and its sidebands for the test system in varying-speed conditions for (a) the healthy case, (b) one-tooth breakage, (c) two-teeth breakage, (d) gear crack, (e) 5% surface wear, (f) 20% surface wear, and (g) 60% surface wear, respectively.

Figure 27A:
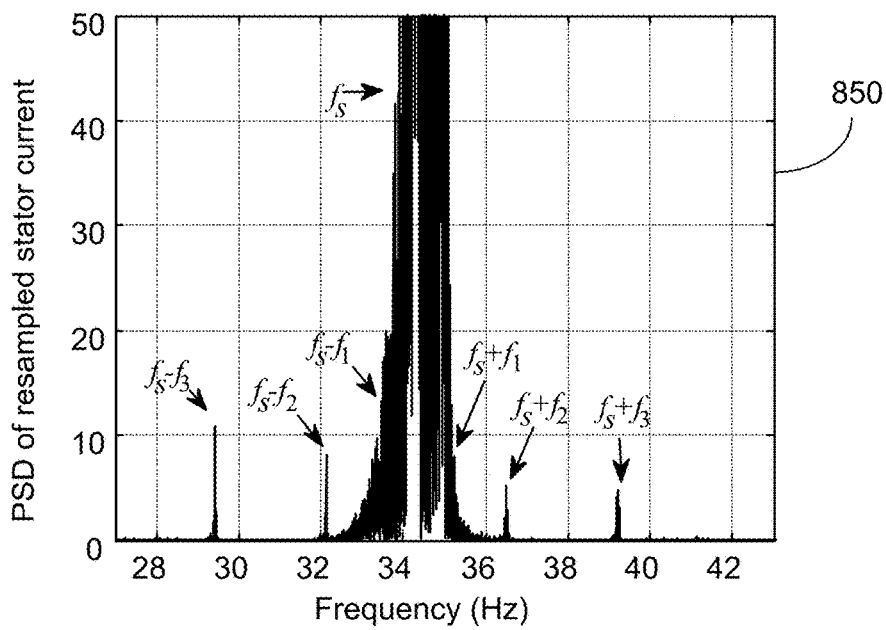
FIGS. 27A to 27G are graphs that show exemplary power spectral density spectra of the synchronously resampled normalized stator current signal, including the fundamental frequency component and its sidebands for the test system in varying-speed conditions for (a) the healthy case, (b) one-tooth breakage, (c) two-teeth breakage, (d) gear crack, (e) 5% surface wear, (f) 20% surface wear, and (g) 60% surface wear.
Figure 27B:
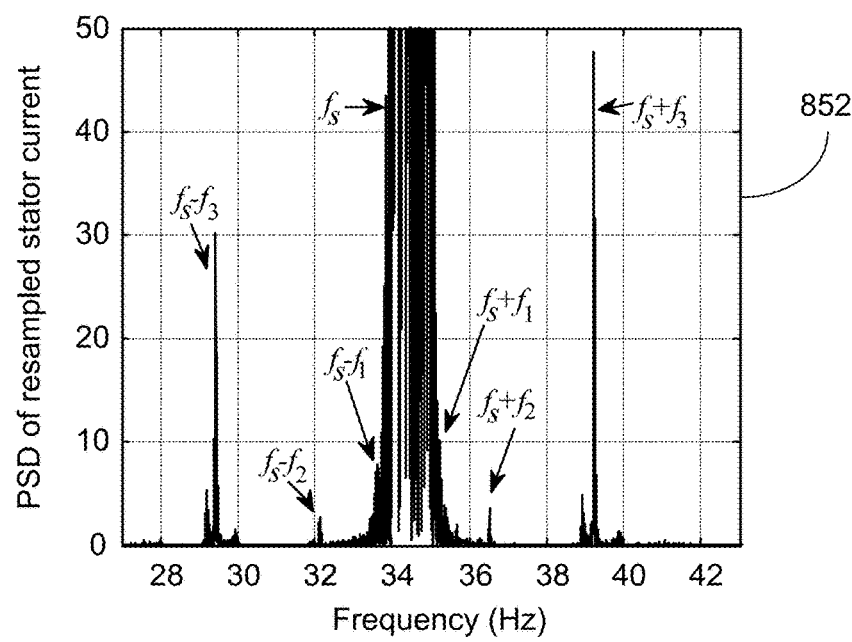
Figure 27C:
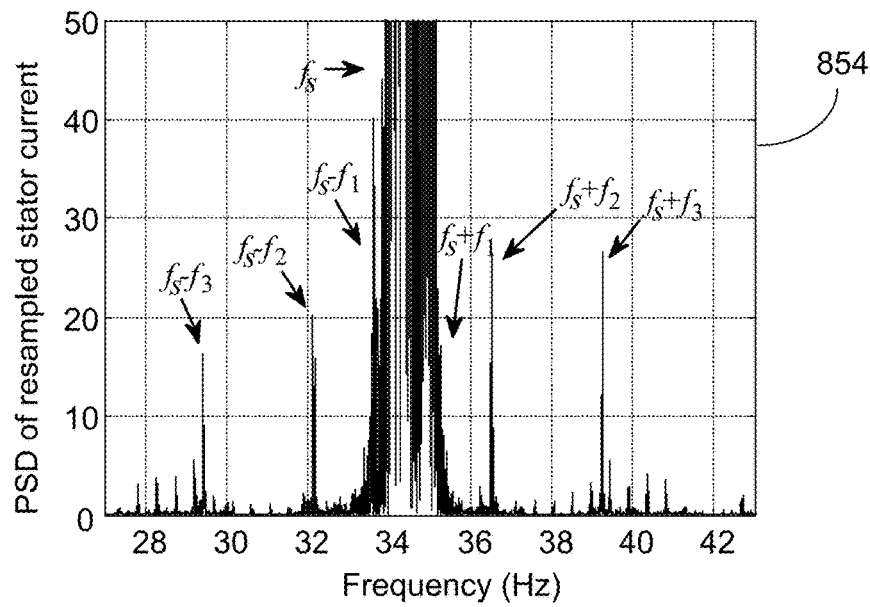
Figure 27D:
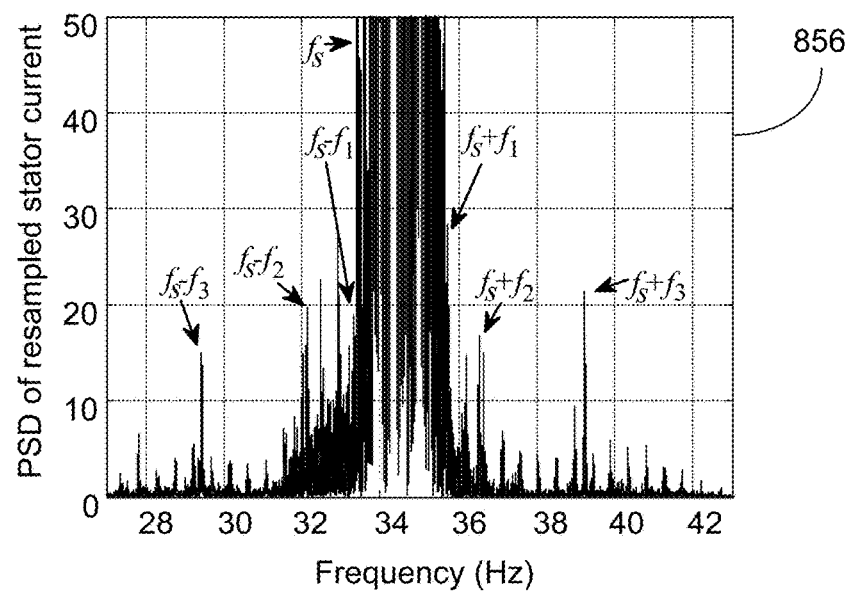
Figure 27E:
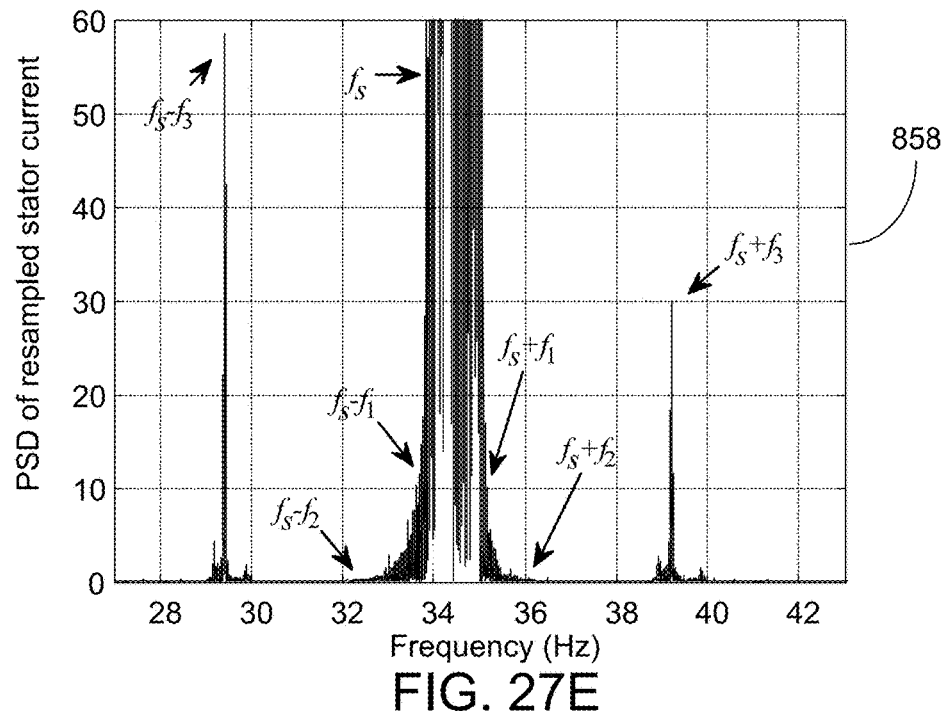
Figure 27F:
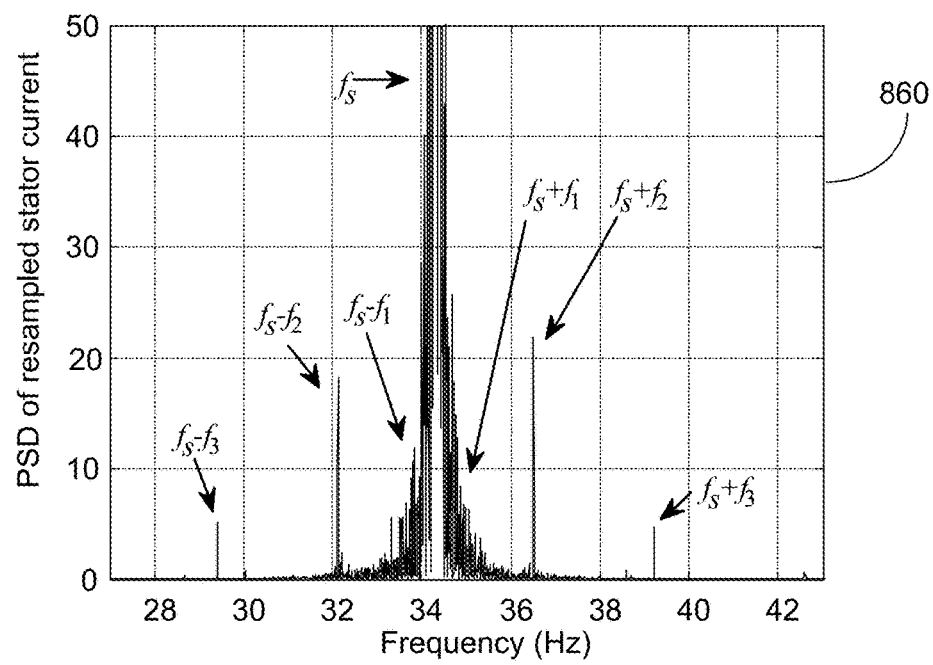

In FIG. 27A, the graph 850 shows that the sidebands caused by the torsional vibrations of the gearbox appear in the current power spectral density spectrum even when the gearbox is in the healthy condition. Compared to FIG. 27A, the current power spectral density spectra in various gear fault cases in FIGS. 27B to 27G indicate that each gear fault has altered the magnitudes and the magnitude distribution of the sidebands across the fundamental frequency. However, different gear faults have changed the magnitude distribution of the sidebands differently. In most gear fault cases shown in FIGS. 27B to 27F, an increase of the magnitudes is observed at one or more pairs of the sidebands. Such changes in the magnitudes and magnitude distribution of the sidebands can be used as the indicators of the faults.

Figure 27G:
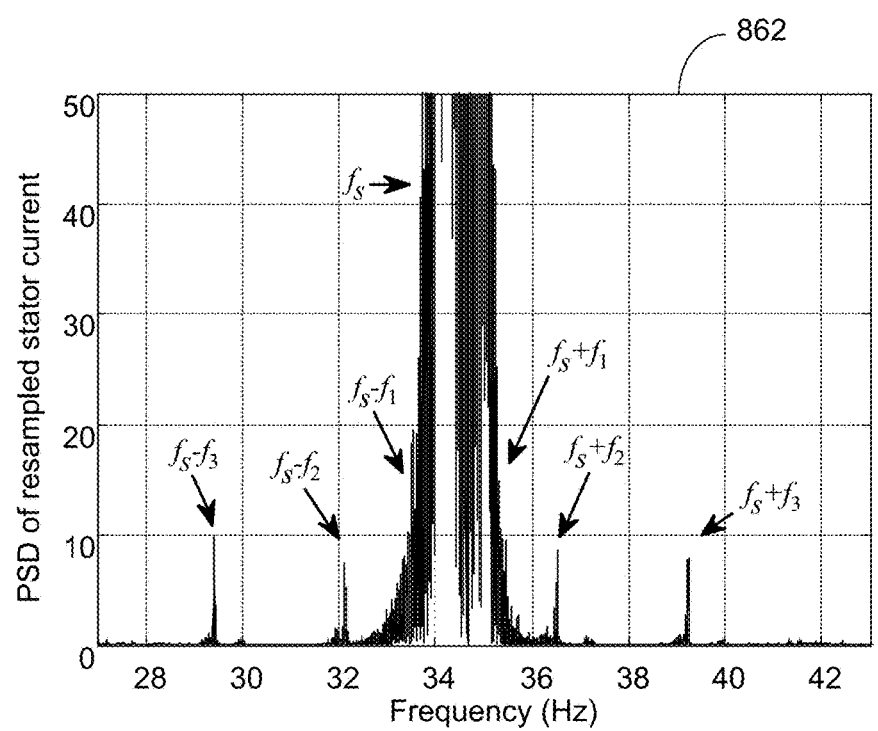

However, compared to the healthy case in FIG. 27A, the changes of the magnitudes of the sidebands are not obvious in the 60% gear surface wear case shown in FIG. 27G. In this example, it may be difficult to detect the 60% gear surface wear by directly observing the magnitudes of the sidebands.

By using the resampled normalized stator current signals, the amplitudes of the fault characteristic frequency components, and consequently the fault features extracted, are independent of the variations of the load and shaft rotating speed (i.e., operating condition) of the gearbox. Therefore, it is effective to compare the magnitudes of the sidebands for fault detection even when the gearbox is operated in varying speed and load conditions.

Automatic fault detection is desired for wind turbines. In this document, the normalized power differences defined in equations (87) to (89) are used as the statistical fault features to quantify the changes in the sidebands in various gear fault cases from the healthy case. The standard deviations of the normalized power differences are then calculated to quantify the variations of the normalized power differences statistically for the detection of various gear faults. Table I below lists the standard deviations of the normalized power differences for the six gear faults. The threshold CI of the fault detector is determined using the historical data when the gearbox is in the healthy condition and the value is 0.10. All the standard deviations of the normalized power differences in Table I exceed the threshold. The results show that all of the gear faults are successfully detected by using the fault detection process described above.

TABLE I

THE STDS OF THE NPDS FOR DIFFERENT GEAR FAULTS

| One-tooth break | Two-teeth break | Gear crack | 5% wear | 20% wear | 60% wear |
|---|---|---|---|---|---|
| 0.258 | 0.287 | 0.703 | 0.465 | 0.514 | 0.132 |

A current-based fault detection process, which includes an adaptive signal resampling process for signal conditioning, a fault feature extraction process, and a fault detection process has been described for gear fault detection of the gearboxes in variable-speed wind turbines. The adaptive signal resampling process converts the time-varying characteristic frequencies of gearbox faults to constant values in the frequency spectra of the nonstationary current signals. The fault feature extraction process extracts the features of gearbox faults, e.g., normalized power differences, from the FFT-based power spectral densities of the adaptively resampled current signals. The fault detection process detects the gear faults by comparing the standard deviations of the normalized power differences against a fault threshold. The current-based fault detection process has been validated by experimental studies for detecting a variety of gear faults, including one-tooth breakage, two-teeth breakage, gear crack, 5% gear surface wear, 20% gear surface wear, and 60% gear surface wear, in a two-stage gearbox used in an emulated wind turbine drivetrain operating with time-varying shaft speeds.

In certain implementations, a generic computing system can be used for the operations described in association with any of the computer-implement methods, controllers, or systems described previously, including calculations of one or more of equations (1) to (91). The generic computing system can include a processor, a memory, a storage device, and an input/output device, for example. Each of the processor, memory, storage device, and/or input/output device can be interconnected using a system bus. The processor is capable of processing instructions for execution within the generic computing system. In one implementation, the processor is a single-threaded processor. In another implementation, the processor is a multi-threaded processor. The processor is capable of processing instructions stored in the memory or on the storage device to display graphical information for a user interface on the input/output device.

The memory stores information within the generic computing system. In one implementation, the memory is a computer-readable medium. In one implementation, the memory is a volatile memory unit. In another implementation, the memory is a non-volatile memory unit.

The storage device is capable of providing mass storage for the generic computing system. In one implementation, the storage device is a computer-readable medium. In various different implementations, the storage device may be a floppy disk device, a hard disk device, an optical disk device, or a tape device.

The input/output device provides input/output operations for the generic computing system. In one implementation, the input/output device includes a keyboard and/or pointing device. In another implementation, the input/output device includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; cloud-based memory devices and disks, magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A computer program (also known as a program, software, software application, script, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the systems, devices, methods and techniques described here. For example, the current-based fault detection process described above can be used to detect faults in various types of turbine generators, such as a hydro turbine generator, a steam turbine generator, or a gas turbine generator. The current-based gear fault detection process described above can be used to detect faults in gears of gearboxes connected to various types of turbine generators, such as the hydro turbine generator, the steam turbine generator, or the gas turbine generator. The current-based fault detection process described above can be used to detect additional types of faults other than those described above.

Various forms of the flows shown above may be used, with steps re-ordered, added, or removed. It will be appreciated that any appropriate time interval may be used to make the determinations described above, and that the determinations may be made using any appropriate number of data points within the time interval. Accordingly, other implementations are within the scope of the following claims.

What is claimed is:

1. A method for detecting turbine generator faults, the method comprising:

receiving a current signal having a varying fundamental frequency from a turbine generator;

synchronously sampling the current signal to obtain a set of current signal samples that are evenly spaced in the phase domain, in which the synchronous sampling of the current signal comprises sampling the current signal according to a first set of sampling times to generate a first set of sampled current data that are not evenly spaced in the phase domain, and re-sampling the current signal based on information derived from the first set of sampled current data to obtain the set of current signal samples that are evenly spaced in the phase domain;

generating, using one or more data processors, a frequency spectrum of the set of current signal samples;

identifying, using the one or more data processors, one or more excitations in the frequency spectrum; and detecting, using the one or more data processors, a fault in the turbine generator based on the one or more excitations in the frequency spectrum.

2. The method of claim 1 in which detecting a fault in the turbine generator comprises detecting an excitation at a characteristic frequency that corresponds to a known type of turbine generator fault.

3. The method of claim 1, further comprising locally normalizing the frequency spectrum of the current signal samples, using a median filter to calculate median locally normalized values of the frequency spectrum, and based on the median values, determining a threshold for detecting excitations in the frequency spectrum.

4. The method of claim 1 in which synchronously sampling the current signal to obtain a set of current signal samples that are evenly spaced in the phase domain comprises:

determining instantaneous phases of the first set of current signal samples or current signal samples derived from the first set of current signal samples, based on the instantaneous phases, calculating a second set of sampling times that correspond to phases of the current signal in which the phase intervals of adjacent samples are constant, and re-sampling the current signal according to the second set of sampling times to generate the set of current signal samples that are evenly spaced in the phase domain.

5. The method of claim 4 in which receiving a current signal from a turbine generator comprises receiving an analog or digital current signal from the turbine generator, and re-sampling the current signal comprises re-sampling the analog or digital current signal according to the second set of sampling times.

6. The method of claim 4 in which re-sampling the current signal comprises calculating interpolated current signal amplitudes according to the second set of sampling times.

7. The method of claim 1 in which synchronously sampling the current signal comprises:

applying a forward-backward filter and a Hilbert transform to determine amplitudes of normalized current signal, and determining instantaneous phases of the current signal based on the amplitudes of the normalized current signal, and wherein re-sampling the current signal comprises re-sampling the current signal based on information derived from the instantaneous phases to obtain the set of current signal samples that are evenly spaced in the phase domain.

8. The method of claim 1, comprising comparing the frequency spectrum of the first set of current signal samples with a reference frequency spectrum, in which detecting a fault in the turbine generator comprises detecting a difference between the frequency spectrum of the first set of current signal samples and the reference frequency spectrum.

9. The method of claim 1, further comprising, in response to detecting a fault in the turbine generator, generating and transmitting an alert that indicates a turbine generator fault is detected.

10. The method of claim 1 in which receiving a current signal from a turbine generator comprises receiving a current signal from at least one of a wind turbine generator, a hydro turbine generator, a steam turbine generator, or a gas turbine generator.

11. The method of claim 1 in which the current signal comprises a nonstationary periodic signal wherein the fundamental frequency of the current signal varies over time.

12. The method of claim 11 in which the current signal comprises a nonstationary sinusoidal signal.

13. The method of claim 1, further comprising normalizing amplitudes of the one or more excitations in the frequency spectrum, calculating normalized power differences between normalized excitations determined at a current time and baseline normalized excitations, and calculating standard deviations of the normalized power differences, wherein detecting a fault in the turbine generator comprises detecting a fault in the turbine generator based on the standard deviations of the normalized power differences.

14. The method of claim 13, further comprising comparing the standard deviations of the normalized power differences with a threshold;

wherein detecting a fault in the turbine generator comprises detecting a fault in the turbine generator when the standard deviations of the normalized power differences is greater than the threshold.

15. The method of claim 13 in which detecting a fault in the turbine generator comprises detecting a gear fault in the turbine generator.

16. The method of claim 1 in which the re-sampling of the current signal comprises interpolating the first set of sampled current data to obtain the set of current signal samples that are evenly spaced in the phase domain.

17. A method comprising:

detecting a fault in a turbine generator using the method of claim 1; and repairing the turbine generator using information about the detected fault.

18. A controller configured to detect turbine generator faults, the controller having a processor that is configured to execute instructions to:

receive a current signal having a varying fundamental frequency from a turbine generator;

synchronously sample the current signal to obtain a set of current samples that are evenly spaced in phase, comprising sample the current signal according to a first set of sampling times to generate a first set of sampled current data that are not evenly spaced in phase, and re-sample the current signal based on information derived from the first set of sampled current data to obtain the set of current signal samples that are evenly spaced in phase;

generate a frequency spectrum of the current signal samples;

identify one or more excitations in the frequency spectrum; and detect a fault in the turbine generator based on the one or more excitations in the frequency spectrum.

19. The controller of claim 18 in which detecting a fault in the turbine generator comprises detecting a fault in the turbine generator by detecting an excitation at a characteristic frequency that corresponds to a known type of turbine generator fault.

20. The controller of claim 18 in which the processor is further configured to execute instructions to locally normalize the frequency spectrum of the current signal samples, use a median filter to calculate median locally normalized values of the frequency spectrum, and based on the median values, determine a threshold for detecting excitations in the frequency spectrum.

21. The controller of claim 18 in which the processor is further configured to execute instructions to, in response to detecting a fault in the turbine generator, generate and transmit an alert that indicates that a turbine generator fault is detected.

22. The controller of claim 18 in which receiving a current signal from a turbine generator comprises receiving a current signal from at least one of a wind turbine generator, a hydro turbine generator, a steam turbine generator, or a gas turbine generator.

23. The controller of claim 18 in which the re-sampling of the current signal comprises interpolating the first set of sampled current data to obtain the set of current signal samples that are evenly spaced in the phase domain.

24. A system for detecting turbine generator faults, the system comprising:

at least one current sensor configured to sense a current signal having a varying fundamental frequency from a turbine generator; and a processor that is configured to execute instructions to:

receive the current signal having the varying fundamental frequency from the at least one current sensor;

synchronously sample the current signal to obtain a set of current samples that are evenly spaced in phase, comprising sample the current signal according to a first set of sampling times to generate a first set of sampled current data that are not evenly spaced in the phase domain, and re-sample the current signal based on information derived from the first set of sampled current data to obtain the set of current signal samples that are evenly spaced in the phase domain;

generate a frequency spectrum of the current signal samples;

identify one or more excitations in the frequency spectrum; and detect a fault in the turbine generator based on the one or more excitations in the frequency spectrum.

25. The system of claim 24 in which the turbine generator comprises at least one of a wind turbine generator, a hydro turbine generator, a steam turbine generator, or a gas turbine generator.

26. The system of claim 24 in which the re-sampling of the current signal comprises interpolating the first set of sampled current data to obtain the set of current signal samples that are evenly spaced in the phase domain.

* * * * *